(12) United States Patent
Yamada

(10) Patent No.: US 9,754,920 B2
(45) Date of Patent: Sep. 5, 2017

(54) SEMICONDUCTOR DEVICE

(71) Applicant: RENESAS ELECTRONICS CORPORATION, Kawasaki-shi, Kanagawa (JP)

(72) Inventor: Naoki Yamada, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/453,367

(22) Filed: Aug. 6, 2014

(65) Prior Publication Data
US 2015/0041991 A1 Feb. 12, 2015

(30) Foreign Application Priority Data

Aug. 7, 2013 (JP) ................................ 2013-163965

(51) Int. Cl.
*H01L 25/065* (2006.01)
*H01L 23/00* (2006.01)

(52) U.S. Cl.
CPC .......... *H01L 25/0657* (2013.01); *H01L 24/97* (2013.01); *H01L 2224/16145* (2013.01);
(Continued)

(58) Field of Classification Search
CPC ........ H04N 7/15; H04N 5/3765; H04N 5/378; H01L 2224/16237; H01L 2924/15311; H01L 2924/15321; H01L 25/0657; H01L 2924/1434; H01L 21/486; H01L 2924/15331; H01L 24/14; H01L 24/17; H01L 24/10; H01L 24/26; H01L 2224/16135
See application file for complete search history.

(56) References Cited

U.S. PATENT DOCUMENTS 8,525,319 B2 * 9/2013 Min ...................... H01L 23/481
257/686
2003/0040131 A1 * 2/2003 Kai ....................... H01L 23/481
438/14
(Continued)

FOREIGN PATENT DOCUMENTS

JP 2010-118522 A 5/2010
JP 2011-187574 A 9/2011

*Primary Examiner* — Marc Armand
*Assistant Examiner* — Quinton Brasfield
(74) *Attorney, Agent, or Firm* — McDermott Will & Emery LLP

(57) ABSTRACT

The reliability of a semiconductor device is improved. A semiconductor device in accordance with one embodiment has a plurality of stacked semiconductor chips. Further, a plurality of inter-chip connection members (conductive members) arranged between the semiconductor chips, and establishing an electrical connection between the semiconductor chips include a first inter-chip connection member (conductive member) for passing therethrough a current with a first frequency, and a plurality of second inter-chip connection members (conductive members) for passing therethrough a signal current with a second frequency higher than the first frequency. Further, in the second inter-chip connection members, at least some of the second inter-chip connection members arranged adjacent to each other are in contact with each other, and are separated from the first inter-chip connection member.

16 Claims, 31 Drawing Sheets

(52) U.S. Cl.
CPC .............. *H01L 2224/16225* (2013.01); *H01L 2225/06544* (2013.01); *H01L 2924/0002* (2013.01); *H01L 2924/15311* (2013.01); *H01L 2924/181* (2013.01)

(56) References Cited

U.S. PATENT DOCUMENTS

| | | | |
|---|---|---|---|
| 2007/0080457 A1* | 4/2007 | Tanida | H01L 23/481 257/739 |
| 2011/0089561 A1* | 4/2011 | Kurita | H01L 21/561 257/737 |
| 2011/0103121 A1* | 5/2011 | Osakabe | G11C 5/025 365/51 |

* cited by examiner

FIG. 34

| SIGNAL TYPE (Function) | SYMBOL (Symbol) | DDR | LPDDR2 | DDR3 | LPDDR3 | DDR4 | WIO SDR |
|---|---|---|---|---|---|---|---|
| Clock | CK | 1 | 1 | 1 | 1 | 1 | 1 |
| Clock Enable | CKE | $10^n$ | $10^n$ | $10^n$ | $10^n$ | 2 | $10^n$ |
| Chip Select | CS | 2 | 2 | 2 | 1 | <1 | 2 |
| Chip ID | C | – | – | – | – | 2 | – |
| On Die Termination | ODT | – | – | 2 | 2 | 2 | – |
| Activation Command | ACT | – | – | – | – | 2 | – |
| Command/Address | CA | – | 1 | – | 1 | – | – |
| Command/Address | RAS | 2 | – | 2 | – | 2 | 2 |
| Command/Address | CAS | 2 | – | 2 | – | 2 | 2 |
| Command/Address | WE | 2 | – | 2 | – | 2 | 2 |
| Input Data Mask | DM | 1 | 1 | 1 | <1 | 1 | 1 |
| Data Bus Inversion | DBI | – | – | – | – | 1 | – |
| Bank Group | BG | – | – | – | – | 2 | – |
| Bank Address | BA | 2 | – | 2 | – | 2 | 2 |
| Address | A | 1 | 1 | 1 | 1 | 2 | 2 |
| Asynchronous Reset | RESET | – | – | $10^n$ | – | $10^n$ | $10^n$ |
| Data | DQ | 1 | 1 | 1 | <1 | 1 | 1 |
| Data Strobe | DQS | 1 | 1 | 1 | <1 | 1 | 2 |

SEMICONDUCTOR DEVICE

CROSS-REFERENCE TO RELATED APPLICATIONS

The disclosure of Japanese Patent Application No. 2013-163965 filed on Aug. 7, 2013 including the specification, drawings and abstract is incorporated herein by reference in its entirety.

BACKGROUND

The present invention relates to a semiconductor device and a manufacturing technology thereof, and, relates to a technology effectively applicable to, for example, a semiconductor device in which over a semiconductor chip, there is mounted another semiconductor chip.

In Japanese Unexamined Patent Publication No. 2011-187574 (Patent Document 1), there is described a semiconductor device in which a semiconductor chip including through electrodes is arranged between a lamination of a plurality of memory chips and a wiring substrate.

Further, in Japanese Unexamined Patent Publication No. 2010-118522 (Patent Document 2), there is described a semiconductor device which has solder bumps for electrically connecting oppositely arranged electrodes with each other, and in which the solder bumps are connected with a plurality of portions of each of the electrodes.

PATENT DOCUMENTS

[Patent Document 1]
Japanese Unexamined Patent Publication No. 2011-187574
[Patent Document 2]
Japanese Unexamined Patent Publication No. 2010-118522

SUMMARY

The present inventors have conducted a study on a technology of improving the performances of a semiconductor device in which a plurality of semiconductor chips are stacked via conductive members such as solder materials. In connection therewith, a study has been conducted on a so-called SiP (System In Package) type semiconductor device in which a plurality of types of semiconductor chips (e.g., memory chips and a control chip for controlling the memory chips) are mounted in one semiconductor device, thereby to form a system with the one semiconductor device.

As a result, it has been found as follows. When a high frequency signal is transmitted in order to improve the data transfer speed, a consideration is required to be given to a variation in impedance among respective transmission paths in addition to the reduction of each transmission path length.

Other objects and novel features will be apparent from the description of this specification and the accompanying drawings.

A semiconductor device in accordance with one embodiment has a plurality of stacked semiconductor chips. Further, a plurality of conductive members arranged between the semiconductor chips, and establishing an electrical connection between the semiconductor chips include a first conductive member for passing therethrough a current with a first frequency, and a plurality of second conductive members for passing therethrough a signal current with a second frequency higher than the first frequency. Further, in the second conductive members, the second conductive members arranged adjacent to each other are in contact with each other, and are separated from the first conductive member.

In accordance with the one embodiment, it is possible to improve the reliability of a semiconductor device.

BRIEF DESCRIPTION OF THE DRAWINGS

FIG. 34 is an explanatory view showing the relation between the signal type and the pulse width of DRAM defined as the standards of the JEDEC Solid State Technology Association.

Figure 1:
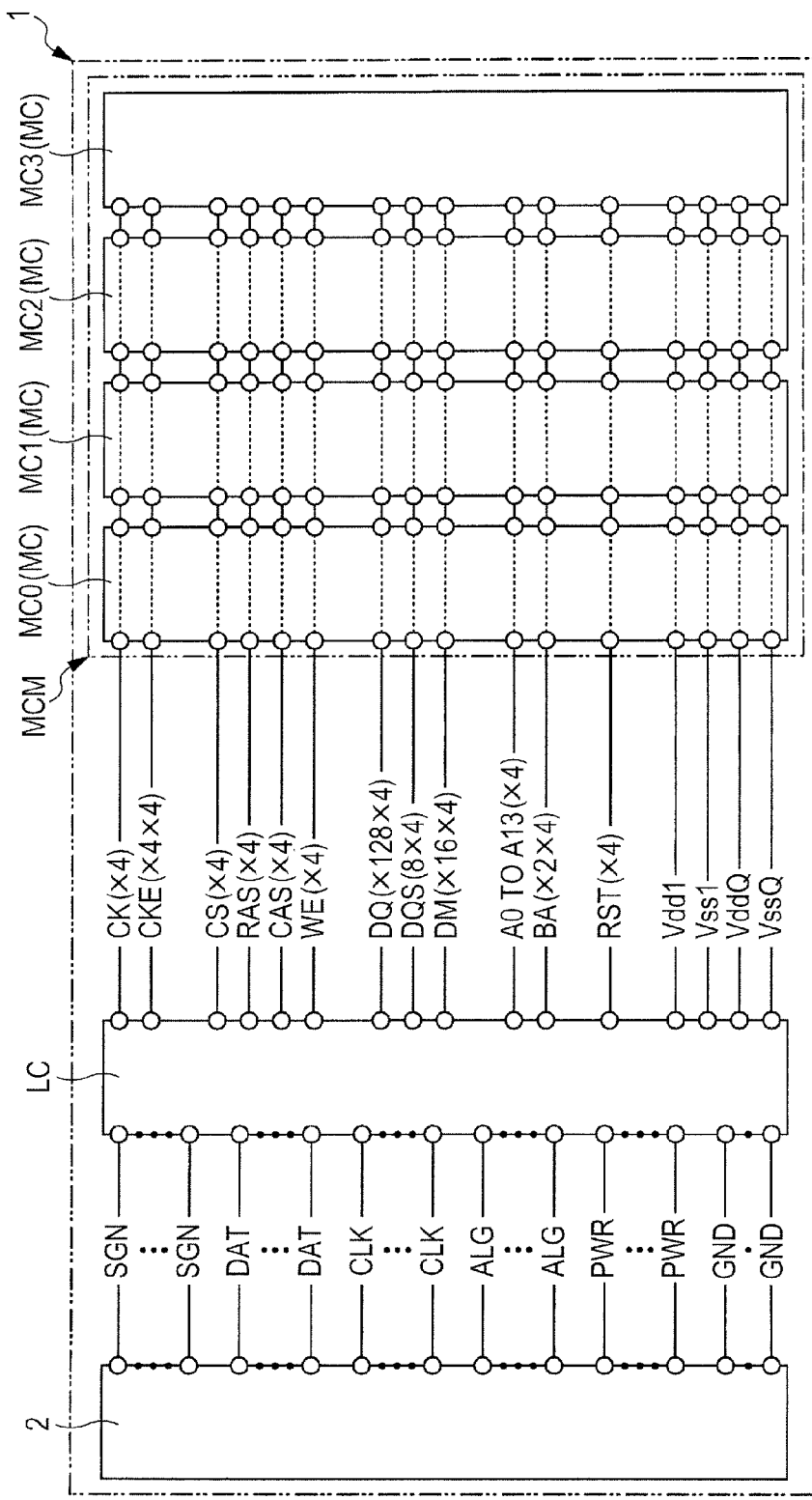
FIG. 1 is an explanatory view schematically showing the electrical connection relation between components forming a semiconductor device which is one embodiment.

DETAILED DESCRIPTION (Explanation of Description Form, Basic Terms, and Methods in the Present Invention)

In the present invention, in the description of embodiments, the description may be divided into a plurality of sections, or the like for convenience, if required. However, unless otherwise specified, these are not independent of each other, but, are respective parts of a single example, in a relation such that one is a detailed explanation of a part of the other, a modification example of a part or the whole, or the like of the other, irrespective of the order of description. Further, in principle, the repetitive description of the same parts will be omitted. Whereas, respective constitutional elements in embodiments are not essential, unless otherwise specified, or except for the case where the number is theoretically limiting, and unless otherwise apparent from the context.

Similarly, in the description of embodiments, and the like, the term "X including A" or the like for the material, composition, or the like does not exclude the one including an element other than A unless otherwise specified and unless otherwise apparent from the context. For example, for the component, the term is used to embrace "X including A as a main component", and the like. For example, it is naturally understood that the term "silicon member" or the like herein used is not limited to pure silicon but also embraces a SiGe (silicon germanium) alloy, other multinary alloys containing silicon as a main component, and other members containing additives, and the like. Whereas, it is naturally understood that the term gold plating, a Cu layer, nickel plating, or the like, herein used is assumed to embrace not only the pure one but also a member containing gold, Cu, nickel, or the like as a main component, unless otherwise specified.

Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical value.

Further, in respective drawings of embodiments, the same or similar portions are indicated with the same or similar reference numerals and signs, and will not be repeatedly described in principle.

Further, in the accompanying drawings, hatching or the like may be omitted even in cross section when it rather complicates the drawing, or when it is apparently distinct from the gap. In conjunction with this, when apparent from the description or the like, or in other cases, even for a two-dimensionally closed hole, the background outline may be omitted. Further, even not in cross section, hatching or a dot pattern may be added in order to clearly demonstrate that the part is not a gap, or in order to clearly demonstrate the boundary between regions.

<Circuit Configuration Example of Semiconductor Device>

Figure 2:
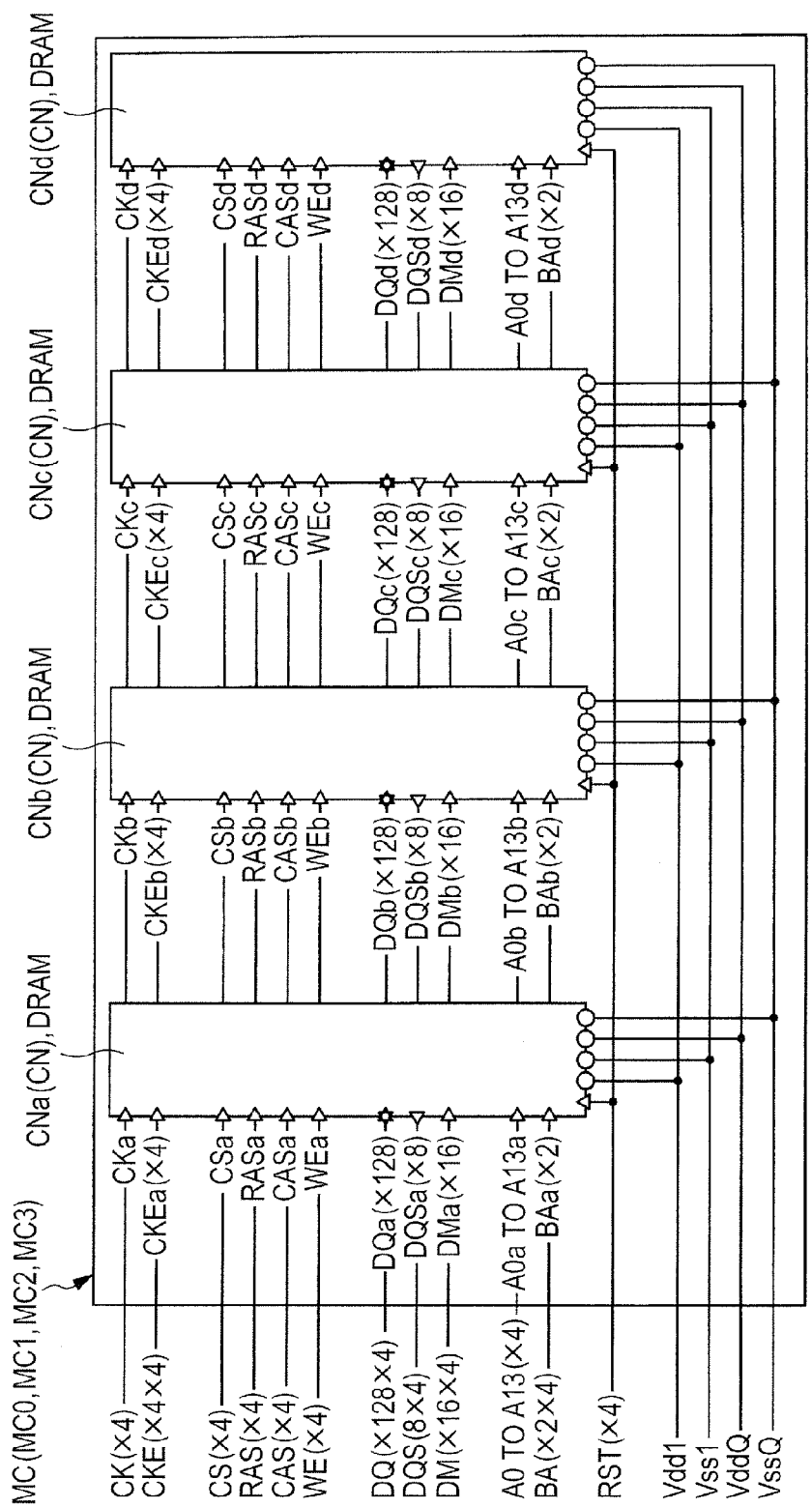
FIG. 2 is an explanatory view showing the function block included in each of a plurality of memory chips included in a memory module shown in FIG. 1.
Figure 3:
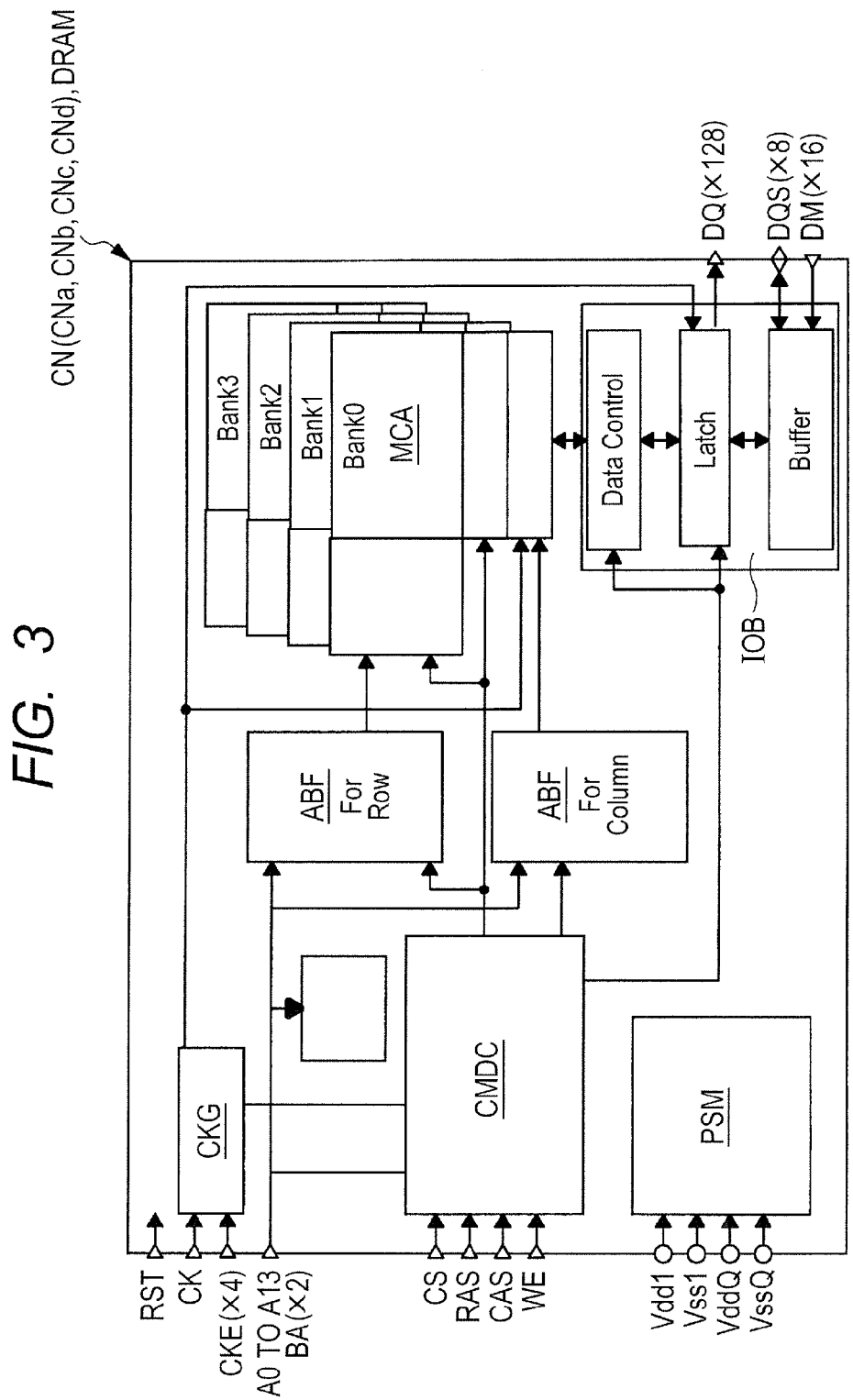
FIG. 3 is an explanatory view showing the function block included in each of a plurality of channels including in the memory chips shown in FIG. 2.

In embodiments described below, as an example of the semiconductor device, a description will be given to a semiconductor package in which semiconductor chips (memory chips) each including a memory circuit formed therein and a semiconductor chip (also called a logic chip or a control chip) including a control circuit for controlling the operation of the memory circuits, formed therein are included in one package. FIG. 1 is an explanatory view schematically showing the electrical connection relation between components forming a semiconductor device of the present embodiment. Whereas, FIG. 2 is an explanatory view showing the function block included in each of a plurality of memory chips included in a memory module shown in FIG. 1. Further, FIG. 3 is an explanatory view showing the function block included in each of a plurality of channels included in the memory chips shown in FIG. 2.

As shown in FIG. 1, a semiconductor device 1 of the present embodiment has a memory module MCM in which a plurality of memory chips (semiconductor chips) MC are electrically connected, and a logic chip (semiconductor chip) LC electrically connected with the memory module MCM. Further, the semiconductor device 1 has a wiring substrate 2 electrically connected with the memory module MCM via the logic chip LC. The wiring substrate 2 is an interposer substrate for adjusting the terminal array when the semiconductor device 1 is mounted on a mounting substrate (e.g., a mother board) not shown. Thus, the logic chip LC and the memory module MCM included in the semiconductor device 1 are electrically connected with external devices not shown via the wiring substrate 2. Incidentally, in FIG. 1, there are not shown a plurality of external terminals provided at the wiring substrate 2 for ensuring an electrical connection with the mounting substrate.

An electrical connection is established between the wiring substrate 2 and the logic chip LC via a plurality of transmission paths (conduction paths) through which various kinds of currents flow. In the example shown in FIG. 1, the plurality of transmission paths include a plurality of transmission paths for performing input/output (input or output, or input and output) of a data signal DAT between them and a data signal processing circuit (not shown) included in the logic chip LC. Further, the plurality of transmission paths include a plurality of transmission paths for inputting signals CLK of a timing control system such as clock signals to a timing control circuit (not shown) included in the logic chip LC. Whereas, the plurality of transmission paths include a plurality of transmission paths for performing input/output of an analog signal ALG between them and the analog circuit (not shown) included in the logic chip LC. Further, the plurality of transmission paths include a plurality of transmission paths for performing input/output of signals SGN other than the foregoing signals between them and various circuits (not shown) included in the logic chip LC. Still further, the plurality of transmission paths include a plurality of transmission paths PWR for supplying a power supply potential to various circuits included in the logic chip LC and the memory module MCM. Furthermore, the plurality of transmission paths include a plurality of transmission paths GND for supplying a reference potential to various circuits included in the logic chip LC and the memory module MCM. The reference potential is, for example, a ground potential.

Further, in each of a plurality of memory chips MC included in the memory module MCM, there is formed a storage circuit called a DRAM (Dynamic Random Access Memory) (which will be hereinafter described as a memory circuit DRAM). Whereas, in the logic chip LC to be electrically connected with the memory module MCM, there are formed a control circuit for controlling the operation of the memory circuits DRAM of the memory chips MC (see FIG. 3), and an arithmetic processing circuit for performing an arithmetic processing on data signals.

Whereas, an electrical connection is established between the logic chip LC and the memory module MCM, and between a plurality of memory chips MC forming the memory module MCM via a plurality of transmission paths (conduction paths) through which various kinds of currents flow. In the example shown in FIG. 1, the plurality of transmission paths include a plurality of timing system transmission paths for inputting timing control system signals such as clock signals CK and clock enable signals CKE to the memory module MCM. Further, the plurality of transmission paths include a plurality of transmission paths for inputting command system signals such as chip select signals CS, row address strobe signals RAS, column address strobe signals CAS, and write enable signals WE to the memory module MCM. Still further, the plurality of transmission paths include a plurality of address system transmission paths for inputting address assignment system signals such as address signals A0 to A13, and bank address signals BA to the memory module MCM. Whereas, the plurality of transmission paths include a plurality of data system transmission paths for performing input/output (input or output, or input and output) of data system signals such as data signals DQ, data strobe signals DQS, data mask signals DM between the logic chip LC and the memory module MCM. Further, the plurality of transmission paths include a plurality of reset signal transmission paths for inputting reset signals (asynchronous reset signals) RST to the memory module MCM. Still further, the plurality of transmission paths include a plurality of power supply system transmission paths for supplying a power supply such as a core power supply potential Vdd1, a data power supply potential VddQ, a core reference potential Vss1, or a data reference potential VssQ to the circuit included in each memory chip MC forming the memory module MCM.

Further, in the example shown in FIG. 2, respective memory chips MC include four channels CN shown as channels CNa, CNb, CNc, and CNd. In each of the plurality of channels CN, there is formed a memory circuit DRAM as shown in FIG. 3. Whereas, in the example shown in FIGS. 2 and 3, the width of the data bus of each channel CN is 128 bits. The total bus width of the four channels CN is 512 bits.

Further, the memory circuit DRAM shown in FIG. 3 operates, for example, in the following manner. First, the power supply system transmission path supplies a power supply such as a core power supply potential Vdd1, a data power supply potential VddQ, a core reference potential Vss1, or a data reference potential VssQ to the power supply control circuit PSM of the memory circuit DRAM (see FIG. 3). As a result, the memory circuit DRAM is started. The core power supply potential Vdd1 and the core reference potential Vss1 each supply a driving voltage for a main circuit to the main circuit in the memory circuit DRAM (e.g., a power supply control circuit PSM, a clock oscillation circuit CKG, a command control circuit CMDC, or an address buffer circuit ABF). Whereas, the data power supply potential VddQ and the data reference potential VssQ each supply an input/output voltage of the data signal DQ. Incidentally, although not shown, when there are a plurality of types of circuits to be operated at different driving voltages, it is also possible to additionally supply different power supply potentials or reference potentials from the core power supply potential Vdd1 and the core reference potential Vss1, respectively.

Then, a reset signal RST is inputted to the memory circuit DRAM. Then, to the clock oscillation circuit CKG in the memory circuit DRAM, there are sequentially inputted a low level (clock signal invalid) of a clock enable signal CKE, a clock signal CK, a high level (clock signal valid) of a clock enable signal CKE. As a result, a clock is transmitted. The clock signal CK is a signal for determining the timing serving as the reference for various electrical operations of the memory circuit DRAM. Whereas, the clock enable signal CKE is a signal for determining whether the clock is valid or invalid with respect to an input/output signal. For example, in the case of a low level, the clock signal is invalid; and in the case of a high level, the clock signal is valid. The values of the high level and the low level of the signal are defined by the communication standard. When the voltage of an input signal is equal to, or larger than a given specified value, it is judged as high level. When the voltage of an input signal is equal to, or smaller than another specified value, it is judged as low level.

Then, the command control circuit CMDC of the memory circuit DRAM receives the command system signals. As a result, the memory circuit DRAM is rendered in a stand-by state (also called an idling state). The command system signals include a chip select signal CS, a row address strobe signal RAS, a column address strobe signal CAS, and a write enable signal WE. Combination of the low level and the high level of the command system signals assigns the type of the previously set command. Herein, although the detailed description of the command is omitted, sequential inputting of a plurality of commands renders the memory circuit DRAM into the stand-by state.

Then, before performing the write operation to the memory circuit DRAM or the read operation from the memory circuit DRAM, a plurality of command system signals described above are inputted to the command control circuit CMDC of the memory circuit DRAM. As a result, the memory circuit DRAM is put in an active state. Herein, although the detail description of the commands is omitted, sequential inputting of a plurality of commands renders the memory circuit DRAM into an active state.

Whereas, at the time of the write operation to the memory circuit DRAM, first, the command control circuit CMDC receives a write command. The write command is inputted in the following manner: as with the case where the circuit is put in the stand-by state, or put in an active state, the command control circuit CMDC of the memory circuit DRAM receives the command system signals. Whereas, the address buffer circuit ABF of the memory circuit DRAM receives address signals A0 to A13 and a bank address signal BA. As a result, the write address is assigned. Subsequently, the command control circuit CMDC of the memory circuit DRAM receives a NOP (NO OPERATION) command, and the bank of the memory cell MCA receives a data signal DQ via a data input/output circuit IOB. The timing of the data write operation is assigned by the data strobe signal DQS outputted from a data input/output circuit IOB. Further, the data input/output circuit IOB receives a data mask signal DM, thereby to control the advisability of data write. From this point forward, while being in synchronization with the pulse of the clock signal CK, the data signal DQ is repeatedly inputted. Thus, a write operation is performed.

Further, at the time of the read operation from the memory circuit DRAM, first, the command control circuit CMDC receives a read command. The inputting method of the read command is the same as the inputting method of the write command. The command control circuit CMDC of the memory circuit DRAM receives the plurality of command system signals. Whereas, the address buffer circuit ABF of the memory circuit DRAM receives the address signals A0 to A13 and the bank address signal BA. As a result, the write address is assigned. Subsequently, the command control circuit CMDC of the memory circuit DRAM receives a NOP (NO OPERATION) command, and the bank of the memory cell MCA outputs a data signal DQ via the data input/output circuit IOB. The timing of the data read operation is assigned by a data strobe signal DQS outputted from the data input/output circuit IOB. From this point forward, while being in synchronization with the pulse of the clock signal CK, the data signal DQ is repeatedly outputted. Thus, the read operation is performed.

In connection with approach for improving the performances of the semiconductor device 1, the present inventors have conducted a study on a technology of improving the signal transmission rate between a plurality of semiconductor chips included in the semiconductor device 1 (i.e., the transmission rate of the internal interface) to, for example, 25 Gbps (25 gigabits per second) or more. As the method for improving the transmission rate between a plurality of semiconductor chips, there is a method in which the width of the data bus of the internal interface is enlarged, thereby to increase the data amount transmitted per one time (which will be hereinafter described as bus width enlargement). Alternatively, as another method, there is a method in which the number of times of transmission per unit time is increased (which will be hereinafter described as clock number increase). Still alternatively, there is a method in which the bus width enlargement method and the clock number increase method are combined to be applied.

The semiconductor device 1 shown in FIGS. 1 to 3 is a semiconductor device which has undergone a bus width enlargement and a clock number increase in combination, thereby to be improved in transmission rate of the internal interface of each channel to 25 Gbps or more. For example, the semiconductor device 1 has 128 data transmission paths for each channel as the transmission paths for data signals DQ. Namely, in the semiconductor device 1, each channel has a bus width of 128 bits. Further, the operation frequency of the transmission path for the data signal DQ is, for example, 400 MHz (400 megahertz). As a result, the transmission rate of each channel is 25.6 Gbps.

Herein, as described above, in the case of the semiconductor device 1 which transmits a plurality of mutually different types of signals, all of the plurality of transmission paths can be operated at the maximum frequency. However, it suffices that, of the plurality of transmission paths, some transmission paths operate at the maximum frequency. For example, in the example shown in FIGS. 1 to 3, the data signal DQ and the data strobe signal DQS are operated at the maximum frequency (e.g., 400 MHz). On the other hand, other signal transmission paths than the data system can be operated at a smaller frequency than the maximum frequency. For example, when the determination method of input/output of data is a DDR (Double Data Rate) method, data input/output is determined at the times of rising and falling of an external synchronization clock. For this reason, the operation frequency of the clock signal CK can be set at a frequency which is ½ of the maximum frequency (i.e., the operation frequency of the data signal DQ). In other words, in the case of the DDR method, the pulse width of the clock signal CK can be set at a pulse width twice the pulse width of the data signal DQ. Further, the clock enable signal CKE is much lower in input frequency than the clock signal CK or the like. For this reason, the operation frequency of the clock enable signal CKE can be set at, for example, 1 MHz or less.

Whereas, the input frequency of the command system signal is lower than the input frequency of the data signal DQ. For this reason, for example, the operation frequency of an input signal of the command system can be set at a frequency which is ¼ or less of the operation frequency of the data signal DQ. Further, the input frequency of the address system signal is lower than the input frequency of the data signal DQ. For this reason, for example, the operation frequency of an input signal of the address system can be set at a frequency which is ¼ or less of the operation frequency of the data signal DQ.

The term "frequency" described in the present application means the number of input operations or output operations per unit time. Further, the term "pulse width" described in the present application is the pulse signal application time in one input operation or output operation. Therefore, the following relationship holds between the frequency and the pulse width. Namely, a signal with a large operation frequency (in other words, a high frequency operation signal) is required to be shortened in pulse width. However, a signal with a small operation frequency (in other words, a low frequency operation signal) can be increased or decreased in pulse width.

However, the pulse width for each signal type based on the pulse width of the clock signal CK is defined as the standard as shown in, for example, FIG. 34 according to the determination method of input/output of data. FIG. 34 is an explanatory view showing the relation between the signal type and the band width of DRAM defined as the standards of the JEDEC Solid State Technology Association. The JEDEC Solid State Technology Association is the name of the institution for performing standardization of the semiconductor technology. Below, the institution is simply described as JEDEC. Further, in FIG. 34, there are shown signal types (function and symbol) in the row direction, and the type of determination method of input/output of data in the column direction. Whereas, the numerical values shown in FIG. 34 represent the lengths of the pulse widths of respective signals when the pulse width of the clock signal CK is assumed to be 1 for each determination method of input/output of data. Further, the expression "<1" represents a value smaller than 1. The expression "10'''" represents a value equal to or larger than 10. Whereas, the expression "-" means that there is no corresponding signal.

<Structure of Semiconductor Device>

Figure 4:
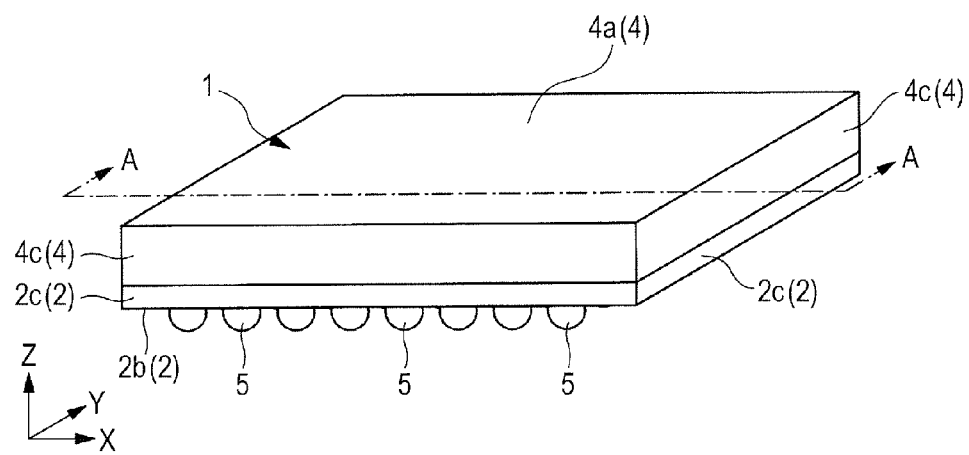
FIG. 4 is a perspective view of the semiconductor device shown in FIG. 1.
Figure 5:
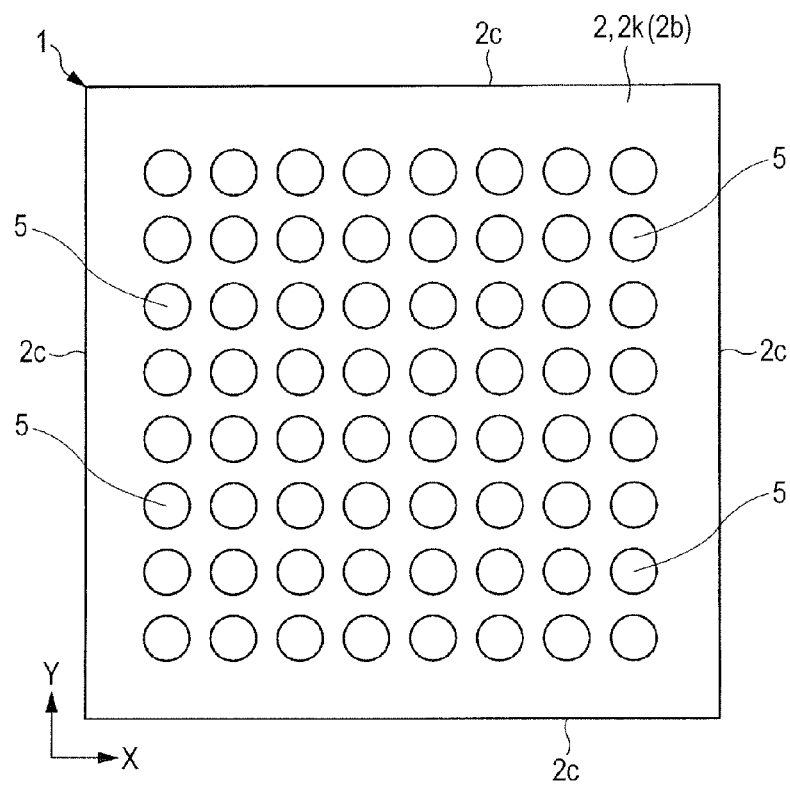
FIG. 5 is a bottom view of the semiconductor device shown in FIG. 4.
Figure 6:
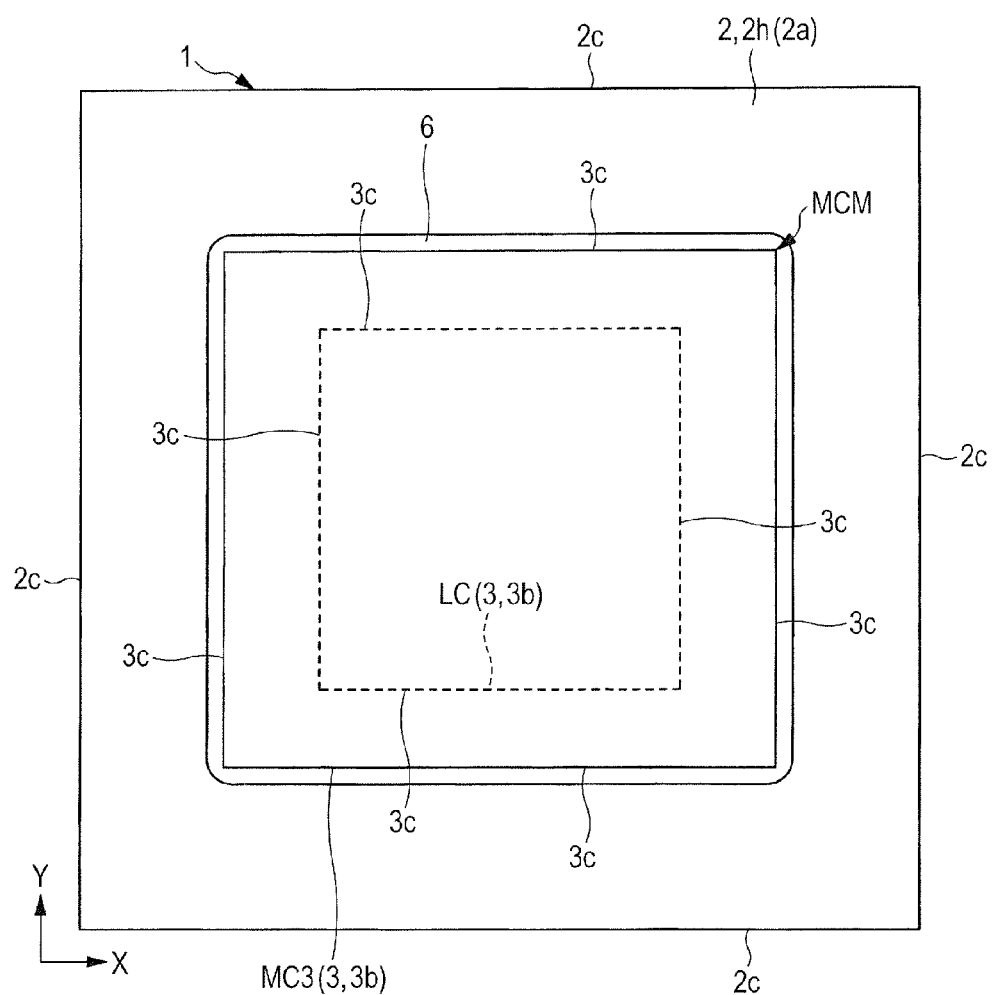
FIG. 6 is a perspective plan view showing the internal structure of the semiconductor device over a wiring substrate with a sealing body shown in FIG. 4 removed.
Figure 7:
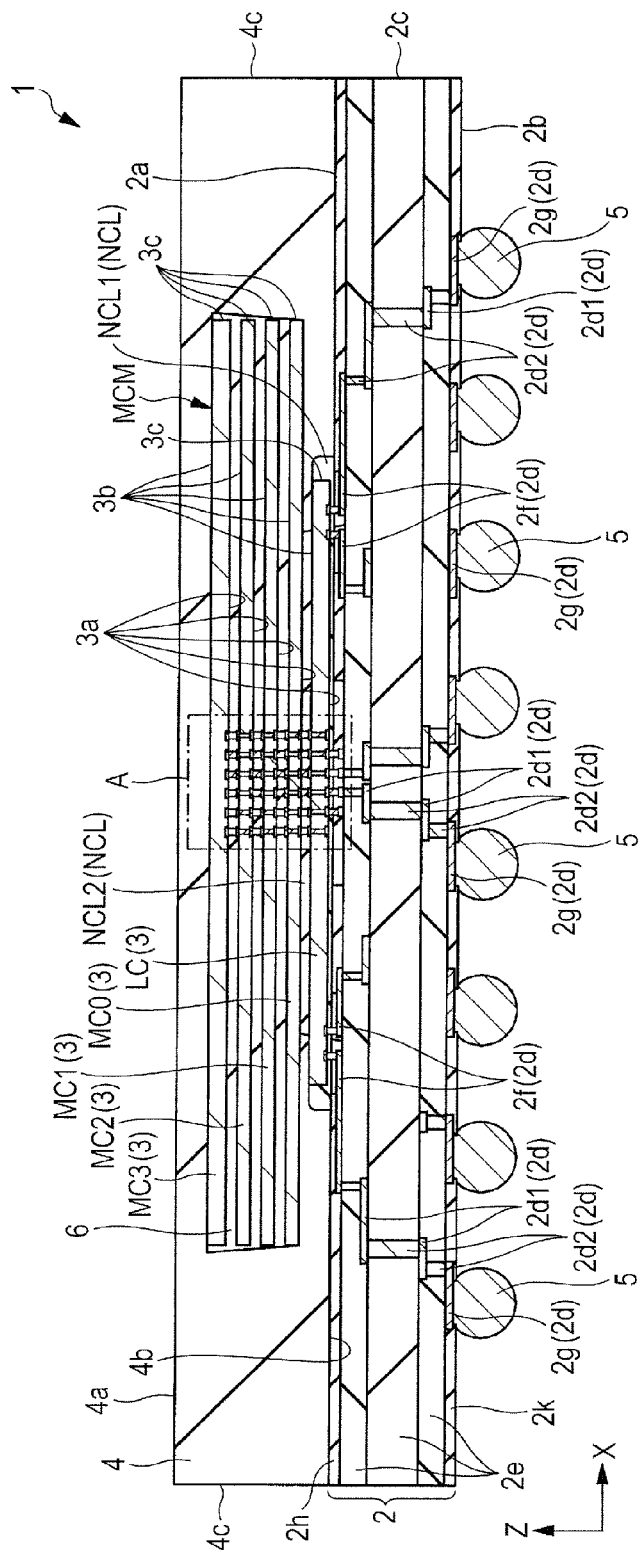
FIG. 7 is a cross sectional view along line A-A of FIG. 4.

Then, the structure of the semiconductor device 1 shown in FIG. 1 will be described. FIG. 4 is a perspective view of the semiconductor device shown in FIG. 1. FIG. 5 is a bottom view of the semiconductor device shown in FIG. 4. Whereas, FIG. 6 is a perspective plan view showing the internal structure of the semiconductor device over a wiring substrate with a sealing body shown in FIG. 4 removed. Further, FIG. 7 is a cross sectional view along line A-A of FIG. 4. Incidentally, in FIGS. 4 to 7, for ease of understanding, the terminals are shown in a reduced number. However, the number of terminals (bonding leads 2f, lands 2g, and solder balls 5) is not limited to the embodiments shown in FIGS. 4 to 7. Further, in FIG. 6, for ease of understanding of the positional relationship in plan view and a difference in planar size between the logic chip LC and the memory chip MC3, the outline of the logic chip LC is shown by a dotted line.

As shown in FIG. 7, a wiring substrate 2 has an upper surface (surface, chip mounting surface) 2a including a plurality of semiconductor chips 3 mounted thereover, a lower surface (surface, mounting surface) 2b opposite to the upper surface 2a, and a side surface 2c arranged between the upper surface 2a and the lower surface 2b, and forms a tetragonal outer shape in plan view as shown in FIGS. 5 and 6. In the example shown in FIGS. 5 and 6, the planar sizes of the wiring substrate 2 (dimensions in plan view, the dimensions of the upper surface 2a and the lower surface 2b, outer size) form, for example, a tetragon with a length per side of about 14 mm. Whereas, the thickness (height) of the wiring substrate 2, namely, the length between the upper surface 2a and the lower surface 2b shown in FIG. 7 is, for example, about 0.3 mm to 0.5 mm.

The wiring substrate 2 is an interposer for electrically connecting the semiconductor chip 3 mounted on the upper surface 2a side with a mounting substrate not shown, and has a plurality of wiring layers (four layers in the example shown in FIG. 7) for electrically connecting the upper surface 2a side with the lower surface 2b side. In each wiring layer, there is formed an insulation layer 2e for establishing an insulation between a plurality of wires 2d and a plurality of wires 2d, and between the adjacent wiring layers. The wiring substrate 2 shown in FIG. 7 has three insulation layers 2e. The middle insulation layer 2e is a core layer (core material). However, a so-called core-less substrate not having an insulation layer 2e serving as a core may be used. Further, the wires 2d include a wire 2d1 formed on the upper surface or the lower surface of the insulation layer 2e, and a via wire 2d2 which is an interlayer conductive path formed in such a manner as to penetrate the insulation layer 2e in the thickness direction.

Whereas, at the upper surface 2a of the wiring substrate 2, there are formed a plurality of bonding leads (terminals, chip mounting surface side terminals, or electrodes) 2f which are terminals (internal interface terminals) to be electrically connected with the semiconductor chip 3. On the other hand, at the lower surface 2b of the wiring substrate 2, there are formed a plurality of lands 2g bonded with a plurality of solder balls 5 which are terminals for establishing an electrical connection with a mounting substrate not shown, namely, external connection terminals of the semiconductor device 1. The plurality of bonding leads 2f and the plurality of lands 2g are electrically connected with each other via a plurality of wires 2d, respectively. Incidentally, the wire 2d connected with the bonding lead 2f and the land 2g is formed integrally with the bonding lead 2f and the land 2g. For this reason, in FIG. 7, the bonding lead 2f and the land 2g are shown as a part of the wire 2d.

Further, the upper surface 2a and the lower surface 2b of the wiring substrate 2 are covered with insulation films (solder resist films) 2h and 2k, respectively. The wires 2d formed in the upper surface 2a of the wiring substrate 2 are covered with the insulation film 2h. In the insulation film 2h, there are formed openings. At the openings, at least portions of the plurality of bonding leads 2f (the junction parts with the semiconductor chip 3, or the bonding regions) are exposed from the insulation film 2h. Whereas, the wires 2d formed in the lower surface 2b of the wiring substrate 2 are covered with the insulation film 2k. In the insulation film 2k, there are formed openings. At the openings, at least portions of the plurality of lands 2g (the junction parts with the solder balls 5) are exposed from the insulation film 2k.

Further, as shown in FIG. 7, the plurality of solder balls (external terminals, electrodes, or external electrodes) 5 to be bonded with the plurality of lands 2g at the lower surface 2b of the wiring substrate 2 are arranged in rows (in an array or in a matrix) as shown in FIG. 5. Further, although not shown in FIG. 5, the plurality of lands 2g to be bonded with the plurality of solder balls 5 (see FIG. 7) are also arranged in rows (in a matrix). The semiconductor device in which a plurality of external terminals (the solder balls 5 and the lands 2g) are arranged in rows on the mounting surface side of the wiring substrate 2 is called an area array type semiconductor device. The area array type semiconductor device is preferable in the following point: the mounting surface (lower surface 2b) side of the wiring substrate 2 can be effectively used as the arrangement space for the external terminals; accordingly, even when the number of external terminals increases, the semiconductor device can be suppressed in increase in mounting area. In other words, it is possible to mount a semiconductor device which increases in number of external terminals with an enhancement of performances and an enhancement of degree of integration in a space-saving manner.

Further, the semiconductor device 1 includes a plurality of semiconductor chips 3 to be mounted over the wiring substrate 2. The plurality of semiconductor chips 3 are stacked over the upper surface 2a of the wiring substrate 2. Further, the plurality of semiconductor chips 3 each have a front surface (a main surface or an upper surface) 3a, a back surface (a main surface or a lower surface) 3b opposite to the front surface 3a, and a side surface 3c situated between the front surface 3a and the back surface 3b, and form a tetragonal outer shape in plan view as shown in FIG. 6. Thus, even when the plurality of semiconductor chips 3 are stacked, thereby to enhance the performances of the semiconductor device 1, the mounting area can be reduced.

In the example shown in FIGS. 6 and 7, the semiconductor chip 3 mounted at the lowest stage (the position closest to the wiring substrate 2) is a logic chip LC including an arithmetic processing circuit (not shown) formed therein. Incidentally, in the logic chip LC, other than the arithmetic processing circuit, there is formed a control circuit for controlling the operations of the main storage circuits of the memory chips MC0, MC1, MC2, and MC3.

Whereas, the plurality of semiconductor chips 3 mounted over the upper stage of the logic chip LC are the memory chips MC0, MC1, MC2, and MC3 each including a memory circuit (main storage circuit) DRAM (see FIG. 3) for storing data to be communicated with the logic chip LC formed therein. In the example of FIG. 7, there is shown an example in which a memory module (semiconductor chip lamination) MCM which is a lamination of four memory chips MC (see FIG. 1) is stacked over the back surface 3b of the logic chip LC.

Further, as shown in FIG. 7, adhesive materials NCL (insulation adhesive materials) are arranged between the logic chip LC and the wiring substrate 2, and between the logic chip LC and the memory module MCM, respectively. The adhesive materials NCL are arranged in such a manner as to fill the space between the front surface 3a of the semiconductor chip 3 on the upper stage side and the back surface 3b of the semiconductor chip 3 on the lower stage side (or the upper surface 2a of the wiring substrate 2). The adhesive materials NCL include an adhesive material (insulation adhesive material) NCL1 for bonding and fixing the logic chip LC over the wiring substrate 2, and an adhesive material (insulation adhesive material) NCL2 for bonding and fixing the memory module MCM over the logic chip LC. Further, the adhesive materials NCL1 and NCL2 are each formed of an insulation (non-conductive) material (e.g., resin material). By arranging the adhesive materials NCL at the junction part between the logic chip LC and the wiring substrate 2, and the junction part between the logic chip LC and the memory module MCM, it is possible to establish an electrical insulation between the plurality of electrodes provided at respective junction parts.

Further, in the example shown in FIG. 7, the plurality of memory chips MC0, MC1, MC2, and MC3 forming the memory module MCM are sealed by a sealing body 6. In other words, between the semiconductor chips 3 forming the memory module MCM, the sealing body 6 is embedded in such a manner as to be in close contact with the front surface 3a and the back surface 3b. The sealing body 6 is formed of an insulation (non-conductive) material (e.g., resin material). By arranging the sealing body 6 in the periphery of the electrical connection portions of the memory chips MC0, MC1, MC2, and MC3, it is possible to establish an electrical insulation between the plurality of electrodes provided at respective connection portions. However, as shown in FIG. 7, the front surface 3a of the memory chip MC0 mounted at the lowest stage (position closest to the logic chip LC) of the memory module MCM is exposed from the sealing body 6. Whereas, as shown in FIGS. 6 and 7, the back surface 3b of the memory chip MC3 arranged at the uppermost stage (position most distant from the logic chip LC) of the memory module MCM is exposed from the sealing body 6.

Further, the semiconductor device 1 includes a sealing body 4 for sealing the plurality of semiconductor chips 3. The sealing body 4 has an upper surface (surface, front surface) 4a, a lower surface (surface, back surface) 4b situated opposite to the upper surface 4a (see FIG. 7), and a side surface 4c situated between the upper surface 4a and the lower surface 4b, and forms a tetragonal outer shape in plan view. In the example shown in FIG. 4, the planar sizes (the dimensions as seen from the upper surface 4a side in plan view, or the outer sizes of the upper surface 4a) of the sealing body 4 is the same as the planar size of the wiring substrate 2. The side surface 4c of the sealing body 4 is continuous to the side surface 2c of the wiring substrate 2.

The sealing body 4 is a resin body for protecting the plurality of semiconductor chips 3. The sealing body 4 is formed in close contact with between the plurality of semiconductor chips 3, and the semiconductor chips 3 and the wiring substrate 2. As a result, it is possible to suppress the damage of the thin semiconductor chips 3. Further, the sealing body 4 is formed of, for example, the following materials from the viewpoint of improving the function as a protective material. The sealing body 4 is required to tend to be in close contact with the semiconductor chips 3 and the wiring substrate 2, and to have a certain degree of hardness after sealing. For this reason, the sealing body 4 preferably includes a thermosetting resin such as an epoxy type resin. Further, in order to improve the function of the sealing body 4 after curing, filler particles such as silica (silicon dioxide; $SiO_2$) particles are preferably mixed in the resin material. For example, from the viewpoint of suppressing the damage of the semiconductor chips 3 due to thermal deformation after the formation of the sealing body 4, preferably, the mixing ratio of filler particles is adjusted, thereby to make the linear expansion coefficients of the semiconductor chip 3 and the sealing body 4 closer to each other.

<Lamination Structure of Semiconductor Chips>

Figure 8:
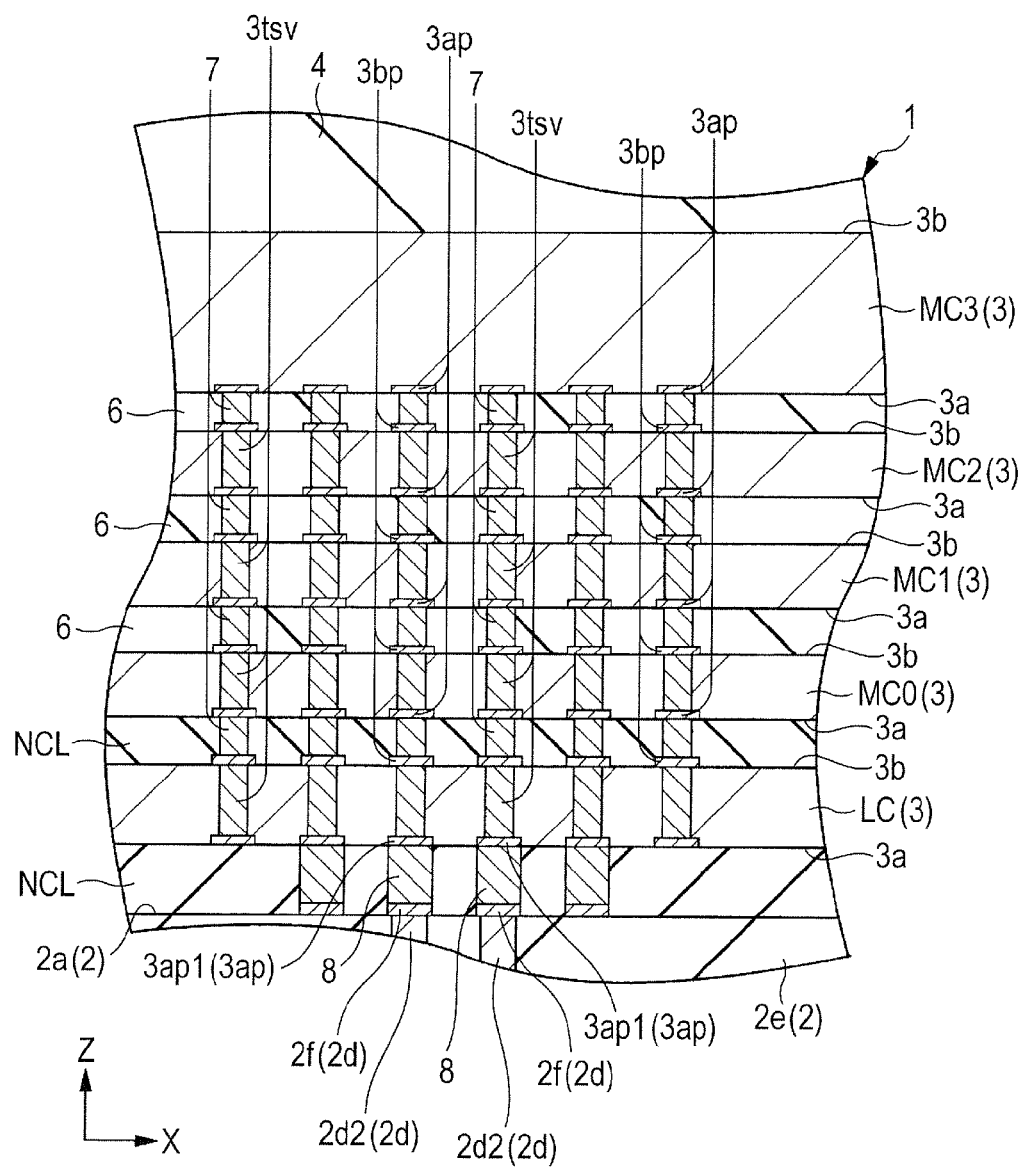
FIG. 8 is an enlarged cross sectional view of a part A shown in FIG. 7.

Then, a description will be given to the details of the logic chip LC and the memory chips MC0, MC1, MC2, and MC3 shown in FIG. 7 and an electrical connection method of respective semiconductor chips 3. FIG. 8 is an enlarged cross sectional view of the A part shown in FIG. 7.

As described above, the present inventors have conducted a study on the technology of increasing the signal transmission rate of the internal interface of a semiconductor device. The semiconductor device 1 of the present embodiment has undergone a bus width enlargement method and a clock number increase method in combination, thereby to be improved in signal transmission rate.

For example, the memory chips MC0, MC1, MC2, and MC3 shown in FIG. 7 are so-called wide I/O memories each having a data bus width of 512 bits. Further, as described by reference to FIGS. 1 to 3, the operation frequency for performing input/output of the data signal DQ with the memory circuit DRAM is, for example, 400 MHz.

When clock number increase and bus width expansion are combined to be applied, a large number of transmission paths for the data signals DQ are required to be operated at a high speed. For this reason, from the viewpoint of reducing the effect of a noise, the data transmission distance is required to be shortened. Thus, as shown in FIG. 7, the logic chip LC and the memory chip MC0 are electrically connected via the conductive members (inter-chip connection members shown in FIG. 8) arranged between the logic chip LC and the memory chip MC0. Further, the plurality of memory chips MC0, MC1, MC2, and MC3 are electrically connected via the conductive members (inter-chip connection members 7) arranged between the plurality of memory chips MC0, MC1, MC2, and MC3. In other words, in the semiconductor device 1, the transmission path between the logic chip LC and the memory chip MC0 does not include the wiring substrate 2 or wires (bonding wires) not shown. Further, in the semiconductor device 1, the transmissions paths between the plurality of memory chips MC0, MC1, MC2, and MC3 do not include the wiring substrate 2 or wires (bonding wires) not shown.

In the present embodiment, as a method for establishing a direct connection between the plurality of semiconductor chips 3 not via wires, the following technology is applied: as shown in FIG. 8, there are formed through electrodes 3tsv penetrating through the semiconductor chips 3 in the thickness direction; thus, the stacked semiconductor chips 3 are connected with each other via the through electrodes 3tsv.

For example, of the plurality of semiconductor chips 3 stacked over the wiring substrate 2, the logic chip LC, and the memory chips MC0, MC1, and MC2 each have a plurality of front surface electrodes (electrodes, pads, or the main surface electrodes) 3ap formed on the front surface 3a, and a plurality of the back surface electrodes (electrodes or pads) 3bp formed on the back surface 3b. Further, the logic chip LC, and the memory chips MC0, MC1, and MC2 each have a plurality of through electrodes 3tsv formed in such a manner as to penetrate from one to the other of the front surface 3a and the back surface 3b, and electrically connecting the plurality of front surface electrodes 3ap with the plurality of back surface electrodes 3bp, respectively.

Various circuits (semiconductor elements and wires connected thereto) included in the semiconductor chip 3 are formed on the front surface 3a side of the semiconductor chip 3. Particularly, the semiconductor chip 3 has a semiconductor substrate (not shown) formed of, for example, silicon (Si). At the main surface (element formation surface) of the semiconductor substrate, there are formed a plurality of semiconductor elements (not shown) such as transistors. Over the main surface (the front surface 3a side) of the semiconductor substrate, there is stacked a wiring layer (not shown) including a plurality of wires and insulation films for establishing an insulation between the plurality of wires. The plurality of wires of the wiring layer are electrically connected with a plurality of semiconductor elements, respectively, to form a circuit. The plurality of front surface electrodes 3ap formed on the front surface 3a (see FIG. 7) of the semiconductor chip 3 are electrically connected with the semiconductor elements via the wiring layer provided between the semiconductor substrate and the front surface 3a, to form a part of the circuit.

Therefore, as shown in FIG. 8, the through electrodes 3tsv penetrating through the semiconductor chips 3 in the thickness direction are formed, and the front surface electrodes 3ap and the back surface electrodes 3bp are electrically connected via the through electrodes 3tsv, respectively. As a result, the back surface electrodes 3bp and the circuits of the semiconductor chip 3 formed on the front surface 3a side can be electrically connected with each other. For example, in the example shown in FIG. 8, of the plurality of semiconductor chips 3 stacked over the wiring substrate 2, the logic chip LC, and the memory chips MC0, MC1, and MC2 each have a plurality of through electrodes 3tsv. Then, various circuits respectively included in the logic chip LC, and the memory chips MC0, MC1, and MC2 and the plurality of back surface electrodes 3bp are electrically connected with each other via the plurality of through electrodes 3tsv.

Further, the back surface electrodes 3bp of the semiconductor chip 3 on the lower stage side and the front surface electrodes 3ap of the semiconductor chip 3 on the upper stage side are electrically connected with each other via the conductive members such as the inter-chip connection members (projection electrodes or bump electrodes) 7, respectively. In other words, the circuit included in the semiconductor chip 3 on the lower stage side and the circuit included in the semiconductor chip 3 on the upper stage side are electrically connected with each other via the plurality of through electrodes 3tsv and the plurality of inter-chip connection members 7.

Thus, in the present embodiment, the circuits included in the semiconductor chips 3 are electrically connected via the through electrodes 3tsv penetrating through the semiconductor chips 3 in the thickness direction and the inter-chip connection members 7 arranged between the stacked semiconductor chips 3. As a result, it is possible to exclude the wiring substrate 2 and wires (bonding wires) not shown from the transmission paths. In consequence, the impedance components in the transmission paths between the plurality of stacked semiconductor chips 3 are reduced, which can reduce the effect of a noise due to a higher clock number. In other words, even when the signal transmission rate between the plurality of stacked semiconductor chips 3 is improved, the transmission reliability can be improved.

Incidentally, in the example shown in FIG. 8, the memory chip MC3 mounted at the uppermost stage may be desirably connected with the memory chip MC2. Accordingly, a plurality of front surface electrodes 3ap are formed, but a plurality of back surface electrodes 3bp and a plurality of through electrodes 3tsv are not formed. Thus, the memory chip MC3 mounted at the uppermost stage does not include a plurality of back surface electrodes 3bp or a plurality of through electrodes 3tsv. By adopting this structure, it is possible to simplify the manufacturing step of the memory chip MC3. However, although not shown, as a modified example, the memory chip MC3 may also have a structure including a plurality of back surface electrodes 3bp and a plurality of through electrodes 3tsv as with the memory chips MC0, MC1, and MC2. In this case, by allowing the plurality of stacked memory chips MC0, MC1, MC2, and MC3 to have the same structure, it is possible to improve the manufacturing efficiency.

Further, the semiconductor chip 3 including through electrodes 3tsv as with the logic chip LC, and the memory chips MC0, MC1, and MC2 shown in FIG. 8 preferably each have a thinner (smaller) thickness, namely, clearance distance between the front surface 3a and the back surface 3b. A reduction of the thickness of the semiconductor chip 3 results in shortening of the transmission distance of the through electrode 3tsv, and hence is preferable in that the impedance component can be reduced. Further, when openings (including through holes and non-through holes) are formed in the thickness direction of the semiconductor substrate, the larger the depth of the holes, the lower the processing precision is. In other words, when the thickness of the semiconductor chip 3 is reduced, it is possible to improve the processing precision of the openings for forming the through electrodes 3tsv. Accordingly, it is possible to make uniform the diameters of the plurality of through electrodes 3tsv (the length or width in the orthogonal direction with respect to the thickness direction of the semiconductor chip 3). For this reason, it becomes easy to control the impedance components of the plurality of transmission paths.

In the example shown in FIG. 8, the thickness of the logic chip LC is smaller than the thickness of the memory module MCM of the plurality of memory chips MC0, MC1, MC2, and MC3 (see FIG. 7) arranged over the logic chip LC. Further, the thickness of the logic chip LC is smaller than the thickness of the memory chip MC3 mounted at the uppermost stage, and not including the through electrodes 3tsv formed therein of the plurality of memory chips MC0, MC1, MC2, and MC3. For example, the thickness of the logic chip LC is about 50 μm. In contrast, the thickness of the memory chip MC3 is about 80 μm to 100 μm. Whereas, the thickness of the memory module MCM of the plurality of memory chips MC0, MC1, MC2, and MC3 (see FIG. 7) is about 260 μm.

When the semiconductor chip 3 is reduced in thickness as described above, the semiconductor chip 3 may be damaged with the semiconductor chip 3 exposed. In accordance with the present embodiment, as shown in FIG. 7, the sealing body 4 is brought in close contact with the plurality of semiconductor chips 3 for sealing. Accordingly, the sealing body 4 functions as a protecting member for the semiconductor chips 3, and can suppress damages of the semiconductor chip 3. In other words, in accordance with the present embodiment, by sealing the plurality of semiconductor chips 3 with a resin, it is possible to improve the reliability (durability) of the semiconductor device 1.

Further, in the case of the semiconductor device 1 in which the semiconductor chips 3 including the through electrodes 3*tsv* are stacked, the distance between the stacked semiconductor chips 3 is preferably reduced from the viewpoint of shortening the transmission distance. For example, in the example shown in FIG. 8, the clearance distance between the back surface 3*b* of the semiconductor chip 3 on the lower stage side and the front surface 3*a* of the semiconductor chip 3 on the upper stage side is about 5 μm to 20 μm. Whereas, the distance between the front surface 3*a* of the logic chip LC and the upper surface 2*a* of the wiring substrate 2 is, for example, about 10 μm to 20 μm. For the semiconductor device 1 in which the semiconductor chips 3 including the through electrodes 3*tsv* are thus stacked, preferably, the reduction of the thickness of and the clearance distance between the semiconductor chip 3 shortens the transmission distance.

<Details of Semiconductor Chip Connection Part>

Figure 9:
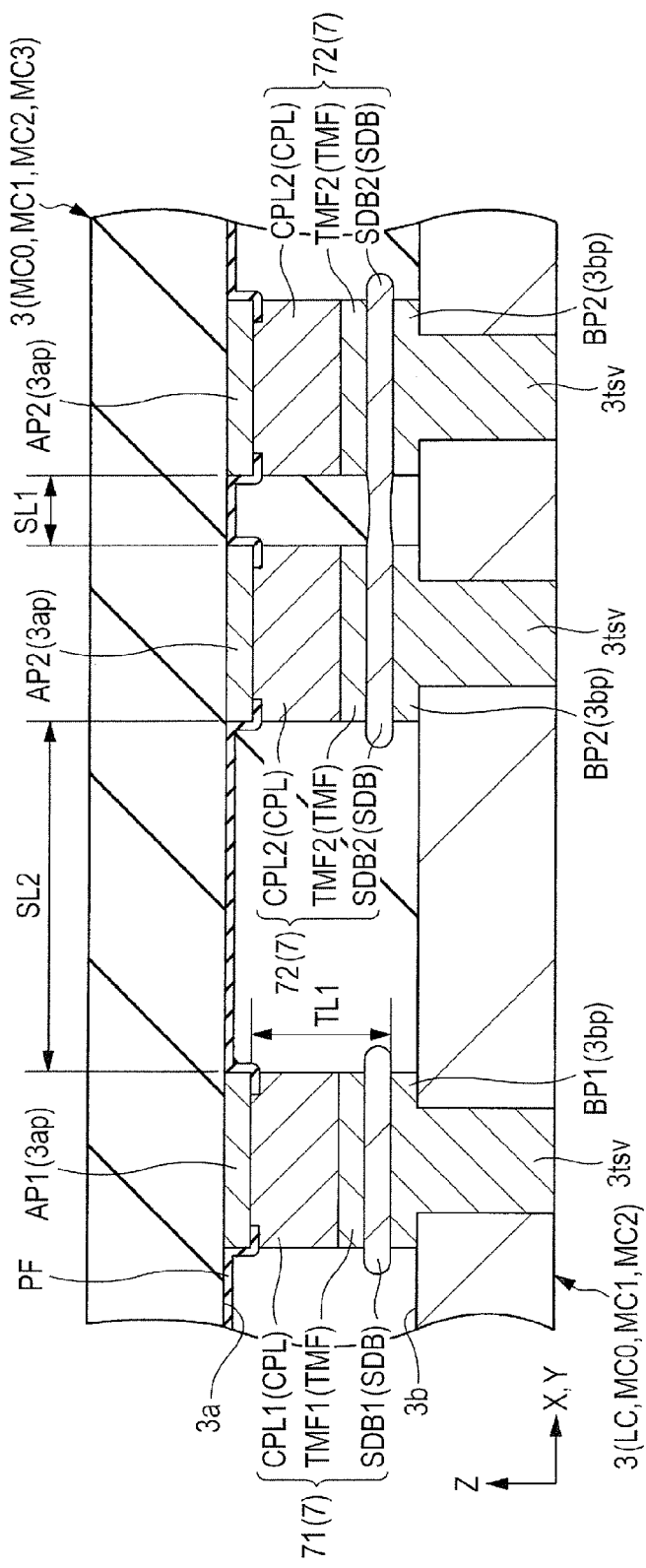
FIG. 9 is an enlarged cross sectional view showing the structure of a connection part for electrically connecting the semiconductor chips shown in FIG. 8.
Figure 10:
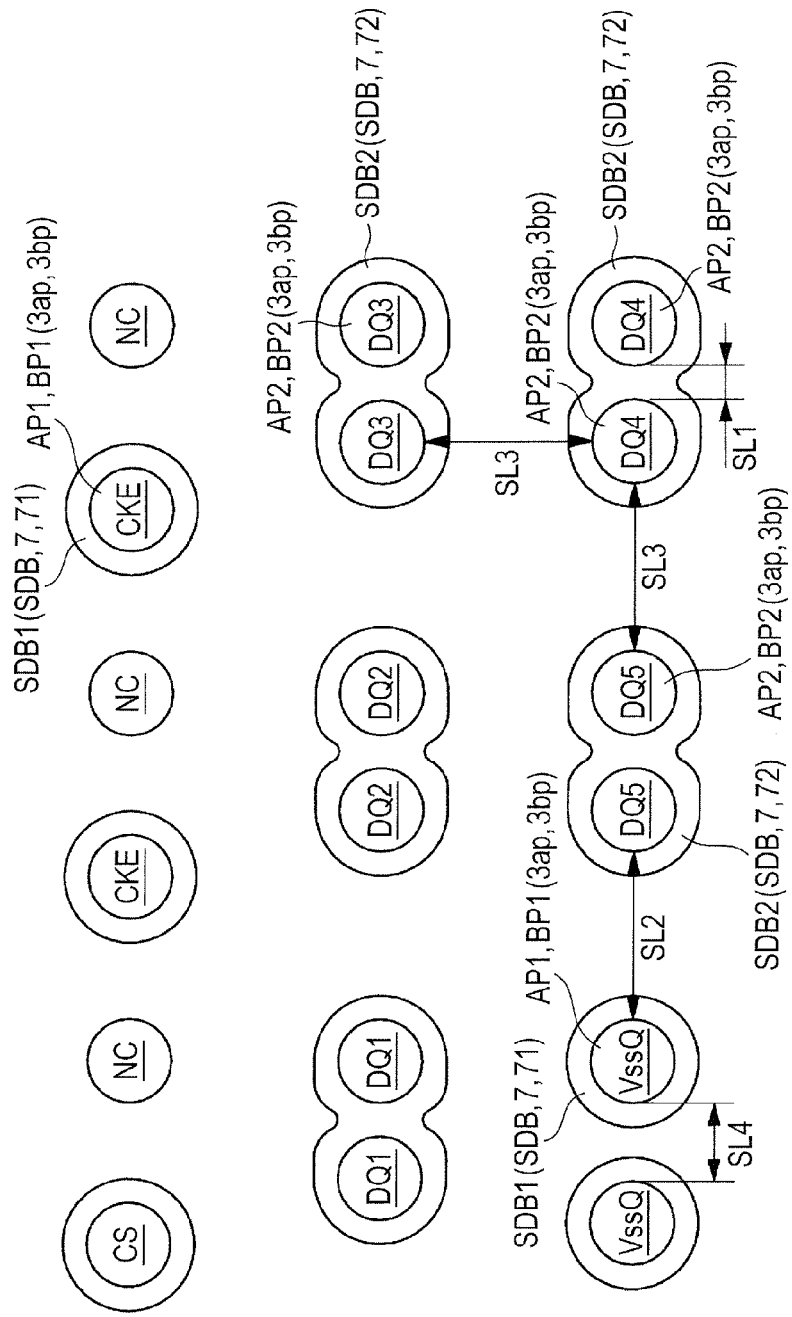
FIG. 10 is an explanatory view showing some of a large number of electrodes included in the semiconductor chip on an enlarged scale in order to show the planar positional relation between a plurality of electrodes and solder materials shown in FIG. 9.

Then, a description will be given to the detailed structure of the connection part for establishing an electrical connection between the semiconductor chips 3 shown in FIG. 8. FIG. 9 is an enlarged cross sectional view showing the structure of a connection part for electrically connecting the semiconductor chips shown in FIG. 8. Whereas, FIG. 10 is an explanatory view showing some of a large number of electrodes included in the semiconductor chip on an enlarged scale in order to show the planar positional relation between a plurality of electrodes and solder materials shown in FIG. 9. In FIG. 10, in order to show the state in which the structure of adjacent solder materials in contact with each other and the structure of the adjacent solder materials spaced apart from each other are present in a mixed manner, the front surface electrodes or the back surface electrodes, and the solder materials are shown in an overlapping relation. Further, in FIG. 10, in order to clearly show the type of the signal current flowing through each of the plurality of electrodes, the flowing signal type is shown with an underline at the center of the electrode forming a circle. For example, the front surface electrode AP2 and the back surface electrode BP2 described as underlined DQ1, DQ2, DQ3, DQ4, or DQ5 passes the data signal DQ described by reference to FIG. 3 therethrough. Whereas, the front surface electrode AP1 and the back surface electrode BP1 described as underlined CKE pass the clock enable signal CKE described by reference to FIG. 3 therethrough.

In the example shown in FIG. 9, the front surface electrode 3*ap* and the back surface electrode 3*bp* are electrically connected with each other via an inter-chip connection member 7 including a metal pillar CPL, a metal film TMF formed on the tip surface of the metal pillar CPL, and a solder material SDB bonded to the metal film TMF and the back surface electrode 3*bp*. Incidentally, FIG. 9 shows one example of the structure of the connection portion (inter-chip connection member 7) for electrically connecting the front surface electrode 3*ap* of the semiconductor chip 3 on the upper stage side with the back surface electrode 3*bp* of the semiconductor chip 3 on the lower stage side. However, the structures of the inter-chip connection member 7 include various modified examples.

The front surface electrode 3*ap* is a metal film formed on the front surface 3*a* side of the semiconductor chip 3, and is formed of a metal material including, for example, aluminum (Al) as a main component (other than aluminum, an element such as copper or silicon may be included). The front surface 3*a* of the semiconductor chip 3 is covered with an insulation film (a protective film or a passivation film) PF which is, for example, silicon nitride (SiN). A part of the front surface electrode 3*ap* is exposed at the opening formed in the insulation film PF.

Whereas, the metal pillar CPL is a pillar-shaped metal member to be bonded with the front surface electrode 3*ap*, and is formed of, for example, copper (Cu). The pillar-shaped metal member formed of copper is called a Cu pillar. The copper forming the metal pillar CPL has a higher melting point than that of the solder material SDB. For this reason, in the reflow step of electrically connecting the semiconductor chips 3 to be stacked, the metal pillar CPL is not molten. Therefore, it becomes easy to control the clearance distance between the semiconductor chips 3 to be stacked. Further, the copper forming the metal pillar CPL has a larger electrical conductivity than that of the solder forming the solder material SDB. For this reason, when the amount of the solder material SDB can be reduced by allowing the metal pillar CPL to be interposed between the front surface electrode 3*ap* and the back surface electrode 3*bp*, the impedance in the transmission path can be reduced.

Further, the metal film TMF formed on the tip surface (the surface situated opposite to the junction surface with the front surface electrode 3*ap*) of the metal pillar CPL is a metal film formed of, for example, nickel (Ni). By forming the metal film TMF at the junction surface with the solder material SDB, it is possible to improve the wettability of the solder material SDB. Further, by covering the connection portion of the metal pillar CPL with the solder material SDB with the metal film TMF such as nickel, it is possible to suppress the oxidation of the connection surface.

Further, the solder material SDB is a connection member for being molten by being subjected to the reflow treatment (heat treatment), and connecting metals. The solder materials include various modified examples. In the present embodiment, the solder material SDB is formed of a so-called lead-free solder substantially not including lead (Pb). Examples of the solder material called a lead-free solder include only tin (Sn), tin-bismuth (Sn—Bi), or tin-silver-copper (Sn—Ag—Cu). Herein, the lead-free solder means a solder having a lead (Pb) content of 0.1 wt % or less. The content is defined as a standard of the RoHs (Restriction of Hazardous Substances) directive.

Further, the back surface electrode 3*bp* is a metal film formed on the back surface 3*b* side of the semiconductor chip 3, and in the example shown in FIG. 9, is formed of copper, and is formed integrally with the through electrode 3*tsv*.

Herein, as shown in FIG. 9, in the present embodiment, in some inter-chip connection members 7 of the plurality of inter-chip connection members 7, the solder materials SDB2 of the inter-chip connection members 7 arranged adjacent to each other are in contact with each other, and are integrated. The reason why the adjacent solder materials SDB2 are thus brought into contact with each other will be described below.

As described above, in the present embodiment, the bus width enlargement method and the clock number increase method are combined to be applied, thereby to increase the signal transmission rate. Accordingly, the semiconductor chips 3 arranged in a stacked manner are electrically connected via the inter-chip connection members 7, thereby to reduce the transmission distance, resulting in the reduction of the impedance. However, it is indicated as follows: from the viewpoint of stabilizing the communication quality among the plurality of semiconductor chips 3, it is necessary not only to simply reduce the absolute value of the impedance, but also to consider the variations in impedance among a plurality of transmission paths.

When the transmission path is formed of a member having a small volume as with the inter-chip connection member 7, the variations in shape and volume among the inter-chip connection members 7 derived from the processing precision in manufacturing largely affect the variations in impedance among a plurality of transmission paths.

Particularly, when the operation frequency of the signal transmission path is increased, the pulse width is required to be shortened. For this reason, a phenomenon called a so-called skin effect is required to be considered. The skin effect is a phenomenon occurs on the following principle. Namely, when electrical charges move in a conductor, under the effect of the magnetic field generated due to the movement of the electrical charges causes a counter electromotive force in the conductor. Further, a decrease in pulse width results in an uneven distribution of the counter electromotive force in the conductor. As a result, the current density of the surface of the conductor becomes relatively higher than that of the central part of the conductor. In other words, a decrease in pulse width of a signal causes the current flow paths to be concentrated to the surface of the conductor. In other words, when the frequency of the signal current increases, the current flow paths concentrate to the surface of the conductor. In consideration of the skin effect, the volume of the portion of the inter-chip connection member 7 through which a signal current mainly flows becomes still further smaller than the volume of the whole inter-chip connection member 7. For this reason, the variations in shape and volume among the inter-chip connection members 7 particularly largely affect the variations in impedance among the plurality of transmission paths.

Whereas, the solder material SDB formed of a metal material having a relatively smaller electrical conductivity of the inter-chip connection member 7 more largely affects the variations in impedance than the metal pillar CPL and the metal film TMF.

Thus, in the present embodiment, as shown in FIGS. 9 and 10, in some of the inter-chip connection members 7 arranged adjacent to each other, the solder materials SDB2 come in contact with each other, and are integrated. In other words, the plurality of inter-chip connection members 7 include the inter-chip connection members 71 separated from the adjacent inter-chip connection members 7, and the inter-chip connection members 72 in which the adjacent inter-chip connection members 7 are in contact with each other. As shown in FIG. 10, the surface area of the integrated adjacent solder materials SDB2 is larger than the surface area of the solder material SDB not in contact with the adjacent solder material SDB. For this reason, even when a variation is caused in shape or volume among the plurality of solder materials SDB2 under the influence of the processing precision or the like, it is possible to reduce the effect exerted on the variation in impedance among the plurality of transmission paths through the plurality of solder materials SDB2. Below, the structure in which at least portions of the inter-chip connection members 7 arranged adjacent to each other are in contact with each other to be integrated as with the solder materials SDB2 shown in FIGS. 9 and 10 will be described as an adjacent solder material integrated structure. On the other hand, the structure in which the inter-chip connection members 7 arranged adjacent to each other are respectively formed separately as with the solder materials SDB1 shown in FIGS. 9 and 10 will be described as a solder material separated structure.

Further, as shown in FIGS. 9 and 10, in the present embodiment, the distance SL1 between the back surface electrodes BP2 connected with the integrated solder materials SDB2 of the plurality of back surface electrodes 3bp is smaller than the distance SL2 between the back surface electrode BP1 connected with the solder material SDB1 and the back surface electrode BP2. Whereas, as shown in FIG. 10, the distance SL1 between the back surface electrodes BP2 connected with the integrated solder materials SDB2 is smaller than the distance SL3 between the back surface electrodes BP2 through which mutually different signals flow, and the distance SL4 between the back surface electrodes BP1.

Further, as shown in FIG. 9, in the present embodiment, the plurality of front surface electrodes 3ap of the semiconductor chip 3 on the upper stage side are arranged in such a manner as to face to the plurality of back surface electrodes 3bp of the semiconductor chip 3 on the lower stage side, respectively. Therefore, The positional relationship between the back surface electrodes BP1 and BP2 described above also applies to the front surface electrodes AP1 and AP2. Namely, the distance SL1 between the front surface electrodes AP2 connected with the integrated solder materials SDB2 of the plurality of front surface electrodes 3ap is smaller than the distance SL2 between the front surface electrode AP1 connected with the solder material SDB1 and the front surface electrode AP2. Whereas, as shown in FIG. 10, the distance SL1 between the front surface electrodes AP2 connected with the integrated solder materials SDB2 is smaller than the distance SL3 between the front surface electrodes AP2 through which mutually different signals flow, and the distance SL4 between the front surface electrodes AP1.

For example, in the example shown in FIG. 10, the distance SL1 is about 8 µm. In contrast, the distance SL2 and the distance SL3 are each about 40 µm, and the distance SL4 is about 20 µm. In the step of stacking the semiconductor chips 3 (see FIG. 9), the solder material SDB is molten for bonding. At this step, when the distance between the adjacent electrodes is small, the adjacent solder materials SDB are in contact with each other, and become more likely to be integrated. In other words, when the clearance distance SL1 between the adjacent front surface electrodes AP2 and between the adjacent back surface electrodes BP2 is reduced, the solder materials SDB2 are in contact with each other, and become more likely to be bonded. On the other hand, the distance between electrodes through which different signal currents flow is required to be set at such a degree that the solder materials SDB are not in contact with each other from the viewpoint of preventing the short circuit. Therefore, in the present embodiment, as shown in FIG. 10, the distance SL1 is smaller than each of the distance SL2, the distance SL3, and the distance SL4.

Further, in the example shown in FIG. 9, the distance TL1 between the front surface electrode 3ap and the back surface electrode 3bp of the semiconductor chip 3 on the upper stage side is about 15 µm to 20 µm. In other words, in the example shown in FIG. 9, the adjacent electrodes are arranged closer to each other to such a degree that the distance SL1 is smaller than the distance TL1. This makes the solder materials SDB2 more likely to be integrated. However, in the example shown in FIG. 9, the metal pillar CPL is interposed between the front surface electrode 3ap and the back surface electrode 3*bp*. Accordingly, the distance SL1 is smaller than the distance TL1. However, the structures of the inter-chip connection members 7 include various modified examples other than that shown in FIG. 9. Therefore, the distance TL1 may be smaller than the distance SL1 according to the structure of the inter-chip connection members 7.

Incidentally, from the viewpoint of simply reducing the variation in impedance, it can also be considered that all the transmission paths have the adjacent solder material integrated structure as with the solder material SDB2. However, when the structure is applied to all the transmission paths, the electrode arrangement space in plan view increases, resulting in an increase in size of the package. Thus, in the present embodiment, an order of priority is fixed for the application of the adjacent solder material integrated structure in which the adjacent solder materials SDB are in contact with each other. Thus, the adjacent solder material integrated structure is applied to some transmission paths, and the solder material separated structure (the structure as that of the solder material SDB1 shown in FIGS. 9 and 10) is applied to others.

Particularly, the adjacent solder material integrated structure is applied to the path for transmitting a data signal DQ and the path for transmitting a data mask signal DM of the transmission paths electrically connected with the data input/output circuit IOB shown in FIG. 3. Incidentally, in FIG. 10, the data signal DQ transmission path is exemplarily shown. However, the data mask signal DM transmission path also forms the same structure as that of the solder material SDB2 shown in FIG. 10. For the path for transmitting a data signal DQ and the path for transmitting a data mask signal DM, the ratio of the pulse width to the clock signal CK is 1 or less in each of the data input/output forms shown in FIG. 34. Further, the path for transmitting a data signal DQ has the maximum operation frequency (e.g., 400 MHz). Therefore, the skin effect is relatively more likely to occur. Therefore, application of the adjacent solder material integrated structure produces a particularly large effect of suppressing the variation in impedance.

Further, to the path for transmitting a clock signal CK of the transmission paths connected to the clock oscillation circuit CKG shown in FIG. 3, there is applied the adjacent solder material integrated structure shown in FIGS. 9 and. 10. FIG. 10 is a view showing portions of a large number of electrodes on an enlarged scale, and hence does not show the transmission path for a clock signal CK shown in FIG. 3. However, the transmission path of the clock signal CK also forms the same structure as that of the solder material SDB2 shown in FIG. 10. The pulse width of the clock signal CK is an object to be compared with the pulse widths of other signals. For this reason, as shown in FIG. 34, the proportional function (the ratio with respect to the reference value) of the pulse width is 1. Further, the path for transmitting the clock signal CK has the second largest frequency after the path for transmitting a data signal DQ (e.g., 200 MHz). Therefore, by applying the adjacent solder material integrated structure thereto, it becomes easy to produce an effect of suppressing the variation in impedance.

In the present embodiment, to other transmission paths than the transmission paths described above, such as a transmission path connected with the command control circuit CMDC, a transmission path connected with the address buffer circuit ABF, or the path for transmitting a clock enable signal CKE, there is applied the solder material separated structure. Whereas, other than the signal transmission paths, to the transmission paths connected with a power supply control circuit PSM for driving the memory circuit DRAM shown in FIG. 3, and for supplying a power supply potential or a reference potential, there is applied the solder material separated structure. Namely, the adjacent solder materials SDB are not in contact with each other. FIG. 10 is an enlarged view of portions of a large number of electrodes, and hence exemplarily shows a chip select signal CS, a clock enable signal CKE, and a data reference potential VssQ of the transmission paths. Therefore, the transmission paths for those other than the data signal DQ, the data mask signal DM, and the clock signal CK described below, in other words, the transmission paths to which the solder material separated structure is applied in the present embodiment include the following paths. Namely, in the present embodiment, the transmission paths to which the solder material separated structure is applied include the transmission paths for a clock enable signal CKE, a chip select signal CS, a row address strobe signal RAS, a column address strobe signal CAS, a write enable signal WE, address signals A0 to A13, a bank address signal BA, and a reset signal RST. Further, in the present embodiment, the solder material separated structure is also applied to the signal transmission path for a data strobe signal DQS.

The transmission paths for those other than a data signal DQ, a data mask signal DM, and a clock signal CK are longer in pulse width than the path for transmitting a data signal DQ, a path for transmitting a data mask signal DM, and a path for transmitting a clock signal CK. Further, the transmission paths for those other than a data signal DQ, a data mask signal DM, and a clock signal CK are smaller in frequency than the path for transmitting a data signal DQ (e.g., 100 MHz or less). Therefore, in the present embodiment, to the transmission path having a relatively longer pulse width, there is applied the solder material separated structure, thereby to save the electrode arrangement space in plan view.

Figure 11:
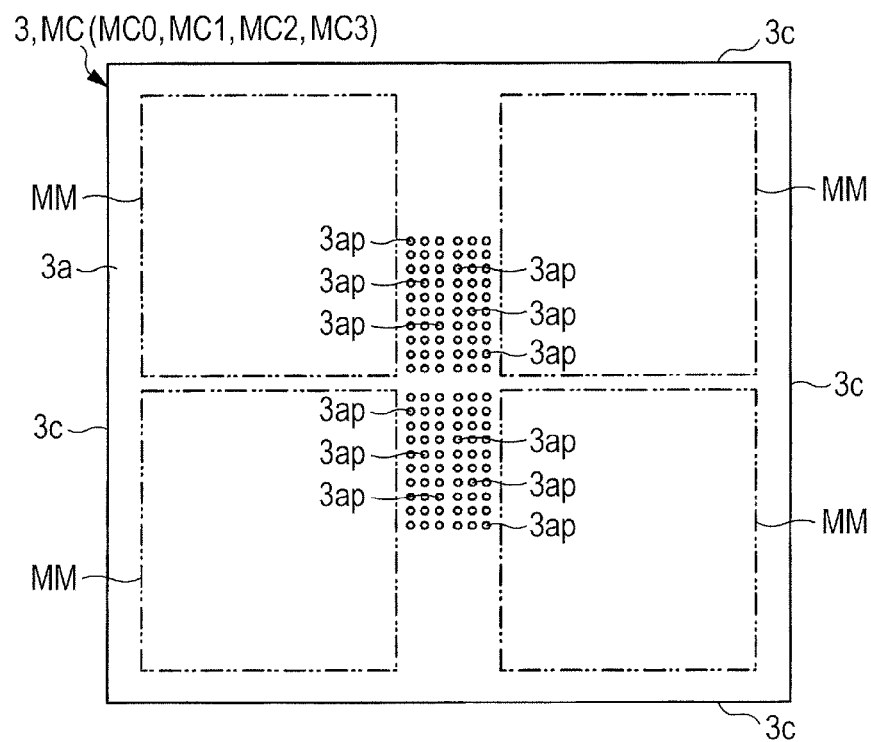
FIG. 11 is a plan view showing the front surface side of the memory chip shown in FIG. 7.
Figure 12:
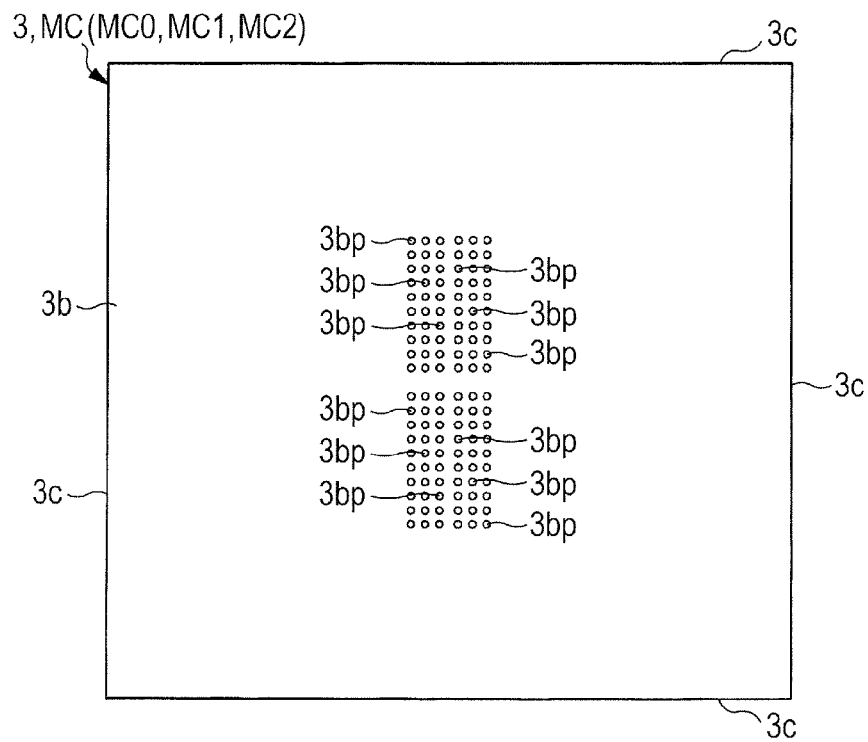
FIG. 12 is a plan view showing the back surface side of the memory chip shown in FIG. 11.
Figure 13:
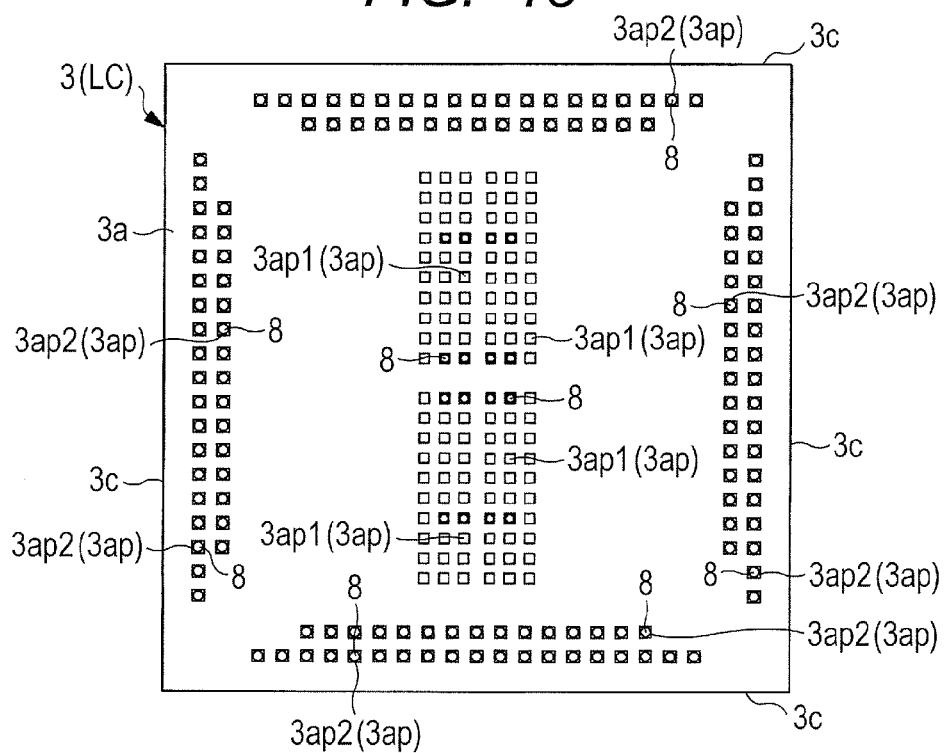
FIG. 13 is a plan view showing the front surface side of the logic chip shown in FIG. 7.
Figure 14:
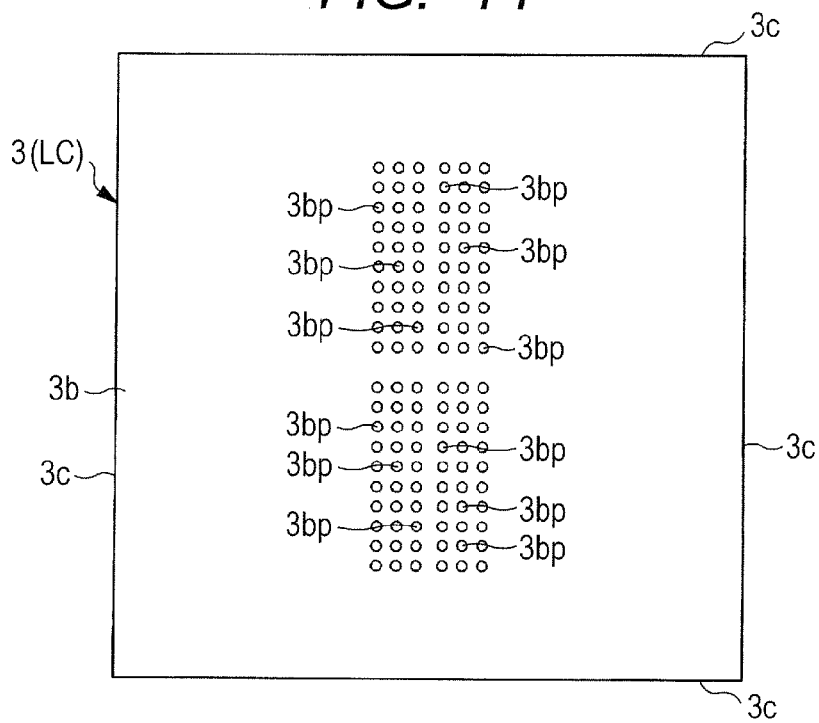
FIG. 14 is a plan view showing the back surface side of the logic chip shown in FIG. 13.

Then, a description will be given to the layout of the electrodes in plan view of each of the plurality of stacked semiconductor chips 3. FIG. 11 is a plan view showing the front surface side of the memory chip shown in FIG. 7; FIG. 12 is a plan view showing the back surface side of the memory chip shown in FIG. 11. Whereas, FIG. 13 is a plan view showing the front surface side of the logic chip shown in FIG. 7; and FIG. 14 is a plan view showing the back surface side of the logic chip shown in FIG. 13. Incidentally, in FIGS. 11 to 14, for ease of understanding, the electrodes are shown in a reduced number. However, the number of the electrodes (the front surface electrodes 3*ap*, the back surface electrodes 3*bp*, and the through electrodes 3*tsv*) is not limited to the embodiments shown in FIGS. 11 to 14. Whereas, FIG. 12 shows a back surface view of the memory chips MC0, MC1, and MC2. However, the structure of the back surface of the memory chip MC3 (see FIG. 7) in which the back surface electrode 3*bp* is not formed is shown in FIG. 6, and hence is not shown.

As shown in FIG. 11, on the front surface 3*a* side of the memory chips MC0, MC1, MC2, and MC3 (particularly, over the main surface of the semiconductor substrate), there are arranged a plurality of memory mats MM. The memory mat MM is a memory circuit formation region in which a plurality of memory cells MCA described by reference to FIG. 3 are arranged in an array. In the example shown in FIG. 11, there are formed four memory mats MM corresponding to the four channels.

Herein, as shown in FIG. 11, a plurality of front surface electrodes 3*ap* included in the memory chips MC0, MC1, MC2, and MC3 are arranged in a collected manner at the central part at the front surface 3*a*. When, as shown in FIG.

11, the plurality of front surface electrodes 3*ap* included in the memory chip MC are arranged in a collected manner at the central part of the front surface 3*a*, the memory mats MM for four channels can be arranged in such a manner as to surround the region in which the front surface electrode group is arranged. In this case, it is possible to equalize the distances between respective memory mats MM and the front surface electrodes 3*ap*. In other words, when the plurality of front surface electrodes 3*ap* are arranged each closer to the center of the front surface 3*a* as shown in FIG. 11, it is possible to equalize the lengths of respective transmission paths of a plurality of channels. This is preferable in that the error in transmission rate of each channel can be reduced.

Further, as shown in FIG. 8, the plurality of front surface electrodes 3*ap* of the memory chips MC0, MC1, and MC2, and the plurality of back surface electrodes 3*bp* of the memory chips MC0, MC1, and MC2 are arranged at positions overlapping in the thickness direction, and are electrically connected with each other via the plurality of through electrodes 3*tsv*, respectively. Therefore, as shown in FIG. 12, the plurality of back surface electrodes 3*bp* included in the memory chips MC0, MC1, and MC2 are arranged in a collected manner at the central part of the back surface 3*b*. This can minimize the length of the transmission path penetrating through the memory chips MC0, MC1, and MC2.

Further, as shown in FIG. 8, the plurality of back surface electrodes 3*bp* of the logic chip LC and the plurality of front surface electrodes 3*ap* of the memory chip MC0 are respectively arranged at positions overlapping in the thickness direction, and are electrically connected with each other via the inter-chip connection members 7, respectively. Therefore, as shown in FIG. 14, the plurality of back surface electrodes 3*bp* included in the logic chip LC are arranged in a collected manner at the central part of the back surface 3*b*. This can minimize the length of the transmission path for connecting the memory chip MC0 with the logic chip LC.

Further, as shown in FIG. 13, some (a plurality of front surface electrodes 3*ap*1) of the plurality of front surface electrodes 3*ap* included in the logic chip LC are arranged at the central part at the front surface 3*a*. Whereas, others (a plurality of front surface electrodes 3*ap*2) of the plurality of front surface electrodes 3*ap* included in the logic chip LC are arranged along the sides (side surfaces 3*c*) of the front surface 3*a* at the outer edge part of the front surface 3*a*. Of the plurality of front surface electrodes 3*ap* shown in FIG. 13, a plurality of front surface electrodes 3*ap*1 arranged at the central part of the front surface 3*a* are electrically connected with the back surface electrodes 3*bp* through the through electrodes 3*tsv* shown in FIG. 8. In other words, the plurality of front surface electrodes 3*ap*1 are electrodes for internal interface.

Further, the planar size of the logic chip LC is smaller than each planar size of the memory chips MC0, MC1, MC2, and MC3. Whereas, as shown in FIG. 6, at the semiconductor device 1, in plan view, the central part (central region) of the back surface 3*b* of the logic chip LC is arranged in such a manner as to overlap the central part (central region) of the memory chip MC3. In other words, in plan view, the four side surfaces 3*c* of the memory chip MC3 are arranged outside the four side surfaces 3*c* of the logic chip LC. In other words, the plurality of semiconductor chips 3 are stacked and mounted over the wiring substrate 2 so that the four side surfaces 3*c* of the memory chip MC3 are situated between the four side surfaces 3*c* of the logic chip LC and the four side surfaces 2*c* of the wiring substrate 2.

Further, the memory chips MC0, MC1, and MC2 shown in FIG. 7 are arranged at the position overlapping (the same position as) the memory chip MC3.

For this reason, in plan view, each outer edge part (each outer edge part of the front surface 3*a* and the back surface 3*b*) of the memory chips MC0, MC1, MC2, and MC3 is arranged at the position overlapping the peripheral region outside the logic chip LC. In other words, the logic chip LC is not present between each outer edge part of the memory chips MC0, MC1, MC2, and MC3 and the wiring substrate 2 (e.g., see FIG. 7).

Thus, in order to arrange the front surface electrodes 3*ap* and the back surface electrodes 3*bp* for internal interface shown in FIG. 8 of each semiconductor chip 3 at the positions overlapping in the thickness direction, at least the front surface electrode 3*ap* and the back surface electrode 3*bp* for internal interface are preferably arranged at the positions overlapping the logic chip LC in the thickness direction. Further, at the outer edge part of the logic chip LC, as shown in FIG. 13, there are arranged a plurality of front surface electrodes 3*ap*2 for external interface. Therefore, at the front surface 3*a* of the logic chip LC, the plurality of front surface electrodes 3*ap*1 for internal interface are preferably arranged in a collected manner at the central part of the front surface 3*a*.

Further, of the plurality of front surface electrodes 3*ap* shown in FIG. 13, a plurality of front surface electrodes 3*ap*2 arranged at the outer edge part of the front surface 3*a* are electrically connected with an external device not shown via the wiring substrate 2 shown in FIG. 7. Particularly, the front surface electrode 3*ap*2 is electrically bonded with the bonding lead 2*f* (see FIG. 7) via a bump (an electrode or an external terminal) 8. In other words, a plurality of front surface electrodes 3*ap*2 are electrodes for external interface. The bump 8 for electrically connecting the logic chip LC with the wiring substrate 2 (see FIG. 8) is a metal member obtained by stacking a nickel (Ni) film or a solder film (solder material) at the tip of a member formed in, for example, a pillar shape (e.g., a cylindrical shape), and including copper (Cu) as a main component. The solder film at the tip is bonded with the back surface electrode 3*bp*, thereby to establish an electrical connection therebetween.

Incidentally, when the front surface electrodes 3*ap*1 collected at the central part of the front surface 3*a* of the logic chip LC shown in FIG. 13 are used as electrodes exclusively for internal interface, the front surface electrodes 3*ap*1 can be allowed to function even without being electrically connected with the wiring substrate 2 shown in FIG. 8. However, when some of the front surface electrodes 3*ap*1 are electrically connected with the bonding lead 2*f* of the wiring substrate 2 as shown in FIG. 8, this configuration is preferable in that some of the front surface electrodes 3*ap*1 can be used as the electrodes for external interface.

For example, in each of the memory chips MC0, MC1, MC2, and MC3, there is formed a power supply control circuit PSM for driving the memory circuit DRAM shown in FIG. 3. As the terminal for supplying a power supply potential (first potential) or a reference potential (a second potential different from the first potential, e.g., a ground potential) to the power supply control circuit PSM, conceivably, some of the front surface electrodes 3*ap*1 shown in FIG. 13 are used. In other words, in the example shown in FIG. 13, the plurality of front surface electrodes 3*ap*1 arranged at the central part of the front surface 3*a* of the logic chip LC include a first potential electrode to which, for example, a power supply potential is supplied, and a second potential electrode to which a second potential (e.g., ground potential) different from the first potential is supplied.

When the signal transmission rate is improved, from the viewpoint of suppressing the destabilization of the operation due to instantaneous voltage drop or the like, it is preferable to shorten the transmission distance between the power supply source and the power supply consuming circuit. Thus, some of the front surface electrodes 3*ap*1 of the logic chip LC are electrically connected with the wiring substrate 2, and are supplied with a first potential (e.g., power supply potential) or a second potential (e.g., ground potential). This is preferable in being capable of shortening the distance to the driving circuits of the memory chips MC0, MC1, MC2, and MC3 each including a power supply consuming circuit. Further, for the first potential electrode to which the first potential is supplied and the second potential electrode to which the second potential different from the first potential is supplied, it is preferable that, as shown in FIG. 8, the front surface electrode 3*ap* and the back surface electrode 3*bp* overlap each other in the thickness direction, and are electrically connected with each other via the through electrode 3*tsv*.

<Manufacturing Method of Semiconductor Device>

Figure 15:
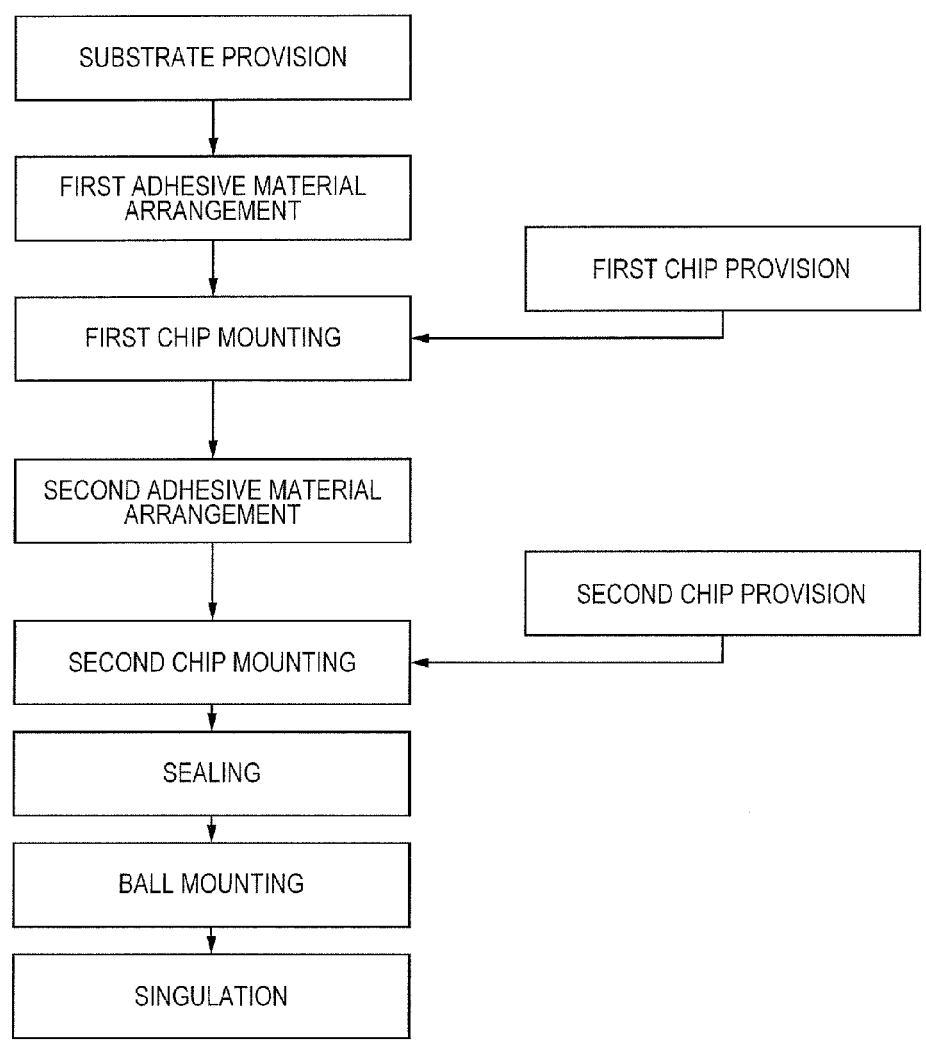
FIG. 15 is an explanatory view showing the outline of a manufacturing step of the semiconductor device described by reference to FIGS. 1 to 8.

Then, a description will be given to the manufacturing steps of the semiconductor device 1 described by reference to FIGS. 1 to 8. The semiconductor device 1 is manufactured in accordance with the flow shown in FIG. 15. FIG. 15 is an explanatory view showing the outline of a manufacturing step of the semiconductor device described by reference to FIGS. 1 to 8.

<Substrate Provision Step>

Figure 16:
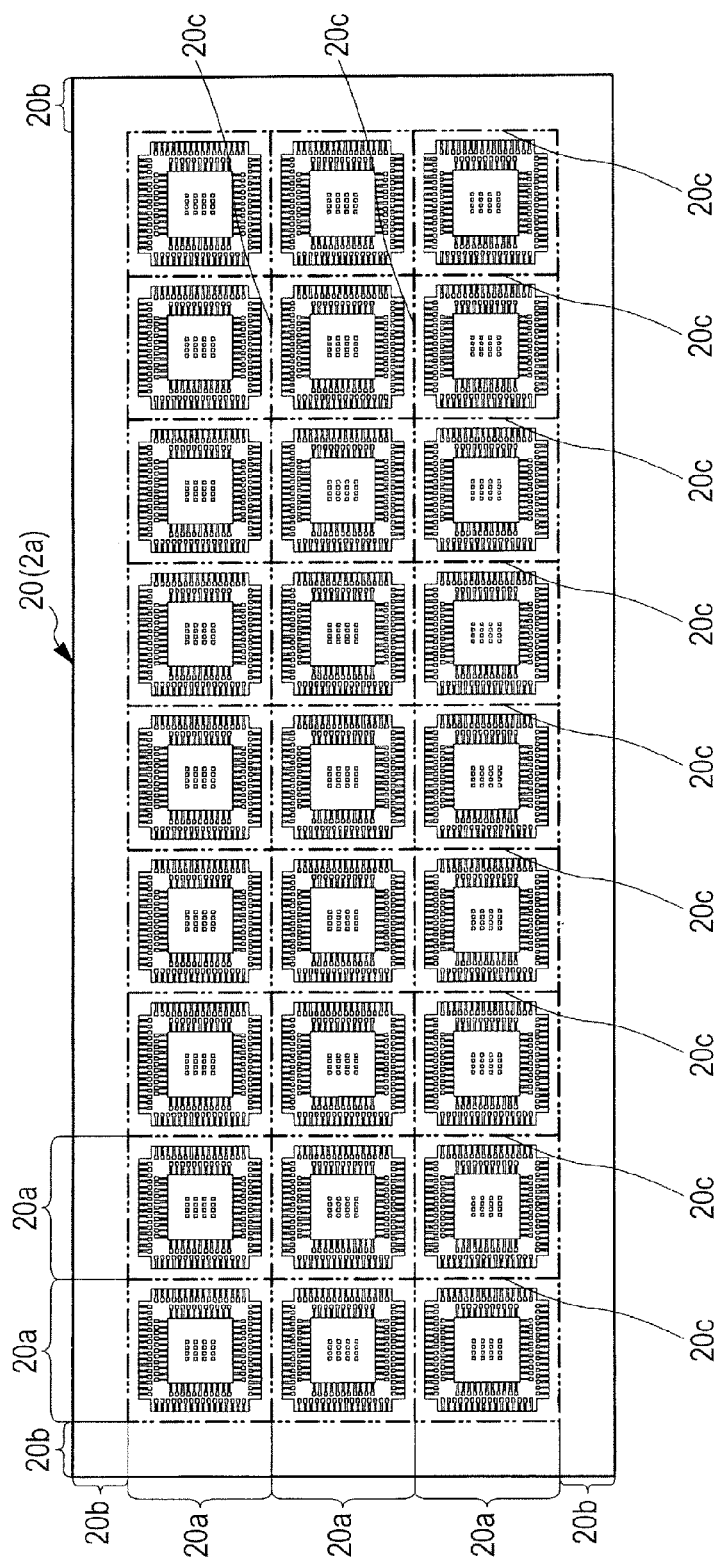
FIG. 16 is a plan view showing the overall structure of the wiring substrate provided in the substrate provision step shown in FIG. 15.

First, in a substrate provision step shown in FIG. 15, a wiring substrate 20 shown in FIG. 16 is provided. FIG. 16 is a plan view showing the overall structure of the wiring substrate provided in the substrate provision step shown in FIG. 15.

As shown in FIG. 16, the wiring substrate 20 provided in the present step includes a plurality of device formation parts 20*a* inside a frame part (outer frame) 20*b*. Particularly, the plurality of (27 in FIG. 16) device formation parts 20*a* are arranged in rows. Each of the plurality of device formation parts 20*a* corresponds to the wiring substrate 2 shown in FIGS. 4 to 8. The wiring substrate 20 is a so-called multi-piece substrate having a plurality of device formation parts 20*a* and dicing lines (dicing regions) 20*c* between respective device formation parts 20*a*. Thus, use of a multi-piece substrate including the plurality of device formation parts 20*a* can improve the manufacturing efficiency. Further, in respective device formation parts 20*a*, there are formed the constituent members of the wiring substrate 2 described by reference to FIG. 7, respectively.

<First Adhesive Material Arrangement Step>

Figure 17:
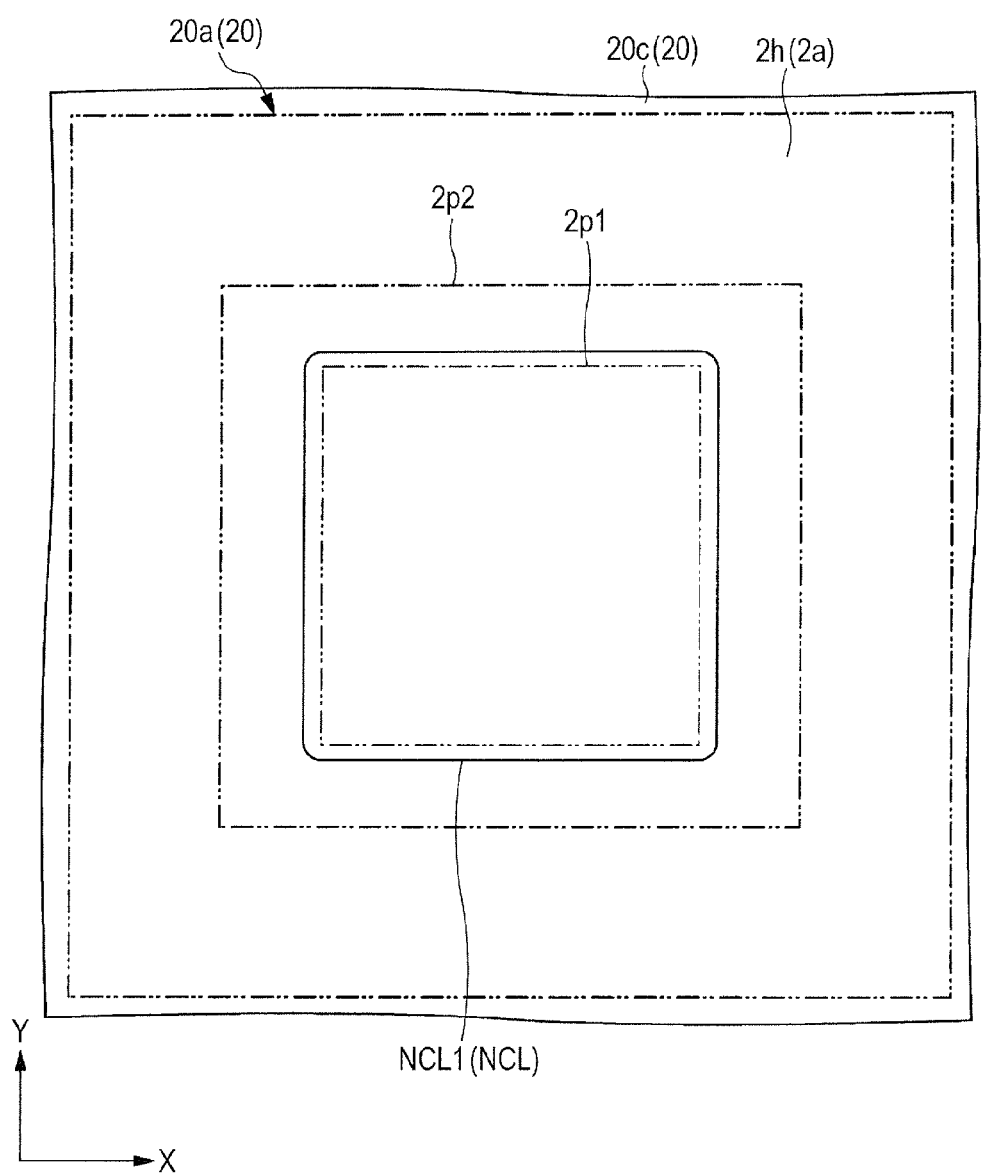
FIG. 17 is an enlarged plan view showing the state in which an adhesive material is arranged on each of a plurality of device formation parts of the wiring substrate shown in FIG. 16.
Figure 18:
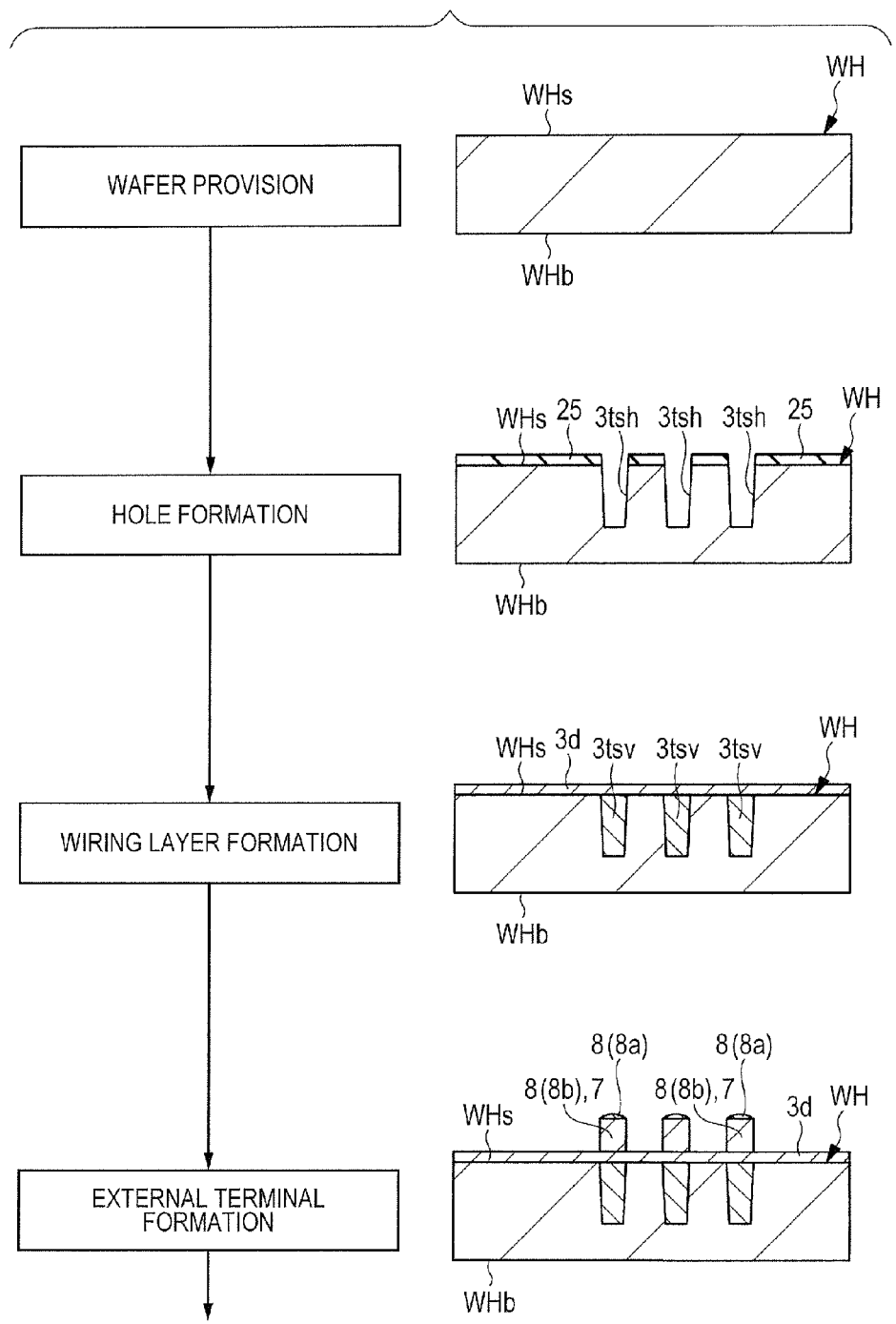
FIG. 18 is an explanatory view schematically showing the outline of a manufacturing step of the semiconductor chip including through electrodes shown in FIG. 8.

Then, in a first adhesive material arrangement step shown in FIG. 15, as shown in FIGS. 17 and 18, over a chip mounting region 2*p*1 of the upper surface 2*a* of the wiring substrate 20, there is arranged an adhesive material NCL1. FIG. 17 is an enlarged plan view showing the state in which an adhesive material is arranged on each of a plurality of device formation parts of the wiring substrate shown in FIG. 16. Incidentally, in FIG. 17, in order to show the positions of the chip mounting regions 2*p*1 and 2*p*2, the device formation part 20*a*, and the dicing line 20*c*, the outlines of the chip mounting regions 2*p*1 and 2*p*2, and the device formation part 20*a* are each indicated with a phantom line. However, the chip mounting regions 2*p*1 and 2*p*2 are the regions intended for mounting the logic chip LC and the memory module MCM (see FIG. 7) thereover, respectively.

For this reason, an actually visible boundary line is not required to be present. Whereas, also for the device formation part 20*a* and the dicing line 20*c*, an actually visible boundary line is not required to be present. Incidentally, below, when the chip mounting regions 2*p*1 and 2*p*2, the device formation part 20*a*, and the dicing line 20*c* are shown in plan view, an actually visible boundary line is similarly not required to be present.

In general, when a semiconductor chip is mounted over a wiring substrate by a face down mounting method (flip chip connection method), there is performed a method (post injection method) in which after electrically connecting the semiconductor chip and the wiring substrate, the connection portion is sealed with a resin. In this case, from the nozzle arranged in the vicinity of the gap between the semiconductor chip and the wiring substrate, a resin is supplied. Thus, the resin is filled in the gap using the capillarity.

On the other hand, in the example described in the present embodiment, before mounting the logic chip LC (see FIG. 13) over the wiring substrate 20 in a first chip mounting step described later, the adhesive material NCL1 is arranged in the chip mounting region 2*p*1. Thus, the logic chip LC is pressed from the top of the adhesive material NCL1, and is electrically connected with the wiring substrate 20. By this method (first coating method), the logic chip LC is mounted.

In the case of the post injection method, the resin is filled in the gap using the capillarity. For this reason, the treatment time (the time during which the resin is injected) for one device formation part 20*a* increases. On the other hand, in the case of the first coating method, at the time point when the tip (e.g., the bump 8 shown in FIG. 8) of the logic chip LC and the junction part of the bonding lead 2*f* come in contact with each other, the adhesive material NCL1 has already been filled between the wiring substrate 20 and the logic chip LC. Therefore, as compared with the post injection method, this method is preferable in being capable of shortening the treatment time for one device formation part 20*a*, and improving the manufacturing efficiency.

However, as a modified example with respect to the present embodiment, with the order of the first chip mounting step and the first adhesive material arrangement step shown in FIG. 15 inverted, the post injection method is applicable. For example, when the number of product formation regions to be formed in one step is smaller, the difference in treatment time is smaller. For this reason, even when the post injection method is used, it is possible to suppress the reduction of the manufacturing efficiency.

Further, the adhesive material NCL1 for use in the first coating method is formed of an insulation (non-conductive) material (e.g., a resin material) as described above.

<First Chip Provision Step>

Figure 19:
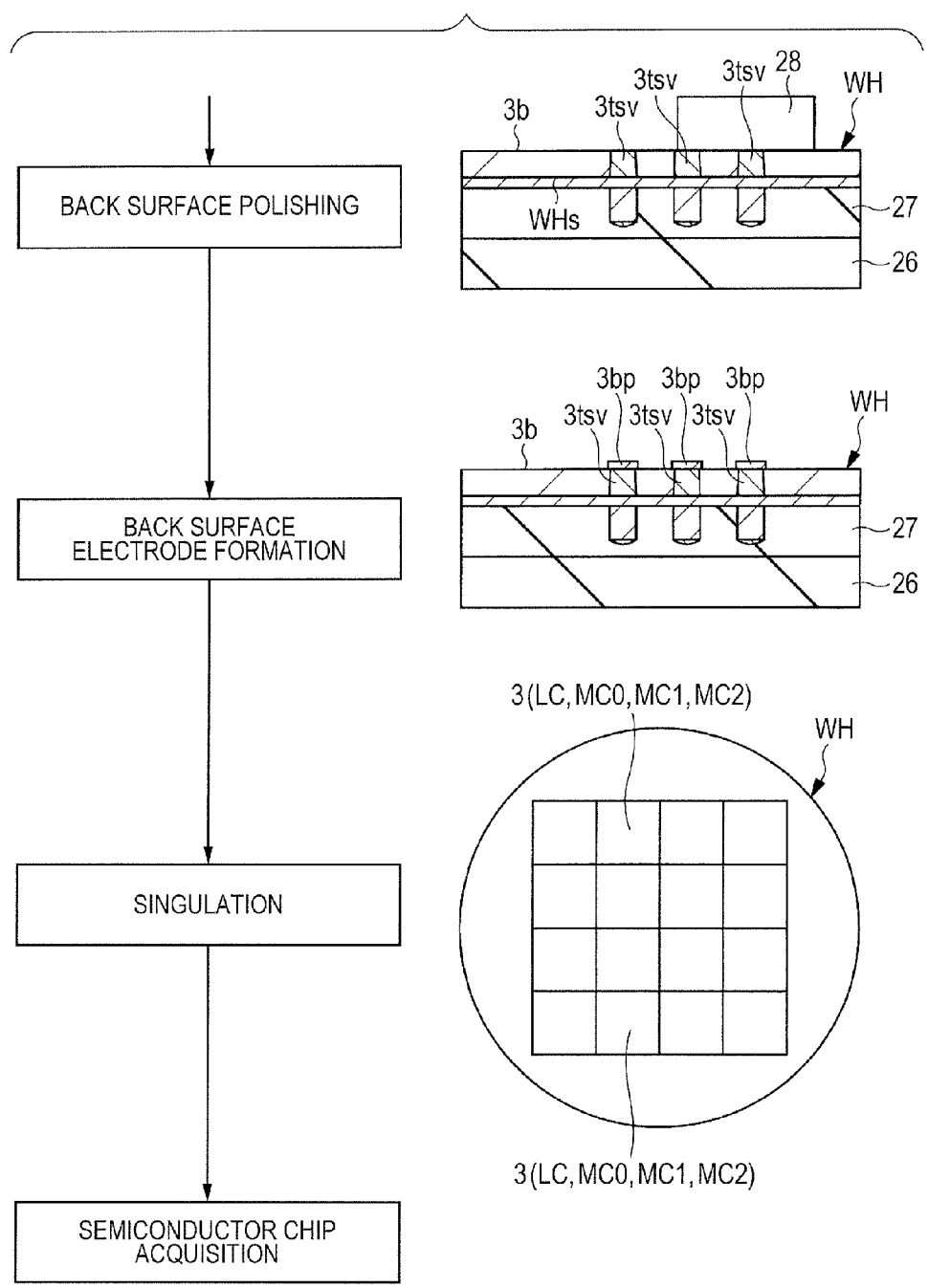
FIG. 19 is an explanatory view schematically showing the outline of a manufacturing step of the semiconductor chip following FIG. 18.

Further, in a first chip provision step shown in FIG. 15, the logic chip LC shown in FIGS. 13 and 14 is provided. FIG. 18 is an explanatory view schematically showing the outline of a manufacturing step of the semiconductor chip including through electrodes shown in FIG. 8. Whereas, FIG. 19 is an explanatory view schematically showing the outline of a manufacturing step of the semiconductor chip following FIG. 18. Incidentally, in FIGS. 18 and 19, a description will be given mainly to the manufacturing method of the through electrodes 3*tsv* and the back surface electrodes 3*bp* to be electrically connected with the through electrodes 3*tsv*. The formation steps of various circuits other than the through electrodes 3*tsv* are not shown and not described. Further, the manufacturing method of the semiconductor chips shown in FIGS. 18 and 19 is also applicable to the manufacturing methods of the memory chips MC0, MC1, and MC2 shown in FIGS. 11 and 12 in addition to the logic chip LC shown in FIGS. 13 and 14.

First, as the wafer provision step, there is provided a wafer (semiconductor substrate) WH shown in FIG. 18. The wafer WH is a semiconductor substrate formed of, for example, silicon (Si), and forms a circle in plan view. The wafer WH has a front surface (a main surface, an upper surface) WHs which is a semiconductor element formation surface and a back surface (a main surface, a lower surface) WHb opposite to the front surface WHs. Whereas, the thickness of the wafer WH is larger than the thickness of the logic chip LC or the memory chip MC0, MC1, or MC2 shown in FIG. 7, and is, for example, about several hundreds micrometers.

Then, as a hole formation step, there are formed holes (perforations or openings) $3tsh$ for forming the through electrodes $3tsv$ shown in FIG. 8. In the example shown in FIG. 18, with a mask 25 arranged over the front surface WHs of the wafer WH, an etching treatment is performed, thereby to form the holes $3tsh$. Incidentally, various circuits formed of the semiconductor elements (semiconductor circuit elements) of the logic chip LC and the memory chips MC0, MC1, and MC2 shown in FIG. 8 can be formed, for example, after the present step, and before the subsequent wiring layer formation step.

Then, a metal material such as copper (Cu) is filled in the holes $3tsh$, thereby to form the through electrodes $3tsv$. Then, as the wiring layer formation step, over the front surface WHs of the wafer WH, a wiring layer (chip wiring layer) $3d$ is formed. In the present step, the plurality of front surface electrodes $3ap$ shown in FIG. 11 or FIG. 13 are formed, and the plurality of through electrodes $3tsv$ and the plurality of front surface electrodes $3ap$ are electrically connected with each other, respectively. Incidentally, the front surface electrodes $3ap$ and the wiring layer $3d$ at the uppermost layer to be integrally formed with the front surface electrodes $3ap$ are each formed of a metal film formed of, for example, aluminum (Al).

Further, in the present step, the semiconductor chips of the logic chip LC and the memory chips MC0, MC1, and MC2 shown in FIG. 7, and the plurality of front surface electrodes $3ap$ shown in FIGS. 11 and 13 are electrically connected via the wiring layer $3d$. As a result, the semiconductor elements of the logic chip LC and the memory chips MC0, MC1, and MC2 are electrically connected via the wiring layer $3d$.

Then, as the external terminal formation step, over the front surface electrode $3ap$ (see FIGS. 11 and 13), there are formed bumps 8, respectively. In the present step, as shown in FIG. 18, over the front surface electrode $3ap$ of the logic chip LC, a conductor pillar $8b$ is formed. Then, at the tip of the conductor pillar $8b$, there is formed a solder material $8a$. Alternatively, in the case of the memory chips MC0, MC1, MC2, and MC3 shown in FIG. 9, over the front surface electrode $3ap$, there is formed the inter-chip connection member 7 including the metal pillar CPL, the metal film TMF, and the solder material SDB shown in FIG. 9. The solder material $8a$ functions as a bonding material when the semiconductor chip 3 shown in FIG. 8 is mounted over the wiring substrate 2, or the semiconductor chip 3 at the underlying layer.

Then, as a back surface polishing step shown in FIG. 19, the back surface WHb (see FIG. 18) side of the wafer WH is polished, thereby to reduce the thickness of the wafer WH. As a result, the back surface $3b$ of the semiconductor chip 3 shown in FIG. 7 is exposed. In other words, the through electrodes $3tsv$ penetrate through the wafer WH in the thickness direction. Further, the plurality of through electrodes $3tsv$ are exposed from the wafer WH at the back surface $3b$ of the wafer WH. In the example shown in FIG. 19, at the back surface polishing step, the wafer WH is polished using a polishing jig 28 while being supported by a support base material 26 such as a glass plate and a protective layer 27 for protecting the bumps 8 formed on the front surface WHs side.

Then, at the back surface electrode formation step, at the back surface $3b$, there are formed a plurality of back surface electrodes $3bp$, and are electrically connected with a plurality of through electrodes $3tsv$, respectively.

Then, as the singulation step, the wafer WH is divided along the dicing lines, thereby to obtain a plurality of semiconductor chips 3. Then, if required, an inspection is performed, resulting in the semiconductor chip 3 (the logic chip LC or the memory chip MC0, MC1, or MC2) shown in FIG. 7.

<First Chip Mounting Step>

Figure 20:
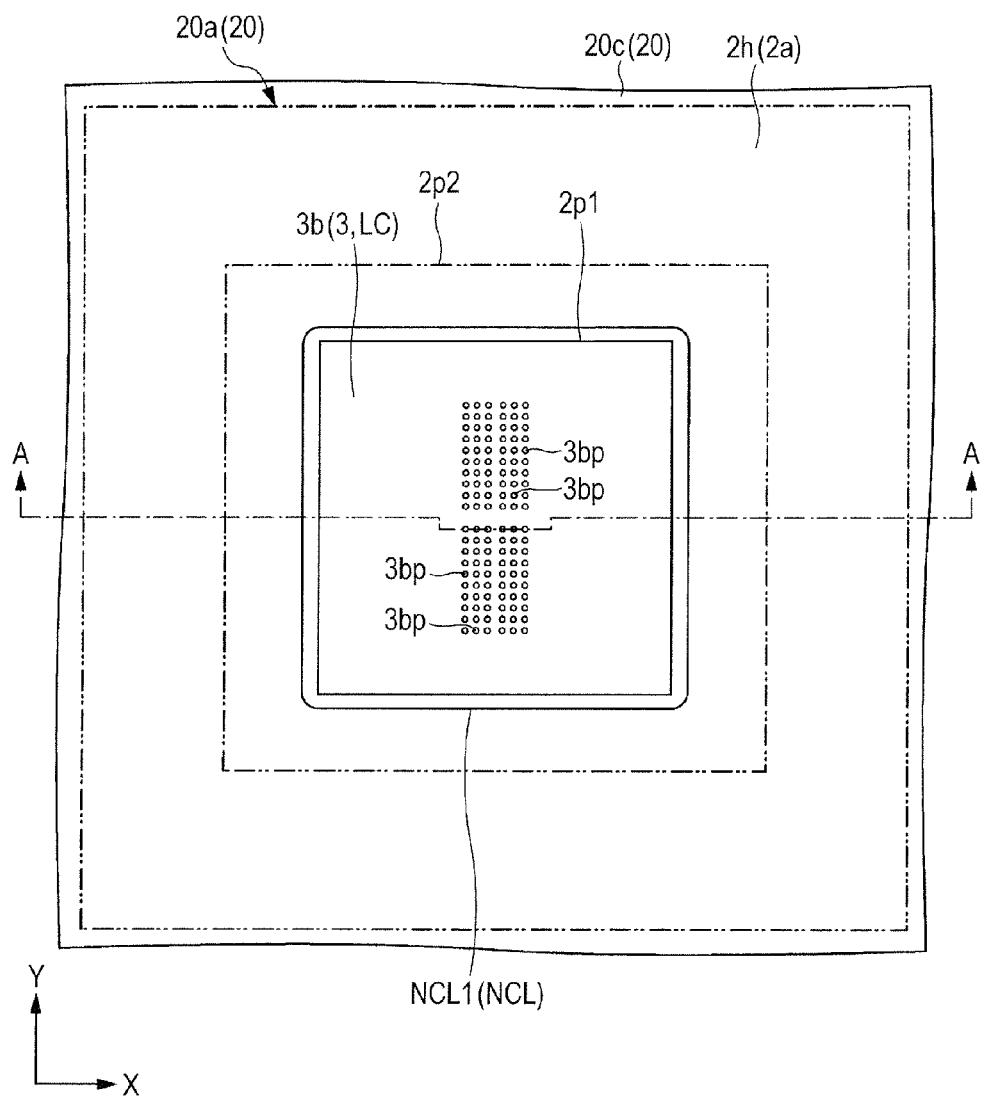
FIG. 20 is an enlarged plan view showing the state in which a logic chip is mounted over the chip mounting region of the wiring substrate shown in FIG. 17.
Figure 21:
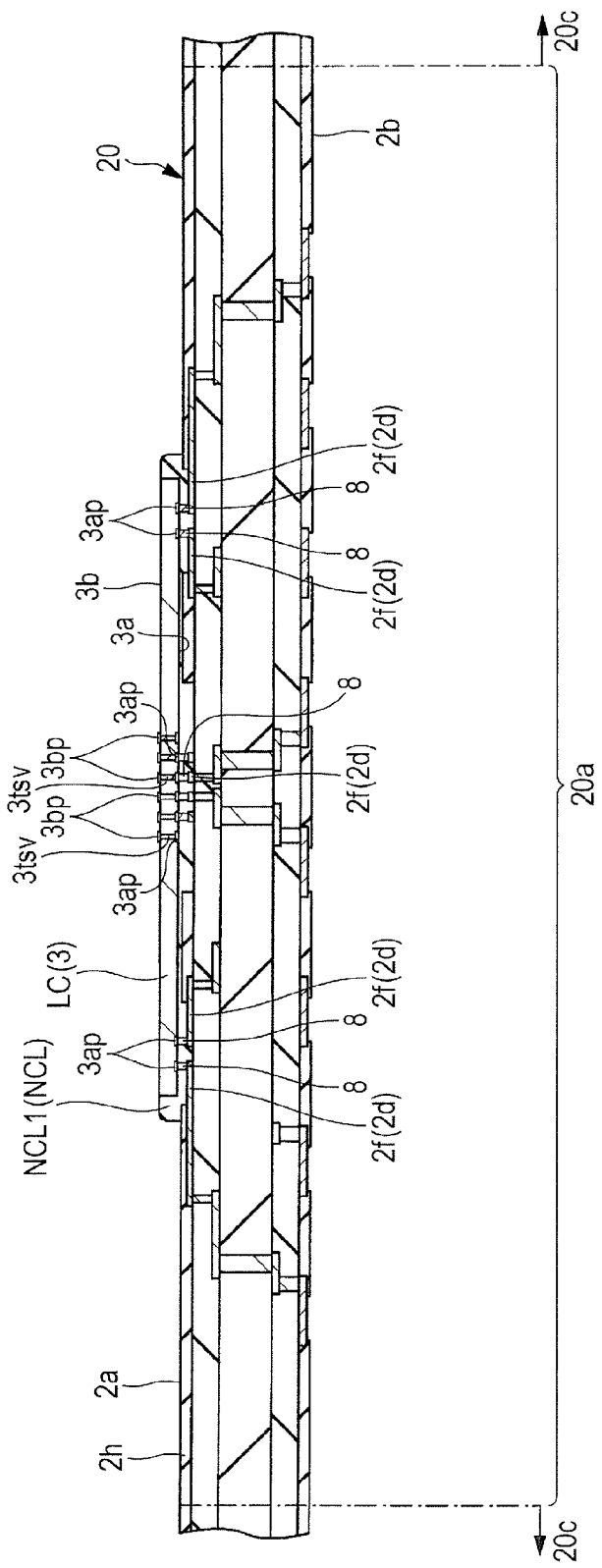
FIG. 21 is an enlarged cross sectional view along line A-A of FIG. 20.

Then, in a first chip mounting step shown in FIG. 15, as shown in FIGS. 20 and 21, the logic chip LC is mounted over the wiring substrate 20.

FIG. 20 is an enlarged plan view showing the state in which a logic chip is mounted over the chip mounting region of the wiring substrate shown in FIG. 17. Whereas, FIG. 21 is an enlarged cross sectional view along line A-A of FIG. 20.

In the present step, as shown in FIG. 21, the logic chip LC is mounted by the so-called face down mounting method (flip chip connection method) so that the front surface $3a$ of the logic chip LC faces to the upper surface $2a$ of the wiring substrate 20. Further, by the present step, the logic chip LC and the wiring substrate 20 are electrically connected with each other. Particularly, the plurality of front surface electrodes $3ap$ formed on the front surface $3a$ of the logic chip LC and the plurality of bonding leads $2f$ formed on the upper surface $2a$ of the wiring substrate 20 are electrically connected with each other via the bumps 8 (the conductor pillars $8b$ and the solder materials $8a$ shown in FIG. 18), respectively.

In the present step, first, over the chip mounting region $2p1$ of the wiring substrate 20, there is arranged the logic chip LC (semiconductor chip 3). The bumps 8 are formed on the front surface $3a$ side of the logic chip LC. On the other hand, at the junction part of the bonding lead $2f$ formed on the upper surface $2a$ of the wiring substrate 20, there is formed a solder layer (not shown) which is a bonding material for ensuring an electrical connection with the bumps 8 shown in FIG. 8.

Then, a heating jig not shown is pressed against the back surface $3b$ side of the logic chip LC. Thus, the logic chip LC is pressed toward the wiring substrate 20. Before performing a heat treatment on the adhesive material NCL1, the adhesive material NCL1 is soft. For this reason, when the logic chip LC is forced by the heating jig, the tips of the plurality of bumps 8 formed on the front surface $3a$ of the logic chip LC come in contact with the bonding region of the bonding lead $2f$ (particularly, a solder layer not shown).

Then, with the logic chip LC pressed against the heating jig not shown, the logic chip LC and the adhesive material NCL1 are heated by the heating jig. At the junction part between the logic chip LC and the wiring substrate 20, the solder material $8a$ (see FIG. 18) and a solder layer not shown over the bonding lead $2f$ are molten, respectively, and are integrated. As a result, as shown in FIG. 8, the bump 8 and the bonding lead $2f$ are electrically connected with each other.

Further, the adhesive material NCL1 is heated, so that the adhesive material NCL1 is cured. This results in the adhesive material NCL1 cured with the logic chip LC partially embedded therein. Further, the back surface electrode 3bp of the logic chip LC is exposed from the cured adhesive material NCL1.

<Second Adhesive Material Arrangement Step>

Figure 22:
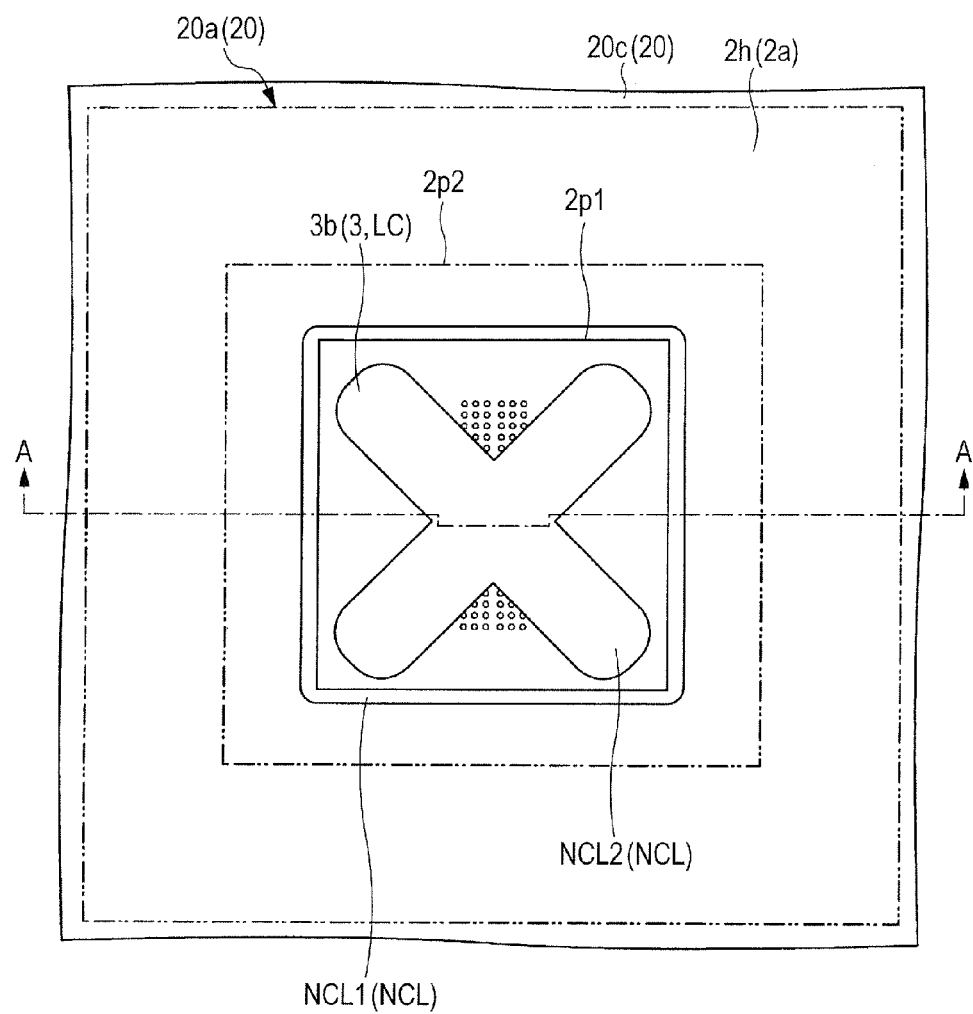
FIG. 22 is an enlarged plan view showing the state in which an adhesive material is arranged at the back surface and its periphery of the semiconductor chip shown in FIG. 18.
Figure 23:
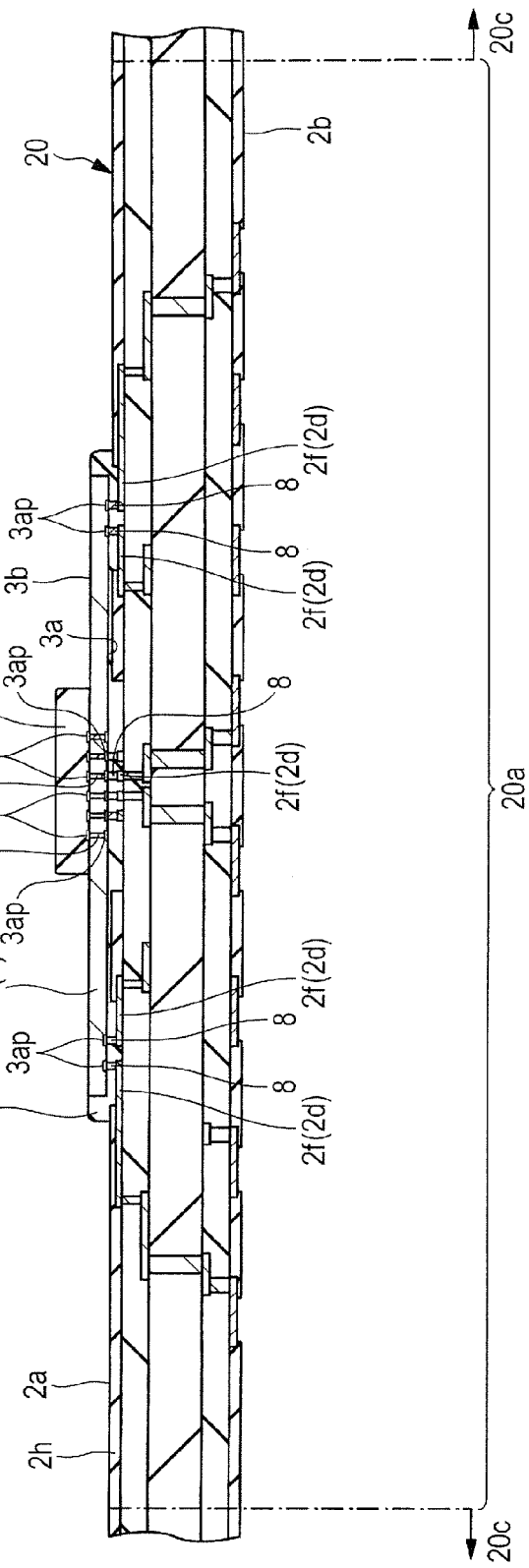
FIG. 23 is an enlarged cross sectional view along line A-A of FIG. 22.

Then, in a second adhesive material arrangement step shown in FIG. 15, as shown in FIG. 22, over the back surface 3b of the logic chip LC (semiconductor chip 3), there is arranged an adhesive material NCL2. FIG. 22 is an enlarged plan view showing the state in which an adhesive material is arranged at the back surface and its periphery of the semiconductor chip shown in FIG. 18; and FIG. 23 is an enlarged cross sectional view along line A-A of FIG. 22.

As shown in FIG. 8, for the semiconductor device 1 of the present embodiment, of a plurality of semiconductor chips 3 to be stacked, the logic chip LC to be mounted at the lowermost stage (e.g., the first stage), and the memory chip MC0 to be mounted at the second stage counted from the lower stage are both mounted by the face down mounting method (flip chip connection method). For this reason, as described in connection with the first adhesive material arrangement step, the first coating method is preferably applied in being capable of shortening the treatment time for one device formation part 20a (see FIGS. 22 and 23), and improving the manufacturing efficiency.

Further, the adhesive material NCL2 for use in the first coating method is, as described above, formed of an insulation (non-conductive) material (e.g., resin material). Further, the adhesive material NCL2 is formed of a resin material which becomes harder (is increased in hardness) by being applied with an energy, and, in the present embodiment, includes, for example, a thermosetting resin. Further, the adhesive material NCL2 before curing is softer than the conductor pillar 8b shown in FIG. 18, and can be deformed by pressing the logic chip LC thereagainst.

Further, the adhesive materials NCL2 before curing are largely classified into a paste-like resin (insulation material paste) called NCP, and a resin (insulation material film) previously formed in a film called NCF according to the difference in handling method. As the adhesive material NCL2 for use in the present step, there can be used any one of NCP and NCF. In the example shown in FIGS. 22 and 23, a NCP is discharged from a nozzle 33 (see FIG. 23), and the adhesive material NCL2 is arranged over the back surface 3b of the logic chip LC.

Incidentally, the present method is common to the post injection method described in connection with the first adhesive material arrangement step in that the paste-like adhesive material NCL2 is discharged from the nozzle 33. However, in the present embodiment, before mounting the memory chip MC0 (memory module MCM) shown in FIG. 7, the adhesive material NCL2 is previously mounted. Therefore, as compared with the post injection method in which a resin is injected using the capillarity, it is possible to largely improve the coating rate of the adhesive material NCL2.

The adhesive material NCL2 has a fixing function of bonding and fixing the memory chip MC0 (see FIG. 7) and the logic chip LC (see FIG. 7) in the second chip mounting step shown in FIG. 15. Further, the adhesive material NCL2 has a sealing function of sealing, and thereby protecting the junction part between the memory chip MC0 and the logic chip LC. Incidentally, the sealing function includes a stress relaxation function of dispersing and relaxing the stress to be transmitted to the junction part between the memory chip MC0 and the logic chip LC, and thereby protecting the junction part.

From the viewpoint of satisfying the sealing function, it is essential only that the adhesive material NCL2 is arranged in such a manner as to surround the periphery of the junction part between the memory chip MC0 and the logic chip LC. For this reason, when at least the memory chip MC0 is mounted, it is essential only that the plurality of bumps 8 shown in FIG. 8 are sealed by the adhesive material NCL2.

<Second Chip Provision Step>

Further, in the second chip provision step shown in FIG. 15, there is provided a memory module MCM of memory chips MC0, MC1, MC2, and MC3 shown in FIG. 7. As a modified example with respect to the present embodiment, over the logic chip LC, there may be successively stacked the memory chips MC0, MC1, MC2, and MC3. However, in the present embodiment, a description will be given to an embodiment in which the memory chips MC0, MC1, MC2, and MC3 are previously stacked, thereby to form a memory module (memory chip lamination or semiconductor chip lamination) MCM shown in FIG. 25. As described below, when the memory module MCM of the memory chips MC0, MC1, MC2, and MC3 is formed, for example, the step can be performed independently from other steps at a different place from those for other steps than the second chip provision step shown in FIG. 15. For example, the memory module MCM can also be provided as a commercially available component. For this reason, advantageously, the assembly step shown in FIG. 15 can be simplified, thereby to improve the manufacturing efficiency as a whole.

Figure 24:
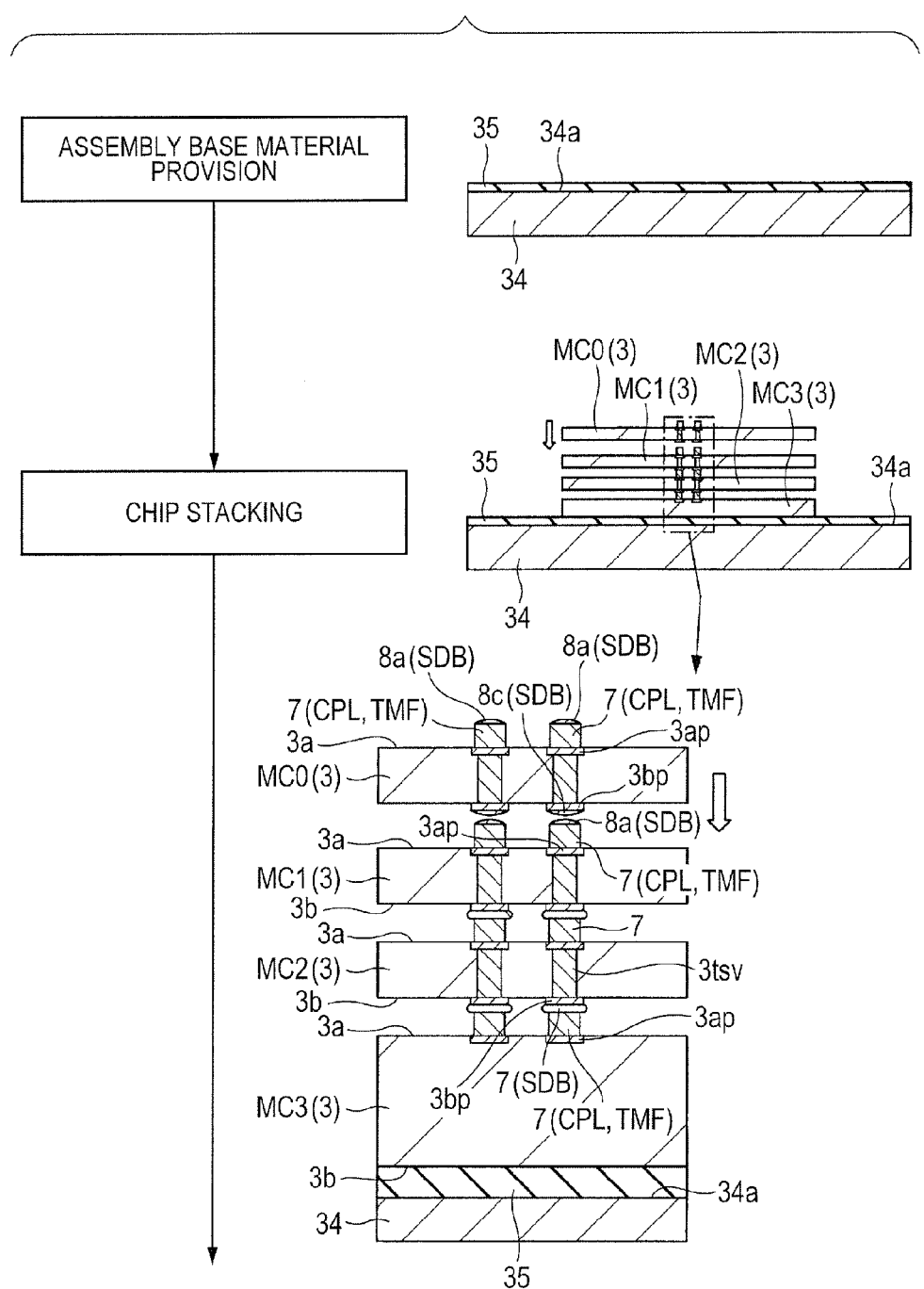
FIG. 24 is an explanatory view schematically showing the outline of an assembly step of the lamination of memory chips shown in FIG. 7.
Figure 25:
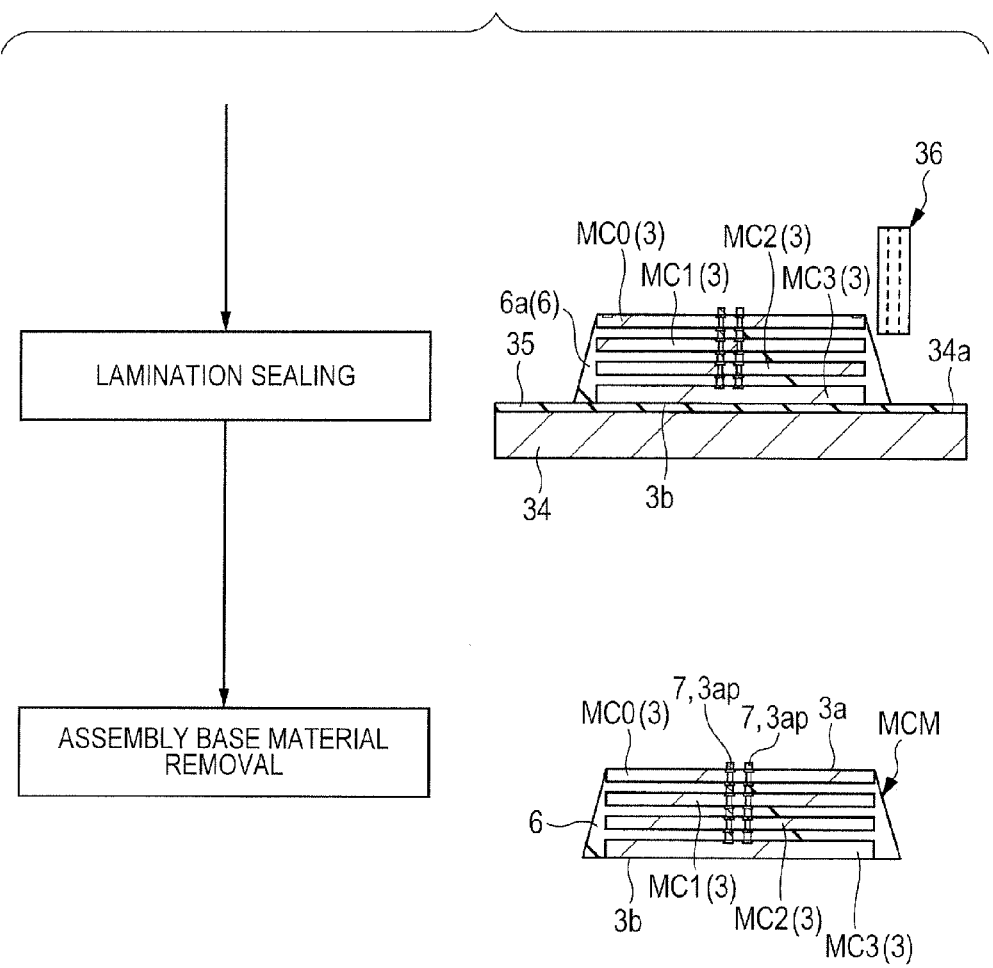
FIG. 25 is an explanatory view schematically showing the outline of an assembly step of the lamination of memory chips following FIG. 24.

FIG. 24 is an explanatory view schematically showing the outline of an assembly step of the lamination of memory chips shown in FIG. 7. Whereas, FIG. 25 is an explanatory view schematically showing the outline of an assembly step of the lamination of memory chips following FIG. 24. Incidentally, as each manufacturing method of the plurality of memory chips MC0, MC1, MC2, and MC3 shown in FIGS. 24 and 25, the manufacturing method of the semiconductor chip described by reference to FIGS. 18 and 19 is applicable for manufacturing, and hence will not be described.

First, for the assembly base material provision step, there is provided a base material for assembling the memory module MCM shown in FIG. 25 (assembly base material) 34. The base material 34 has an assembly surface 34a for stacking a plurality of memory chips MC0, MC1, MC2, and MC3 thereover. At the assembly surface 34a, there is provided an adhesive layer 35.

Then, as the chip stacking step, the memory chips MC0, MC1, MC2, and MC3 are stacked over the assembly surface 34a of the base material 34. In the example shown in FIG. 24, the memory chips MC3, MC2, MC1, and MC0 are stacked in this order so that the back surface 3b of each semiconductor chip 3 to be stacked faces to the assembly surface 34a of the base material 34. The back surface electrode 3bp of the semiconductor chip 3 on the upper stage side and the front surface electrode 3ap of the semiconductor chip 3 on the lower stage side are bonded by, for example, the inter-chip connection members 7. Particularly, the solder material 8a bonded at the tip part of the metal pillar CPL bonded to the front surface electrode 3ap via the metal film TMF, and the solder material 8c formed on the back surface electrode 3bp of the semiconductor chip 3 on the upper stage side are heated, and are integrated, thereby to form the solder material SDB. Thus, an electrical connection is established between the plurality of stacked semiconductor chips 3.

In the present step, as described by reference to FIGS. 9 and. 10, of the plurality of inter-chip connection members 7 for electrically connecting the memory chips MC0, MC1, MC2, and MC3 to be stacked, for the inter-chip connection members 72 to which the adjacent solder material integrated structure is applied, an electrical connection is established between the semiconductor chips 3 so that the adjacent solder materials SDB2 are in contact with each other, and are separated from other solder materials SDB. In the present embodiment, for each of a plurality of transmission paths for transmitting a data signal DQ, a data strobe signal DQS, and a clock signal CK shown in FIG. 3, the adjacent solder material integrated structure is applied to the inter-chip connection member 7.

Then, in a lamination sealing step shown in FIG. 25, a resin (underfill resin) is supplied between the plurality of stacked semiconductor chips 3, thereby to form a sealing body (chip lamination sealing body or chip lamination resin body) 6. The sealing body 6 is formed by the post injection method described in connection with the first adhesive material arrangement step. Namely, previously, a plurality of semiconductor chips 3 are stacked. Then, an underfill resin 6a is supplied from a nozzle 36, and is filled between the plurality of stacked semiconductor chips 3. The underfill resin 6a is lower in viscosity than the sealing resin for use in the sealing step shown in FIG. 15, and can be filled between the plurality of semiconductor chips 3 using the capillarity. Then, the underfill resin 6a filled between the semiconductor chips 3 is cured, resulting in the sealing body 6.

The method for forming the sealing body 6 by the post injection method is more excellent in gap filling characteristic than a so-called transfer mold method, and hence is effectively applicable to the case where the gap between the stacked semiconductor chips 3 is narrow. Whereas, as shown in FIG. 25, when the gap to be filled with the underfill resin 6a is formed in a multistage shape, the plurality of gaps can be filled with the underfill resin 6a in one step. For this reason, the processing time can be shortened as a whole.

Then, in an assembly base material removing step, the base material 34 and the adhesive layer 35 are peeled and removed from the back surface 3b of the memory chip MC3. As the method for removing the base material 34 and the adhesive layer 35, for example, there is applicable a method in which the resin component (e.g., UV curable resin) included in the adhesive layer 35 is cured. The steps up to this point result in a memory module MCM in which the plurality of memory chips MC0, MC1, MC2, and MC3 are stacked, and the connection parts between respective memory chips MC0, MC1, MC2, and MC3 are sealed by the sealing body 6. The memory module MCM can be regarded as one memory chip having the front surface 3a (the front surface 3a of the memory chip MC0) including the plurality of front surface electrodes 3ap formed thereover, and the back surface 3b (the back surface 3b of the memory chip MC3) situated opposite to the front surface 3a.

<Second Chip Mounting Step>

Figure 26:
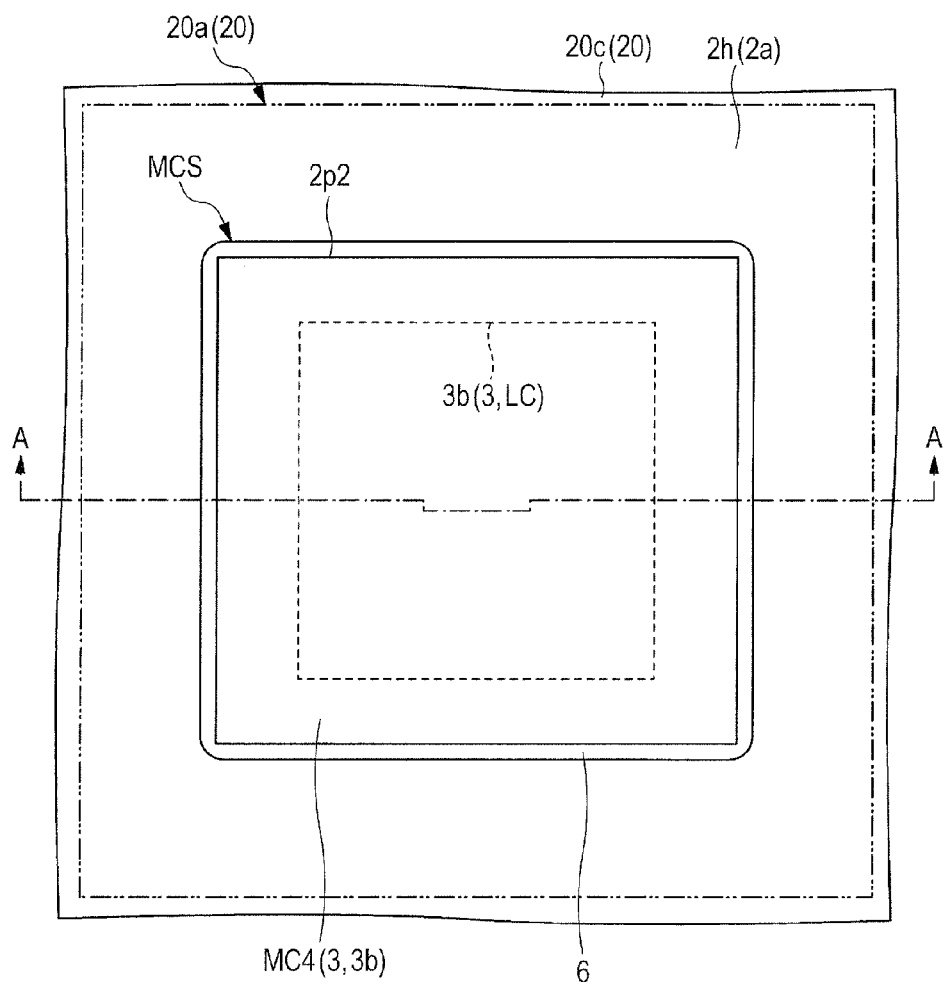
FIG. 26 is an enlarged plan view showing the state in which the lamination is mounted over the back surface of the logic chip shown in FIG. 22.
Figure 27:
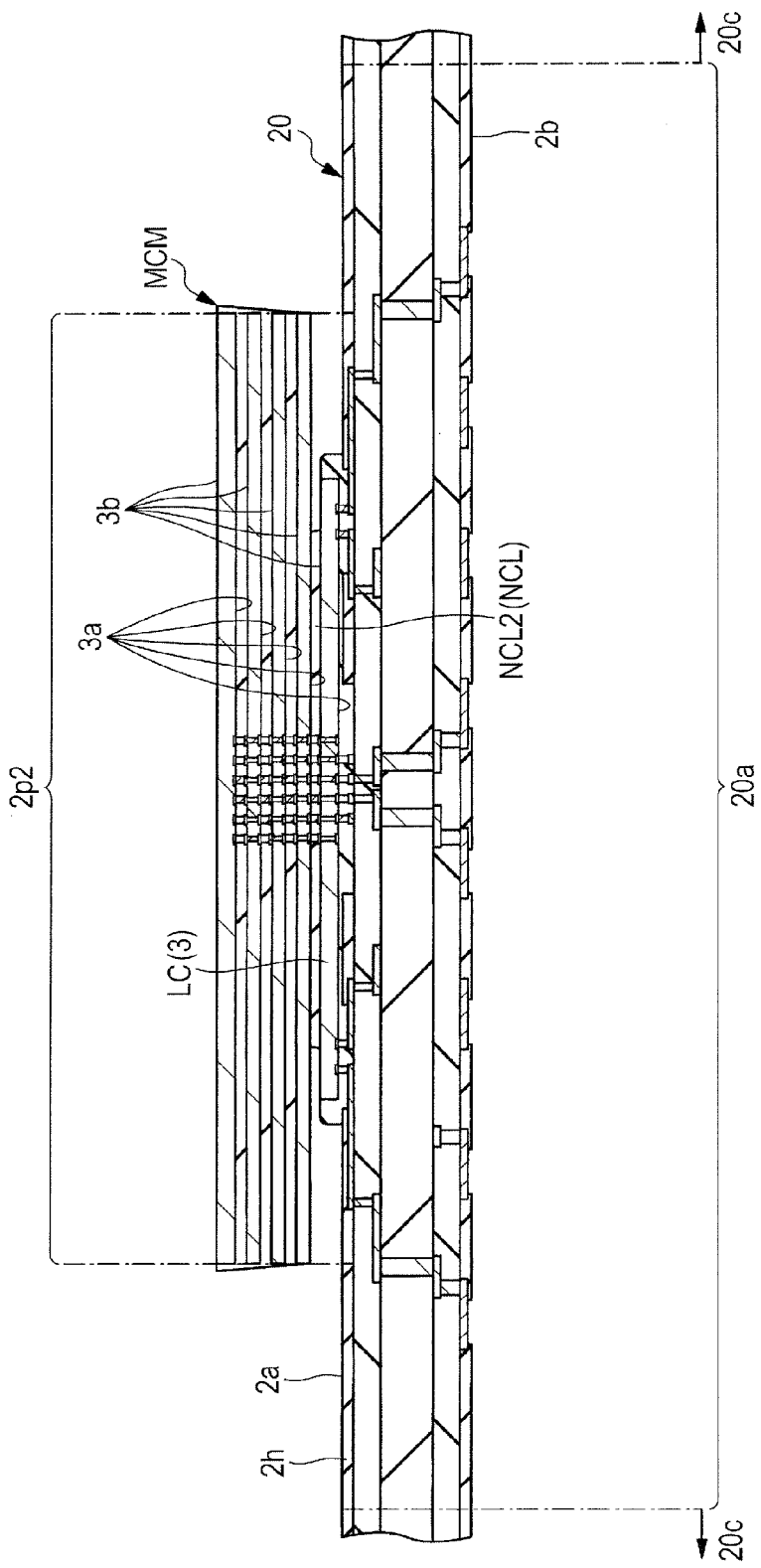
FIG. 27 is an enlarged cross sectional view along line A-A of FIG. 26.

Then, in the second chip mounting step shown in FIG. 15, as shown in FIGS. 26 and 27, the memory module MCM is mounted over the back surface 3b of the logic chip LC. FIG. 26 is an enlarged plan view showing the state in which the lamination is mounted over the back surface of the logic chip shown in FIG. 22. Whereas, FIG. 27 is an enlarged cross sectional view along line A-A of FIG. 26.

In the present step, as shown in FIG. 27, the memory module MCM is mounted by the so-called face down mounting method (flip chip connection method) so that the front surface 3a (the front surface 3a of the memory chip MC0 shown in FIG. 8) of the memory module MCM faces to the back surface 3b of the logic chip LC. Further, by the present step, the plurality of memory chips MC0, MC1, MC2, and MC3 and the logic chip LC are electrically connected with each other. Particularly, as shown in FIG. 8, the plurality of front surface electrodes 3ap formed on the front surface 3a of the memory module MCM (memory chip MC0) and the plurality of back surface electrodes 3bp formed on the back surface 3b of the logic chip LC are electrically connected with each other via the inter-chip connection members 7, respectively.

In the present step, the logic chip LC and the memory module MCM are aligned so that the plurality of back surface electrodes 3bp (see FIG. 8) of the logic chip LC and the plurality of inter-chip connection members 7 (see FIG. 8) formed on the front surface 3a of the memory module MCM are arranged opposite to each other.

Then, a heating jig not shown in pressed against the back surface 3b side of the memory module MCM, so that the memory module MCM is pressed toward the logic chip LC. At this step, the adhesive material NCL2 is in a soft state. Accordingly, when the memory module MCM is forced thereinto, the plurality of inter-chip connection members 7 (see FIG. 8) formed on the front surface 3a of the memory module MCM penetrate through the adhesive material NCL2, and come in contact with the back surface electrodes 3bp (see FIG. 8) of the logic chip LC. Further, the adhesive material NCL2 applied between the memory module MCM and the logic chip LC extends along the back surface 3b of the logic chip LC.

Then, by the heating jig (heat source) not shown, the memory module MCM and the adhesive material NCL2 are heated. At the junction part between the memory module MCM and the logic chip LC, the solder materials 8a of the inter-chip connection members 7 (see FIG. 24) are molten, respectively, and are bonded with the back surface electrodes 3bp of the logic chip LC, respectively. In other words, the memory module MCM is heated by the heating jig (heat source). As a result, the plurality of front surface electrodes 3ap of the memory module MCM (see FIG. 8) and the plurality of back surface electrodes 3bp of the logic chip LC (see FIG. 8) are electrically connected with each other via the plurality of inter-chip connection members 7 (see FIG. 8), respectively. Further, by heating the adhesive material NCL2, the adhesive material NCL2 is cured.

In the present step, as described by reference to FIGS. 9 and. 10, of the plurality of inter-chip connection members 7 for electrically connecting the back surface electrodes 3bp of the logic chip LC with the front surface electrodes 3ap of the memory chip MC0, for the inter-chip connection members 72 to which the adjacent solder material integrated structure is applied, an electrical connection is established between the semiconductor chips 3 so that the adjacent solder materials SDB2 are in contact with each other, and are separated from other solder materials SDB. In the present embodiment, for each of a plurality of transmission paths for transmitting a data signal DQ, a data strobe signal DQS, and a clock signal CK shown in FIG. 3, the adjacent solder material integrated structure is applied to the inter-chip connection member 7.

<Sealing Step>

Figure 28:
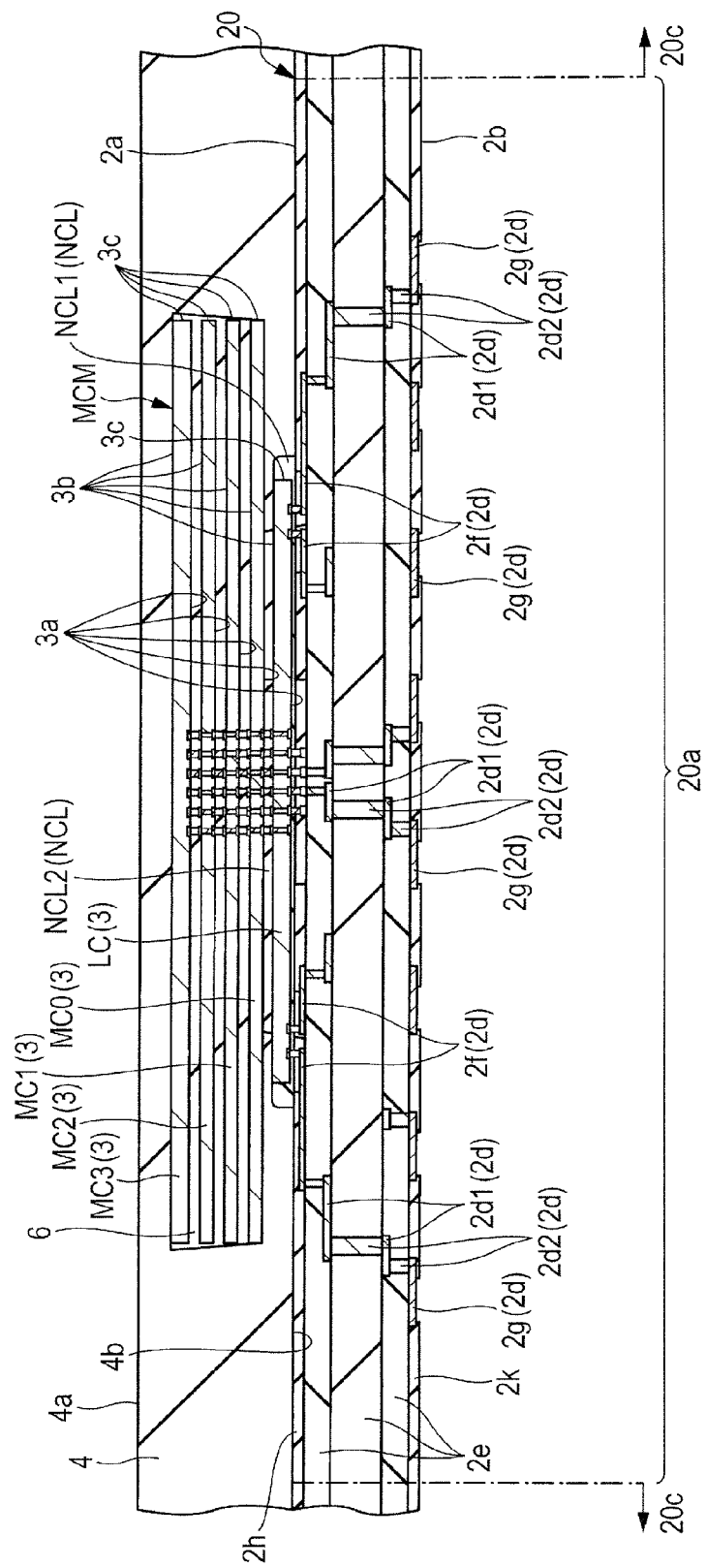
FIG. 28 is an enlarged cross sectional view showing the state in which a sealing body is formed over the wiring substrate shown in FIG. 27, thereby to seal a plurality of stacked semiconductor chips.

Then, in the sealing step shown in FIG. 15, as shown in FIG. 28, the upper surface 2a of the wiring substrate 20, the logic chip LC, and the memory module MCM of the plurality of memory chips MC0, MC1, MC2, and MC3 are sealed by a resin, thereby to form a sealing body 4. FIG. 28 is an enlarged cross sectional view showing the state in which a sealing body is formed over the wiring substrate shown in FIG. 27, thereby to seal a plurality of stacked semiconductor chips.

In the present embodiment, there is formed the sealing body 4 for sealing a plurality of device formation parts 20a (see FIG. 16) in one step. The formation method of such a sealing body 4 is called a block molding method. The semiconductor package manufactured by the block molding method is called a MAP (Multi Array Package) type semiconductor device. With the block molding method, the gap between respective device formation parts 20a can be made smaller, resulting in a larger effective area at one wiring substrate 20. In other words, the number of products obtainable from one wiring substrate 20 increases. Thus, by increasing the effective area at one wiring substrate 20, it is possible to make the manufacturing step efficient.

Further, in the present embodiment, the formation is achieved by a so-called transfer mold method in which a heated and softened resin is injected into a molding die not shown, and formed, and then, the resin is thermally cured. The sealing body 4 formed by the transfer mold method is higher in durability than that obtained by curing a liquid resin, as with, for example, the sealing body 6 for sealing the memory module MCM shown in FIG. 28, and hence is more preferable as a protective member. Further, by mixing filler particles such as silica (silicon dioxide; $SiO_2$) particles in a thermosetting resin, it is possible to improve the functions (e.g., the resistance to warpage deformation) of the sealing body 4.

Incidentally, in the present embodiment, the junction parts (electrical connection parts) between the plurality of stacked semiconductor chips 3 are sealed by the adhesive materials NCL1 and NCL2, and the sealing body 6. Therefore, as a modified example, an embodiment in which no sealing body 4 is formed is applicable. In this case, the sealing step can be omitted.

<Ball Mounting Step>

Figure 29:
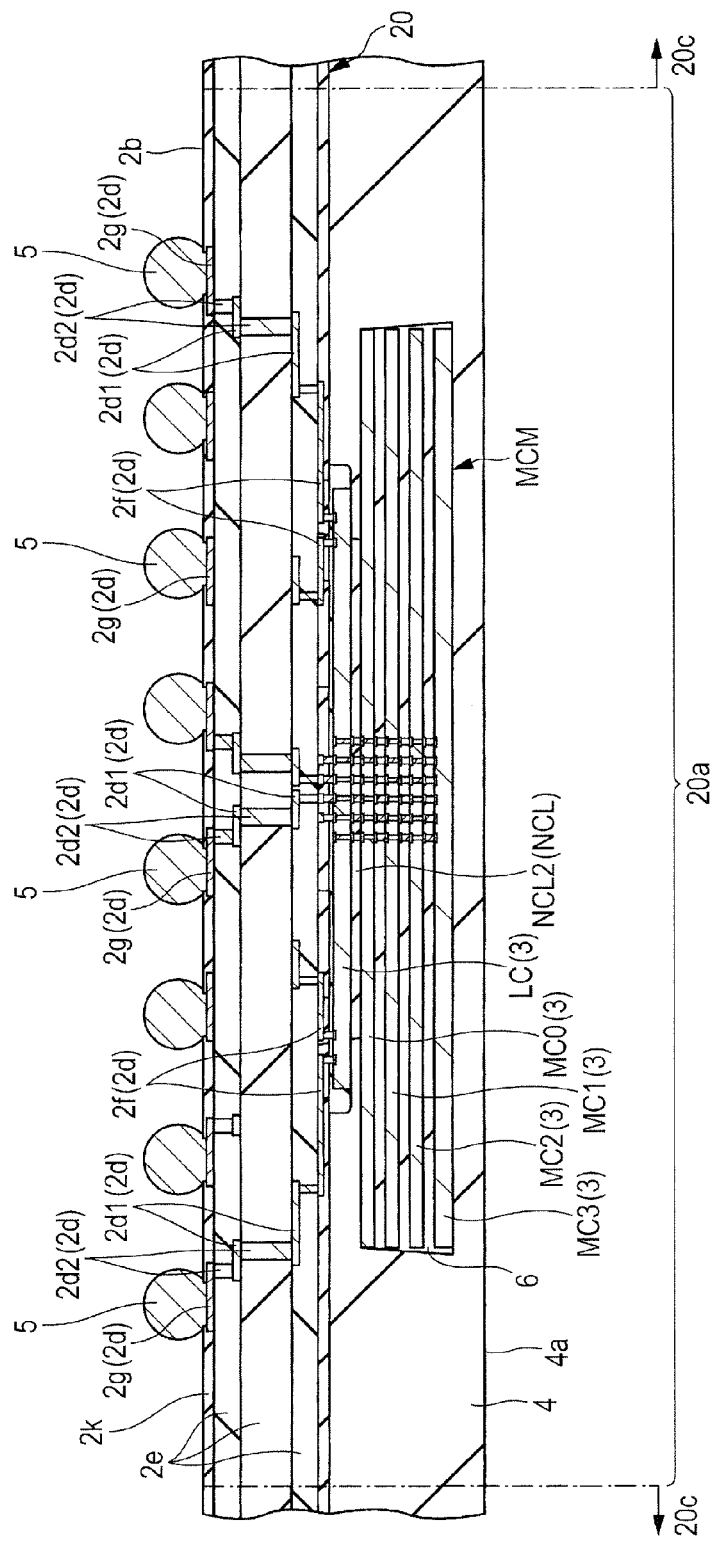
FIG. 29 is an enlarged cross sectional view showing the state in which solder balls are bonded over a plurality of lands of the wiring substrate shown in FIG. 28.

Then, in a ball mounting step shown in FIG. 15, as shown in FIG. 29, to a plurality of lands 2g formed on the lower surface 2b of the wiring substrate 20, there are bonded a plurality of solder balls 5 serving as external terminals, respectively. FIG. 29 is an enlarged cross sectional view showing the state in which solder balls are bonded over a plurality of lands of the wiring substrate shown in FIG. 28.

In the present step, as shown in FIG. 29, the wiring substrate 20 is turned upside down. Then, over the plurality of lands 2g exposed at the lower surface 2b of the wiring substrate 20, there are arranged the solder balls 5, respectively. Then, heating is performed, thereby to bond the plurality of solder balls 5 and the lands 2g, respectively. By the present step, the plurality of solder balls 5 are electrically connected with the plurality of semiconductor chips 3 (the logic chip LC and the memory chips MC0, MC1, MC2, and MC3) via the wiring substrate 20, respectively. However, the technology described in the present embodiment is not applied only to a so-called BGA (Ball Grid Array) type semiconductor device in which the solder balls 5 are bonded in an array. For example, as a modified example with respect to the present embodiment, the technology is applicable to a so-called LGA (Land Grid Array) type semiconductor device to be shipped with no solder ball 5 formed therein, and the lands 2g exposed, or with a solder paste coated to the lands 2g more thinly than the solder ball 5. In the case of the LGA type semiconductor device, the ball mounting step can be omitted.

<Singulation Step>

Figure 30:
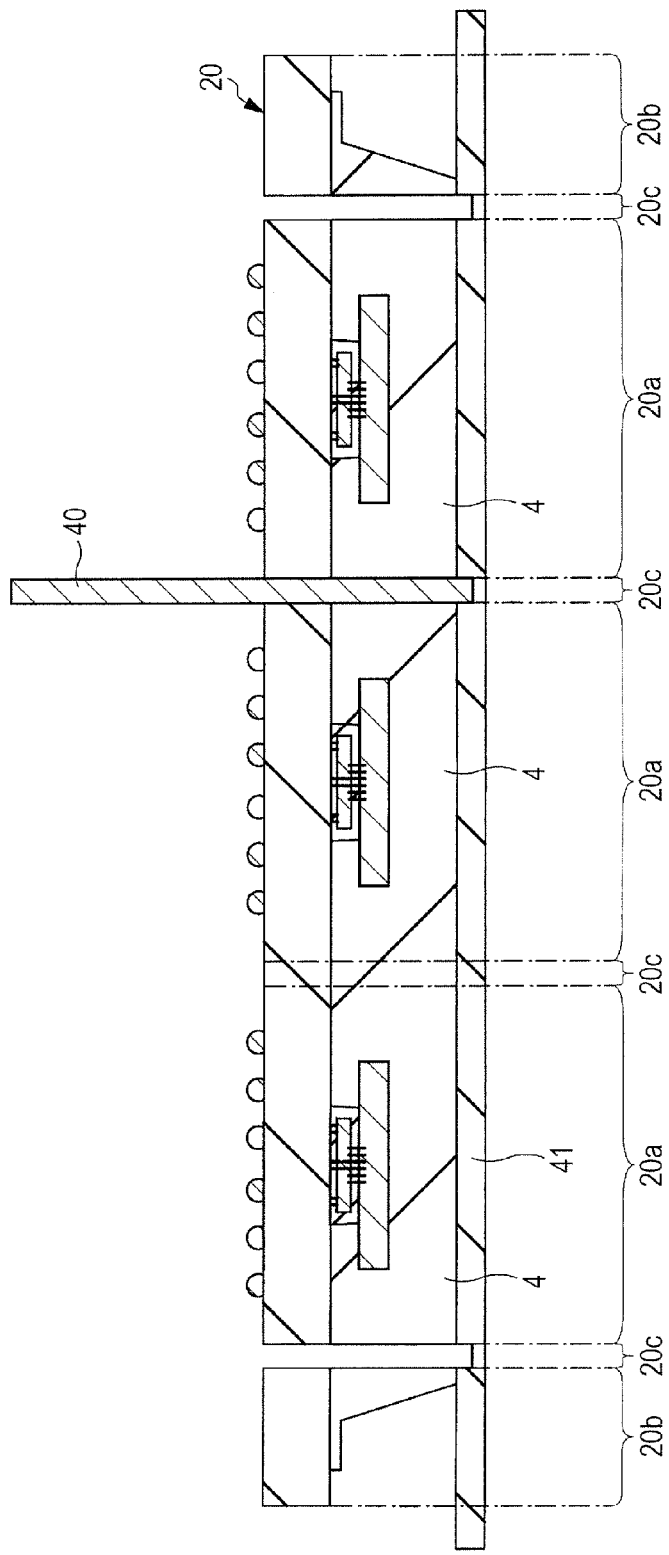
FIG. 30 is a cross sectional view showing the state in which the multi-piece wiring substrate shown in FIG. 29 is singulated.

Then, in a singulation step shown in FIG. 15, as shown in FIG. 30, the wiring substrate 20 is divided into respective device formation parts 20a. FIG. 30 is a cross sectional view showing the state in which the multi-piece wiring substrate shown in FIG. 29 is singulated.

In the present step, as shown in FIG. 30, the wiring substrate 20 and the sealing body 4 are cut along the dicing lines (dicing regions) 20c, resulting in a plurality of singulated semiconductor devices 1 (see FIG. 7). The cutting method has no particular restriction. However, in the example shown in FIG. 30, there is shown the following embodiment: using a dicing blade (rotary blade) 40, the wiring substrate 20 and the sealing body 4 bonded and fixed to a tape material (dicing tape) 41 are subjected to cutting from the lower surface 2b side of the wiring substrate 20 to be cut. However, the technology described in the present embodiment is not applied only to the case using the wiring substrate 20 which is a multi-piece substrate including a plurality of device formation parts 20a. For example, the technology is applicable to a semiconductor device in which a plurality of semiconductor chips 3 are stacked over the wiring substrate 2 (see FIG. 7) equivalent to one semiconductor device. In this case, the singulation step can be omitted.

Respective steps up to this point result in the semiconductor device 1 described by reference to FIGS. 1 to 8. Then, necessary inspections and tests such as a visual inspection and an electrical test are performed. Then, the products are shipped, or are mounted over a mounting substrate not shown.

Modified Example

Up to this point, the invention completed by the present inventors was specifically described by way of embodiments. However, it is naturally understood that the present invention is not limited to the embodiments, and may be variously changed within the scope not departing from the gist.

Modified Example 1

Figure 31:
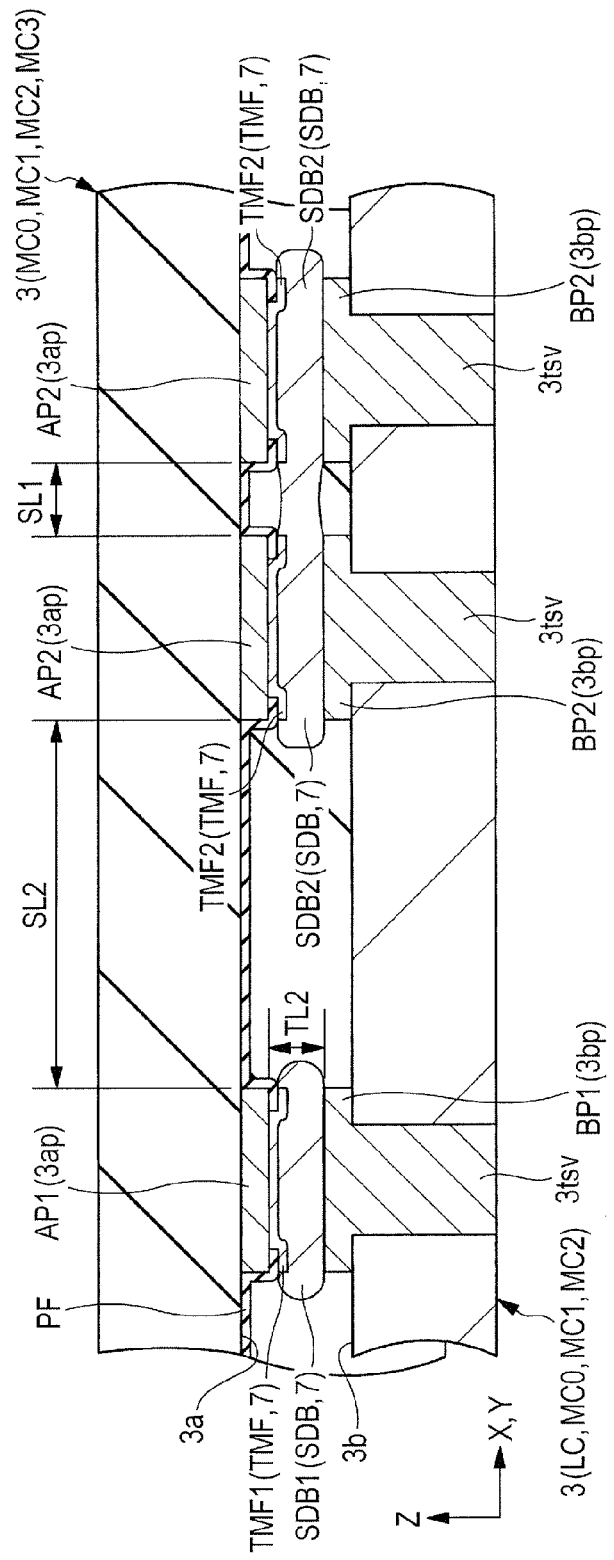
FIG. 31 is an enlarged cross sectional view showing a modified example with respect to FIG. 9.

For example, in the embodiments, as described by reference to FIG. 9, a description has been given to the embodiment in which as the structure of the inter-chip connection member 7 for establishing an electrical connection between stacked semiconductor chips 3, the metal pillar CPL such as a Cu pillar is interposed. However, as a modified example, for example, as shown in FIG. 31, the following structure can be adopted: a metal pillar CPL (see FIG. 9) is not arranged between the solder material SDB and the front surface electrode 3ap. Namely, the solder material SDB may be bonded directly to the front surface electrode AP1. Incidentally, when the connectivity between the solder material SDB and the front surface electrode 3ap is desired to be improved, preferably, as shown in FIG. 31 (an enlarged cross sectional view showing a modified example with respect to FIG. 9), at the exposed surface of the front surface electrode 3ap, there is formed a metal film TMF, and the solder material SDB is connected with the front surface electrode 3ap via the metal film TMF. In the example shown in FIG. 31, the metal film TMF is a lamination film of a nickel (Ni) film, a palladium (Pd) film, and a titanium (Ti) film.

In the case of the modified example shown in FIG. 31, as shown in FIG. 9, no metal pillar CPL is provided, which can further reduce the distance between the semiconductor chips 3. In this case, the distance TL2 between the front surface electrode 3ap and the back surface electrode 3bp of the semiconductor chip 3 on the upper stage side is comparable to, or slightly smaller than the distance SL1, and is for example, about 3 μm to 5 μm.

Further, although not shown, the peripheral structures of the inter-chip connection member 7 include various modified examples. For example, the exposed surface of the insulation film PF shown in FIGS. 9 and 31 can also be further covered with an organic insulation film of polyimide or the like.

Modified Example 2

Further, in the embodiments, a description has been given the following embodiment: of the plurality of transmission paths shown in FIG. 3, to the data signal DQ transmission path, the data mask signal DM transmission path, and the clock signal CK transmission path, there is applied the adjacent solder material integrated structure in which adjacent solder materials SDB are in contact with each other; and to other transmission paths, there is applied the solder material separated structure. However, the transmission paths to which the adjacent solder material integrated structure is applied include various modified examples other than those described above. For example, when a data strobe signal is operated by the DDR method shown in FIG. 34, the ratio of the pulse width to the clock signal CK is 1 or less. Further, the data strobe signal DQS is relatively higher in input frequency. For this reason, the frequency of the data strobe signal is equivalent to the frequency of the clock signal CK or the data signal DQ. Therefore, for the order of priority for application of the solder material integrated structure, the transmission paths for the data signal DQ, the data mask signal DM, and the clock signal CK each have a particularly high order of priority. The transmission path for the data strobe signal DQS has the second highest order of priority after those described above. Further, when a variation in impedance is required to be reduced even at a frequency of, for example, about 100 MHz, the adjacent solder material integrated structure is applicable to, for example, the transmission path to be connected with a command control circuit CMDC.

Further, as the method for reducing the noise effect of the signal transmission path, there is the following technology: a signal current is passed through a pair of signal transmission paths (differential pair) through which signals having different phases (differential signals) flow, thereby to define the signal level based on the potential difference between the pair of signal transmission paths. When the signal transmission path is differentiated, the effect by the variation in impedance in the signal transmission path can be reduced. Therefore, for example, when the clock signal CK shown in FIG. 3 is set as a differential signal, the solder material separated structure is also applicable to the differentiated transmission path.

However, even for the differentiated signal transmission paths, the effect by a variation in impedance can be further reduced by applying the adjacent solder material integrated structure thereto.

Modified Example 3

Further, in the embodiments, as the example of the adjacent solder material integrated structure, a description has been given to the example in which two solder materials SDB arranged adjacent to each other are integrated with each other. However, as a modified example, three or more solder materials SDB may be integrated with each other. The variation in impedance can be more reduced with an increase in number of the solder materials SDB to be integrated.

Figure 32:
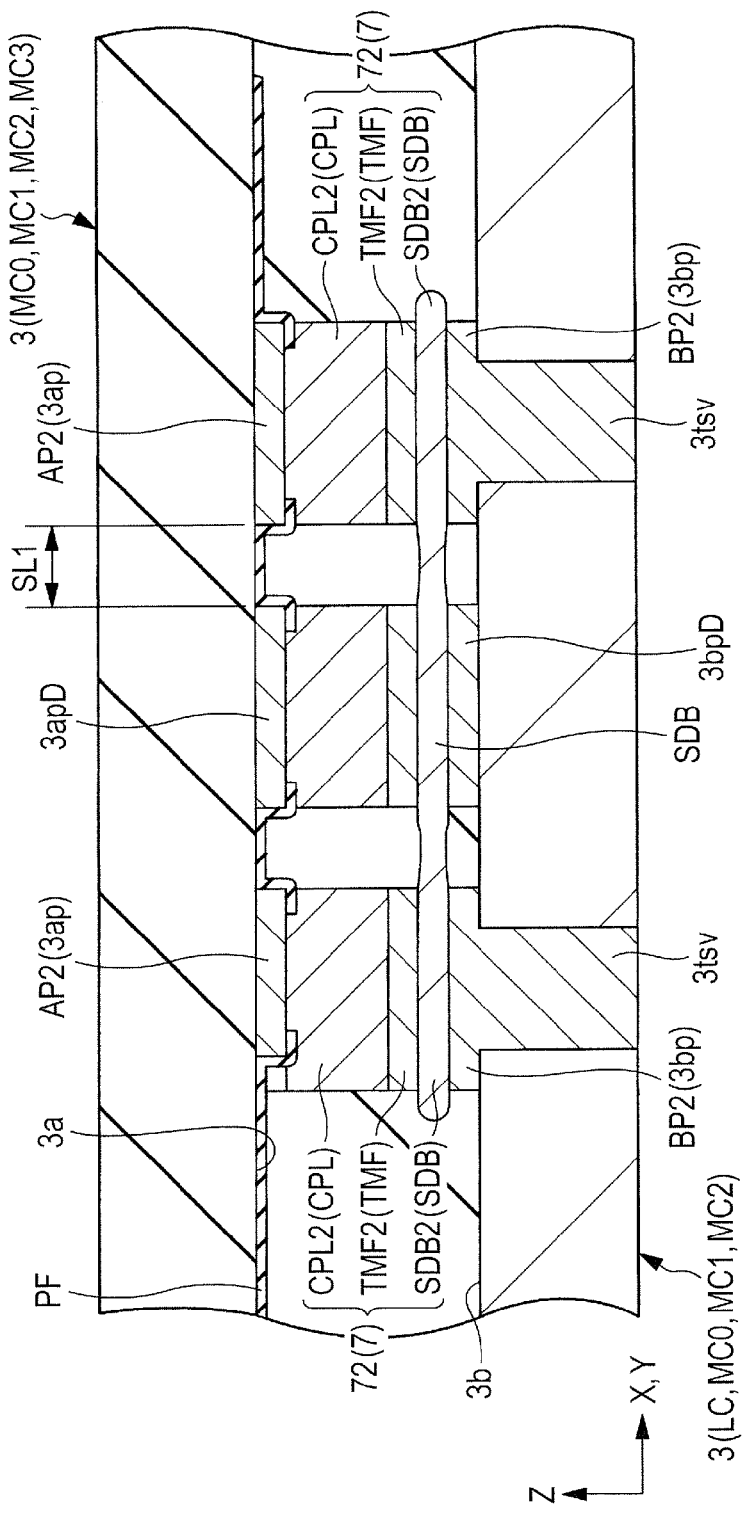
FIG. 32 is an enlarged cross sectional view showing another modified example with respect to FIG. 9.

Whereas, when three or more solder materials SDB are integrated with each other, as in the modified example, shown in, for example, FIG. 32, some of the three or more solder materials SDB can be connected with dummy front surface electrodes 3apD and dummy back surface electrodes 3bpD not functioning as signal transmission paths. Herein, the dummy electrode is an electrode for forming the solder material SDB, and is formed similarly in constituent materials and shape to peripheral electrodes, but is a circuit not directly connected with the circuits included in the semiconductor chip 3. However, the dummy electrode is electrically connected with the circuit included in the semiconductor chip 3 via the solder material SDB. In other words, the dummy electrode is a conductive member electrically connected with the circuit included in the semiconductor chip 3, but not functioning as a signal transmission path (not included in the signal transmission path). In other words, the dummy electrode is a floating conductive member not directly connected with the circuit included in the semiconductor chip 3 (including the case of indirect connection via the solder material SDB).

In the case of the embodiment in which a dummy electrode is provided as with the modified example shown in FIG. 32, the arrangement space for the dummy electrode is ensured, and hence the configuration is correspondingly less suitable for the reduction of the planar size of the semiconductor chip. However, when the dummy electrode is provided, the internal wirings and the like in the semiconductor chip 3 are not required to be formed. For this reason, it is possible to increase the surface area of the solder material SDB, and to ensure the routing space of wirings in the semiconductor chip 3. In other words, the modified example shown in FIG. 32 is more preferable than the embodiments in terms of the ease of circuit design.

Modified Example 4

Further, in the embodiments, as the method for mounting the memory chip MC0 (in other words, the memory module MCM) over the logic chip LC, a description has been given to the example of the face down mounting method in which the front surface 3a of the memory chip MC0 and the back surface 3b of the logic chip LC are allowed to face to each other. However, as a modified example, mounting may be achieved so that the back surface 3b of the semiconductor chip 3 on the lower stage side faces to the back surface 3b of the semiconductor chip 3 on the upper stage side. In this case, the back surface electrode 3bp of the semiconductor chip 3 on the lower stage side (e.g., logic chip LC) and the back surface electrode 3bp of the semiconductor chip 3 on the upper stage side (e.g., memory chip MC0) are electrically connected with each other via the inter-chip connection member 7. Further, the front surface 3a of the memory chip MC3 mounted at the uppermost stage of the memory chips MC forming the memory module MCM becomes the upper surface of the memory module MCM. Accordingly, the front surface electrode 3a of the memory chip MC3 is exposed from the sealing body 6.

Modified Example 5

Further, in the embodiments, a description has been given to the embodiment in which the outer size (in other words, the plane area) of the front surface electrode 3ap of the semiconductor chip 3 on the upper stage side is equal to the outer size (in other words, the plane area) of the back surface electrode 3bp of the semiconductor chip 3 on the lower stage side. However, as a modified example, the outer size of any one electrode of the front surface electrode 3ap and the back surface electrode 3bp connected via the inter-chip connection member 7 may be larger than the outer size of the other electrode. For example, in the modified example shown in FIG. 33, the outer size (the plane area) of the back surface electrode 3bp of the semiconductor chip 3 on the lower stage side is larger than the outer size (the plane area) of the front surface electrode 3ap of the semiconductor chip 3 on the upper stage side. The front surface electrode 3ap and the back surface electrode 3bp connected via the inter-chip connection member 7 respectively have different outer sizes. This allows easy alignment between the semiconductor chip 3 on the lower stage side and the semiconductor chip 3 on the upper stage side when a plurality of semiconductor chips 3 are mounted (stacked).

Figure 33:
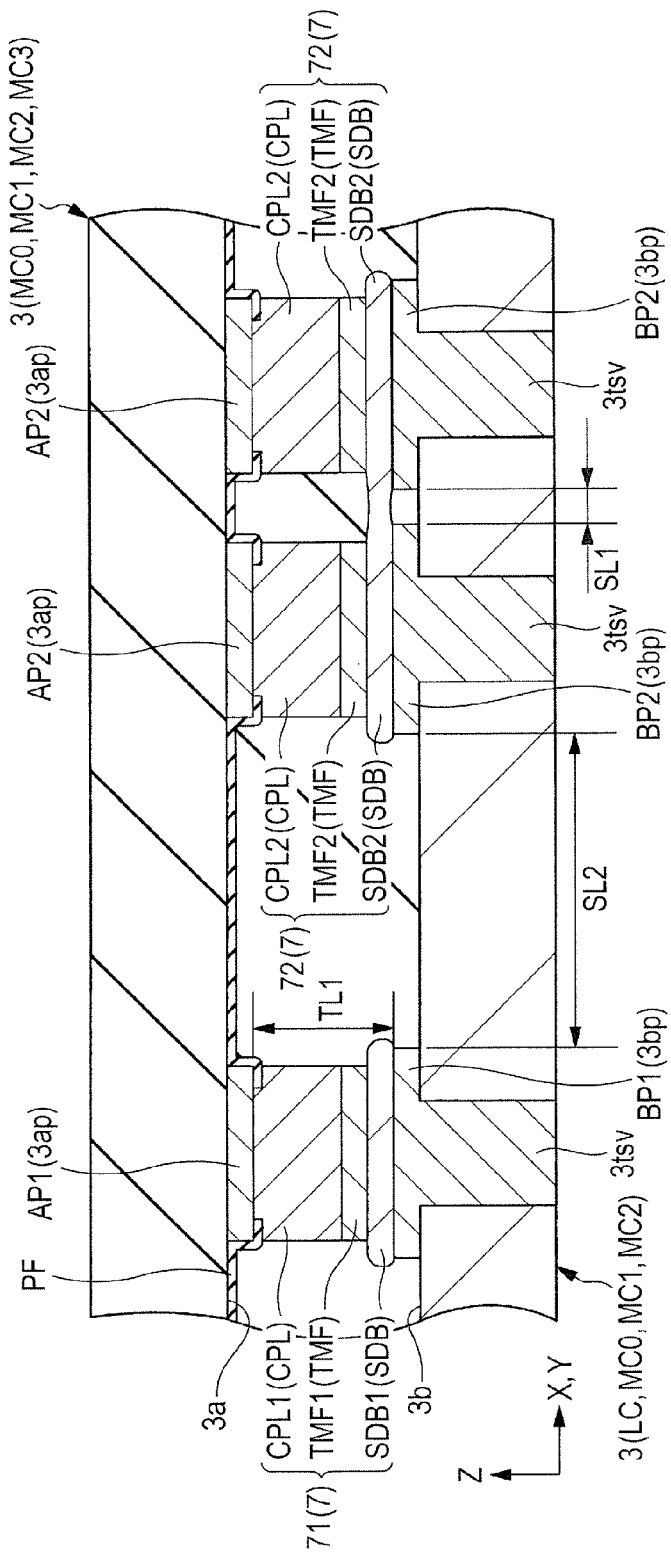
FIG. 33 is an enlarged cross sectional view showing a still other modified example with respect to FIG. 9.

Further, as shown in FIG. 33, when the clearance distance between the adjacent back surface electrodes BP2 and the clearance distance between the adjacent front surface electrodes AP2 are different, the relationship between the distance SL1 and the distance SL2 described in the embodiments is defined based on the electrodes having a relatively shorter distance SL1. Namely, in the example shown in FIG. 33, the distance SL1 between the adjacent back surface electrodes BP2 is smaller than the distance SL2 between the back surface electrode BP1 and the back surface electrode BP2. This facilitates the contact between the solder materials SDB2 to be respectively connected to the adjacent back surface electrodes BP2.

Modified Example 6

Further, modified examples are applicable in combination within the scope not departing from the gist of the technical idea described in the embodiments.

Other than these, a part of the contents described in the embodiments will be described below.

(1) A method for manufacturing a semiconductor device, comprising the steps of:

(a) providing a first semiconductor chip having a first main surface, a plurality of first main surface electrodes formed on the first main surface, a first back surface opposite to the first main surface, and a plurality of first back surface electrodes formed on the first back surface, and electrically connected with the first main surface electrodes, respectively; and (b) mounting a second semiconductor chip having a second main surface, a plurality of second main surface electrodes formed on the second main surface, and a second back surface opposite to the second main surface on the first back surface side of the first semiconductor chip, and electrically connecting the first back surface electrodes and the second main surface electrodes via a plurality of conductive members arranged between the first semiconductor chip and the second semiconductor chip, respectively;

wherein the first back surface electrodes have a first signal electrode for passing therethrough a first signal current with a first pulse width, and a plurality of second signal electrodes for passing therethrough a second signal current with a second pulse width shorter than the first pulse width, wherein the second main surface electrodes have a first signal electrode for passing therethrough the first signal current, and a plurality of second signal electrodes for passing therethrough the second current, wherein the conductive members have a first conductive member for connecting the first signal electrode of the first semiconductor chip with the first signal electrode of the second semiconductor chip, and a plurality of second conductive members for connecting the second signal electrodes of the first semiconductor chip with the second signal electrodes of the second semiconductor chip, and wherein in the step (b), the second semiconductor chip is mounted on the first back surface side of the first semiconductor chip such that the second conductive members are in contact with each other, and are separated from the first conductive member.

What is claimed is:

1. A semiconductor device, comprising:

a first semiconductor chip having a first main surface, a plurality of first main surface electrodes formed on the first main surface, a first back surface opposite to the first main surface, and a plurality of first back surface electrodes formed on the first back surface, and electrically connected with the first main surface electrodes, respectively;

a second semiconductor chip having a second main surface, a plurality of second main surface electrodes formed on the second main surface, and a second back surface opposite to the second main surface, the second semiconductor chip being mounted on the first back surface side of the first semiconductor chip; and a plurality of conductive members arranged between the first semiconductor chip and the second semiconductor chip, and electrically connecting the first back surface electrodes with the second main surface electrodes, respectively, wherein the first back surface electrodes have a first signal electrode for passing therethrough a first signal current with a first pulse width, and a plurality of second signal electrodes for passing therethrough a second signal current with a second pulse width shorter than the first pulse width, wherein the second main surface electrodes have a first signal electrode for passing therethrough the first signal current, and a plurality of second signal electrodes for passing therethrough the second signal current, wherein the conductive members have a first conductive member for connecting the first signal electrode of the first semiconductor chip with the first signal electrode of the second semiconductor chip, and a plurality of second conductive members for connecting the second signal electrodes of the first semiconductor chip with the second signal electrodes of the second semiconductor chip, and wherein the second conductive members are connected with each other, and are separated from the first conductive member.

2. The semiconductor device according to claim 1, wherein the second signal electrodes of the first semiconductor chip are formed in such a manner as to be adjacent to each other at the first back surface of the first semiconductor chip, and wherein a clearance distance between the second signal electrodes of the first semiconductor chip is smaller than a clearance distance between the first signal electrode of the first semiconductor chip and the second signal electrodes of the first semiconductor chip.

3. The semiconductor device according to claim 2,
wherein the first back surface electrodes further include a third signal electrode for passing therethrough a third signal current with a third pulse width longer than the second pulse width,
wherein the second main surface electrodes further include a third signal electrode for passing therethrough the third signal current,
wherein the conductive members further include a third conductive member for connecting the third signal electrode of the first semiconductor chip with the third signal electrode of the second semiconductor chip, and
wherein the third conductive member is separated from the first conductive member and the second conductive member.

4. The semiconductor device according to claim 3,
wherein a clearance distance between the second signal electrodes of the first semiconductor chip is smaller than a clearance distance between the third signal electrode of the first semiconductor chip and the first signal electrode of the first semiconductor chip, and a clearance distance between the third signal electrode of the first semiconductor chip and the second signal electrodes of the first semiconductor chip.

5. The semiconductor device according to claim 1, further comprising a wiring substrate having a chip mounting surface and a mounting surface opposite to the chip mounting surface,
wherein the first semiconductor chip is mounted over the chip mounting surface such that the first main surface faces to the chip mounting surface of the wiring substrate.

6. The semiconductor device according to claim 1,
wherein the conductive members include solder materials, respectively, and
wherein in the second conductive members, the solder materials are in contact with and integrated with each other.

7. The semiconductor device according to claim 1,
wherein the second semiconductor chip is a memory chip including a memory circuit formed therein, and
wherein the second signal electrodes and the second conductive members form a transmission path for performing input/output of a data signal with the memory circuit.

8. A semiconductor device, comprising:
a first semiconductor chip having a first main surface, a plurality of first main surface electrodes formed on the first main surface, a first back surface opposite to the first main surface, and a plurality of first back surface electrodes formed on the first back surface, and electrically connected with the first main surface electrodes, respectively;
a second semiconductor chip having a second main surface, a plurality of second main surface electrodes formed on the second main surface, and a second back surface opposite to the second main surface, the second semiconductor chip being mounted on the first back surface side of the first semiconductor chip; and
a plurality of conductive members arranged between the first semiconductor chip and the second semiconductor chip, and electrically connecting the first back surface electrodes with the second main surface electrodes, respectively,
wherein the first back surface electrodes have a first signal electrode for passing therethrough a first signal current with a first frequency, and a plurality of second signal electrodes for passing therethrough a second signal current with a second frequency higher than the first frequency,
wherein the second main surface electrodes have a first signal electrode for passing therethrough the first signal current, and a plurality of second signal electrodes for passing therethrough the second signal current,
wherein the conductive members have a first conductive member for connecting the first signal electrode of the first semiconductor chip with the first signal electrode of the second semiconductor chip, and a plurality of second conductive members for connecting the second signal electrodes of the first semiconductor chip with the second signal electrodes of the second semiconductor chip, and
wherein the second conductive members are connected with each other, and are separated from the first conductive member.

9. The semiconductor device according to claim 8,
wherein the second signal electrodes of the first semiconductor chip are formed in such a manner as to be adjacent to each other at the first back surface of the first semiconductor chip, and
wherein a clearance distance between the second signal electrodes of the first semiconductor chip is smaller than a clearance distance between the first signal electrode of the first semiconductor chip and the second signal electrodes of the first semiconductor chip.

10. The semiconductor device according to claim 9,
wherein the first back surface electrodes further include a third signal electrode for passing therethrough a third signal current with a third frequency lower than the second frequency,
wherein the second main surface electrodes further include a third signal electrode for passing therethrough the third signal current,
wherein the conductive members further include a third conductive member for connecting the third signal electrode of the first semiconductor chip with the third signal electrode of the second semiconductor chip, and
wherein the third conductive member is separated from the first conductive member and the second conductive member.

11. The semiconductor device according to claim 10,
wherein a clearance distance between the second signal electrodes of the first semiconductor chip is smaller than a clearance distance between the third signal electrode of the first semiconductor chip and the first signal electrode of the first semiconductor chip, and a clearance distance between the third signal electrode of the first semiconductor chip and the second signal electrodes of the first semiconductor chip.

12. The semiconductor device according to claim 8, further comprising a wiring substrate having a chip mounting surface and a mounting surface opposite to the chip mounting surface,
wherein the first semiconductor chip is mounted over the chip mounting surface such that the first main surface faces to the chip mounting surface of the wiring substrate.

13. The semiconductor device according to claim 8,
wherein the conductive members include solder materials, respectively, and
wherein in the second conductive members, the solder materials are in contact with and integrated with each other.

14. The semiconductor device according to claim 8,
wherein the second semiconductor chip is a memory chip including a memory circuit formed therein, and
wherein the second signal electrodes and the second conductive members form a transmission path for performing input/output of a data signal with the memory circuit.

15. A semiconductor device, comprising:
a first semiconductor chip having a first main surface, a plurality of first main surface electrodes formed on the first main surface, a first back surface opposite to the first main surface, and a plurality of first back surface electrodes formed on the first back surface, and electrically connected with the first main surface electrodes, respectively;
a second semiconductor chip having a second main surface, a plurality of second main surface electrodes formed on the second main surface, a second back surface opposite to the second main surface, a first circuit formed on the second main surface, and a second circuit formed on the second main surface, and passing therethrough a signal current with a higher frequency than that of the first circuit, the second semiconductor chip being mounted on the first back surface side of the first semiconductor chip; and
a plurality of conductive members arranged between the first semiconductor chip and the second semiconductor chip, and electrically connecting the first back surface electrodes with the second main surface electrodes, respectively,
wherein the first back surface electrodes have a first circuit electrode to be electrically connected with the first circuit, and a plurality of second circuit electrodes to be electrically connected with the second circuit,
wherein the second main surface electrodes have a first circuit electrode to be electrically connected with the first circuit, and a plurality of second circuit electrodes to be electrically connected with the second circuit,
wherein the conductive members have a first conductive member for connecting the first circuit electrode of the first semiconductor chip with the first circuit electrode of the second semiconductor chip, and a plurality of second conductive members for connecting the second circuit electrodes of the first semiconductor chip with the second circuit electrodes of the second semiconductor chip, and
wherein the second conductive members are connected with each other, and are separated from the first conductive member.

16. A semiconductor device, comprising:
a first semiconductor chip having a first main surface, a plurality of first main surface electrodes formed on the first main surface, a first back surface opposite to the first main surface, and a plurality of first back surface electrodes formed on the first back surface, and electrically connected with the first main surface electrodes, respectively;
a second semiconductor chip having a second main surface, a plurality of second main surface electrodes formed on the second main surface, and a second back surface opposite to the second main surface, the second semiconductor chip being on the first back surface side of the first semiconductor chip; and
a plurality of conductive members arranged between the first semiconductor chip and the second semiconductor chip, and electrically connecting the first back surface electrodes with the second main surface electrodes, respectively,
wherein the first back surface electrodes have a first signal electrode for passing a clock enable signal or a reset signal therethrough, and a plurality of second signal electrodes for passing a clock signal or a data signal therethrough,
wherein the second main surface electrodes have a first signal electrode for passing therethrough the clock enable signal or the reset signal, and a plurality of second signal electrodes for passing therethrough the clock signal or the data signal,
wherein the conductive members have a first conductive member for connecting the first signal electrode of the first semiconductor chip with the first signal electrode of the second semiconductor chip, and a plurality of second conductive members for connecting the second signal electrodes of the first semiconductor chip with the second signal electrodes of the second semiconductor chip, and
wherein the second conductive members are connected with each other, and are separated from the first conductive member.

* * * * *